United States Patent
Chong et al.

(10) Patent No.: US 7,884,634 B2
(45) Date of Patent: Feb. 8, 2011

(54) HIGH DENSITY INTERCONNECT SYSTEM HAVING RAPID FABRICATION CYCLE

(75) Inventors: Fu Chiung Chong, Saratoga, CA (US);
Andrew Kao, Fremont, CA (US);
Douglas McKay, San Jose, CA (US);
Anna Litza, Cupertino, CA (US);
Douglas Modlin, Palo Alto, CA (US);
Sammy Mok, Cupertino, CA (US);
Nitin Parekh, Los Altos, CA (US);
Frank John Swiatowiec, San Jose, CA (US); Zhaohui Shan, Spring, TX (US)

(73) Assignee: Verigy (Singapore) Pte, Ltd, Singapore (SG)

( * ) Notice: Subject to any disclaimer, the term of this patent is extended or adjusted under 35 U.S.C. 154(b) by 0 days.

(21) Appl. No.: 12/354,520

(22) Filed: Jan. 15, 2009
(Under 37 CFR 1.47)

(65) Prior Publication Data

US 2009/0153165 A1    Jun. 18, 2009

Related U.S. Application Data

(60) Division of application No. 11/858,064, filed on Sep. 19, 2007, which is a continuation of application No. 11/133,021, filed on May 18, 2005, now Pat. No. 7,382,142, which is a continuation-in-part of application No. 10/870,095, filed on Jun. 16, 2004, now Pat. No. 7,349,223, which is a continuation-in-part of application No. 10/196,494, filed on Jul. 15, 2002, now Pat. No. 6,710,609, and a continuation-in-part of application No. 10/178,103, filed on Jun. 24, 2002, now Pat. No. 6,917,525, which is a continuation-in-part of application No. 09/980,040, filed on Nov. 27, 2001, now Pat. No. 6,799,976.

(60) Provisional application No. 60/573,541, filed on May 20, 2004, provisional application No. 60/592,908, filed on Jul. 19, 2004, provisional application No. 60/651,294, filed on Feb. 8, 2005, provisional application No. 60/146,241, filed on Jul. 28, 1999, provisional application No. 60/136,636, filed on May 27, 1999.

(51) Int. Cl.
*G01R 31/26* (2006.01)

(52) U.S. Cl. ...................................................... 324/765

(58) Field of Classification Search ................. 324/754, 324/761–762, 765, 158.1; 29/825, 832, 830, 29/842; 257/48; 438/14–18
See application file for complete search history.

(56) References Cited

U.S. PATENT DOCUMENTS 3,806,800 A    4/1974    Bove et al.

(Continued)

FOREIGN PATENT DOCUMENTS

AU    5964196 A    12/1996

(Continued)

OTHER PUBLICATIONS

Advanced Technology Program, Project Brief-98-06-0025, Membrane Probes for Wafer, Package, and Substrate Testing, Microelectronics Manufacturing Infrastructure (Oct. 1998), 2 pages.

(Continued)

*Primary Examiner*—Ha Tran T Nguyen
*Assistant Examiner*—Tung X Nguyen
(74) *Attorney, Agent, or Firm*—Manuel F. de la Cerra

(57) ABSTRACT

An improved interconnection system and method is described, such as for connectors, socket assemblies and/or probe card systems. An exemplary system comprises a probe card interface assembly (PCIA) for establishing electrical connections to a semiconductor wafer mounted in a prober. The PCIA comprises a motherboard parallel to the semiconductor wafer having an upper surface and an opposing lower planar mounting surface, a reference plane defined by a least three points located between the lower surface of the motherboard and the wafer, at least one component located below the motherboard mounting surface, and a mechanism for adjusting the planarity of the reference plane with respect to the wafer. A probe chip having a plurality of spring probes extending there from is mountable and demountable from the PCIA, without the need for further planarity adjustment. The interconnection structures and methods preferably provide improved fabrication cycles.

8 Claims, 27 Drawing Sheets

U.S. PATENT DOCUMENTS

| | | |
|---|---|---|
| 3,806,801 A | 4/1974 | Bove |
| 3,810,017 A | 5/1974 | Wiesler et al. |
| 3,835,381 A | 9/1974 | Garretson et al. |
| 3,842,189 A | 10/1974 | Southgate |
| 3,856,647 A | 12/1974 | Blachman |
| 3,939,414 A | 2/1976 | Roch |
| 4,000,045 A | 12/1976 | Rotzow |
| 4,035,046 A | 7/1977 | Kloth |
| 4,038,599 A | 7/1977 | Bove et al. |
| 4,177,425 A | 12/1979 | Lenz |
| 4,195,259 A | 3/1980 | Reid et al. |
| 4,201,393 A | 5/1980 | Kawashima et al. |
| 4,214,201 A | 7/1980 | Kern |
| 4,320,438 A | 3/1982 | Ibrahim et al. |
| 4,362,991 A | 12/1982 | Carbine |
| 4,416,759 A | 11/1983 | Harra et al. |
| 4,423,376 A | 12/1983 | Byrnes et al. |
| 4,423,401 A | 12/1983 | Mueller |
| 4,436,602 A | 3/1984 | Harra et al. |
| 4,480,223 A | 10/1984 | Aigo |
| 4,508,612 A | 4/1985 | Blackwell et al. |
| 4,518,910 A | 5/1985 | Hottenrott et al. |
| 4,522,893 A | 6/1985 | Bohlen et al. |
| 4,548,451 A | 10/1985 | Benarr et al. |
| 4,567,432 A | 1/1986 | Buol et al. |
| 4,599,559 A | 7/1986 | Evans |
| 4,622,514 A | 11/1986 | Lewis |
| 4,636,722 A | 1/1987 | Ardezzone |
| 4,647,852 A | 3/1987 | Smith et al. |
| 4,661,233 A | 4/1987 | Glasser |
| 4,667,154 A | 5/1987 | Allerton et al. |
| 4,686,464 A | 8/1987 | Elsasser et al. |
| 4,716,500 A | 12/1987 | Payne |
| 4,719,417 A | 1/1988 | Evans |
| 4,724,377 A | 2/1988 | Maelzer et al. |
| 4,758,927 A | 7/1988 | Berg |
| 4,764,723 A | 8/1988 | Strid |
| 4,816,754 A | 3/1989 | Buechele et al. |
| 4,834,855 A | 5/1989 | Bloomquist et al. |
| 4,837,622 A | 6/1989 | Whann et al. |
| 4,908,571 A | 3/1990 | Stoehr |
| 4,924,589 A | 5/1990 | Leedy |
| 4,933,045 A | 6/1990 | DiStefano et al. |
| 4,942,076 A | 7/1990 | Panicker et al. |
| 4,956,923 A | 9/1990 | Pettingell et al. |
| 4,965,865 A | 10/1990 | Trenary |
| 4,970,106 A | 11/1990 | DiStefano et al. |
| 4,973,903 A | 11/1990 | Schemmel |
| 4,975,638 A | 12/1990 | Evans et al. |
| 5,032,896 A | 7/1991 | Little et al. |
| 5,055,778 A | 10/1991 | Okubo et al. |
| 5,070,297 A | 12/1991 | Kwon et al. |
| 5,084,672 A | 1/1992 | Ikeuchi et al. |
| 5,103,557 A | 4/1992 | Leedy |
| 5,109,596 A | 5/1992 | Driller et al. |
| 5,121,298 A | 6/1992 | Sarma et al. |
| 5,144,228 A | 9/1992 | Sorna et al. |
| 5,148,103 A | 9/1992 | Pasiecznik, Jr. |
| 5,148,265 A | 9/1992 | Khandros et al. |
| 5,148,266 A | 9/1992 | Khandros et al. |
| 5,152,695 A | 10/1992 | Grabbe et al. |
| 5,154,810 A | 10/1992 | Kamerling et al. |
| 5,166,774 A | 11/1992 | Banerji et al. |
| 5,189,363 A | 2/1993 | Bregman et al. |
| 5,191,708 A | 3/1993 | Kasukabe et al. |
| 5,208,531 A | 5/1993 | Aton |
| 5,210,485 A | 5/1993 | Kreiger et al. |
| 5,214,375 A | 5/1993 | Ikeuchi et al. |
| 5,225,037 A | 7/1993 | Elder et al. |
| 5,227,718 A | 7/1993 | Stowers et al. |
| 5,240,583 A | 8/1993 | Ahonen |
| 5,255,079 A | 10/1993 | Kageyama |
| 5,258,648 A | 11/1993 | Lin |
| 5,278,442 A | 1/1994 | Prinz et al. |
| 5,280,139 A | 1/1994 | Suppelsa et al. |
| 5,313,157 A | 5/1994 | Pasiecznik, Jr. |
| 5,326,428 A | 7/1994 | Farnworth et al. |
| 5,347,159 A | 9/1994 | Khandros et al. |
| 5,352,266 A | 10/1994 | Erb et al. |
| 5,354,205 A | 10/1994 | Feigenbaum et al. |
| 5,367,764 A | 11/1994 | DiStefano et al. |
| 5,373,627 A | 12/1994 | Grebe |
| 5,385,477 A | 1/1995 | Vaynkof et al. |
| 5,395,253 A | 3/1995 | Crumly |
| 5,412,866 A | 5/1995 | Woith et al. |
| 5,416,429 A | 5/1995 | McQuade et al. |
| 5,433,797 A | 7/1995 | Erb et al. |
| 5,440,241 A | 8/1995 | King et al. |
| 5,473,254 A | 12/1995 | Asar |
| 5,476,211 A | 12/1995 | Khandros |
| 5,489,852 A | 2/1996 | Gomez |
| 5,521,518 A | 5/1996 | Higgins |
| 5,521,523 A | 5/1996 | Kimura et al. |
| 5,523,697 A | 6/1996 | Farnworth et al. |
| 5,530,371 A | 6/1996 | Perry et al. |
| 5,532,612 A | 7/1996 | Liang |
| 5,534,784 A | 7/1996 | Lum et al. |
| 5,546,012 A | 8/1996 | Perry et al. |
| 5,555,422 A | 9/1996 | Nakano |
| 5,558,928 A | 9/1996 | DiStefano et al. |
| 5,563,521 A | 10/1996 | Crumly |
| 5,568,054 A | 10/1996 | Iino et al. |
| 5,570,032 A | 10/1996 | Atkins et al. |
| 5,600,257 A | 2/1997 | Leas et al. |
| 5,613,861 A | 3/1997 | Smith et al. |
| 5,621,333 A | 4/1997 | Long et al. |
| 5,621,373 A | 4/1997 | McCormick |
| 5,629,631 A | 5/1997 | Perry et al. |
| 5,631,571 A | 5/1997 | Spaziani et al. |
| 5,635,846 A | 6/1997 | Beaman et al. |
| 5,656,138 A | 8/1997 | Scobey et al. |
| 5,657,394 A | 8/1997 | Schwartz et al. |
| 5,663,596 A | 9/1997 | Little |
| 5,665,648 A | 9/1997 | Little |
| 5,694,050 A | 12/1997 | Noguchi |
| 5,703,494 A | 12/1997 | Sano |
| 5,707,575 A | 1/1998 | Litt et al. |
| 5,744,283 A | 4/1998 | Spierings et al. |
| 5,756,021 A | 5/1998 | Hedrick et al. |
| 5,763,941 A | 6/1998 | Fjelstad |
| 5,764,070 A | 6/1998 | Pedder |
| 5,772,451 A | 6/1998 | Dozier, II et al. |
| 5,786,701 A | 7/1998 | Pedder |
| 5,798,027 A | 8/1998 | Lefebvre et al. |
| 5,800,184 A | 9/1998 | Lopergolo et al. |
| 5,801,441 A | 9/1998 | DiStefano et al. |
| 5,806,181 A | 9/1998 | Khandros et al. |
| 5,820,014 A | 10/1998 | Dozier, II et al. |
| 5,821,763 A | 10/1998 | Beaman et al. |
| 5,821,764 A | 10/1998 | Slocum et al. |
| 5,828,226 A * | 10/1998 | Higgins et al. .............. 324/762 |
| D401,250 S | 11/1998 | Tudhope et al. |
| D401,251 S | 11/1998 | Tudhope et al. |
| D401,252 S | 11/1998 | Tudhope et al. |
| 5,829,128 A | 11/1998 | Eldridge et al. |
| 5,830,327 A | 11/1998 | Kolenkow |
| 5,832,598 A | 11/1998 | Greenman et al. |
| 5,832,601 A | 11/1998 | Eldridge et al. |
| D403,002 S | 12/1998 | Tudhope et al. |
| D403,334 S | 12/1998 | Tudhope et al. |
| 5,844,421 A | 12/1998 | Lee et al. |
| 5,847,572 A | 12/1998 | Iwasaki et al. |
| 5,848,685 A | 12/1998 | Smith et al. |
| 5,852,871 A | 12/1998 | Khandros |

| Patent | Type | Date | Inventor |
|---|---|---|---|
| 5,864,946 | A | 2/1999 | Eldridge et al. |
| 5,869,974 | A | 2/1999 | Akram et al. |
| 5,878,486 | A | 3/1999 | Eldridge et al. |
| 5,884,395 | A | 3/1999 | Dabrowiecki et al. |
| 5,884,398 | A | 3/1999 | Eldridge et al. |
| 5,886,535 | A | 3/1999 | Budnaitis |
| 5,896,038 | A | 4/1999 | Budnaitis et al. |
| 5,897,326 | A | 4/1999 | Eldridge et al. |
| 5,900,738 | A | 5/1999 | Khandros et al. |
| 5,905,305 | A | 5/1999 | Fogal et al. |
| 5,912,046 | A | 6/1999 | Eldridge et al. |
| 5,914,218 | A | 6/1999 | Smith et al. |
| 5,917,707 | A | 6/1999 | Khandros et al. |
| 5,926,951 | A | 7/1999 | Khandros et al. |
| 5,944,537 | A | 8/1999 | Smith et al. |
| 5,949,245 | A * | 9/1999 | Liu ............................ 324/762 |
| 5,968,327 | A | 10/1999 | Kobayashi et al. |
| 5,973,504 | A | 10/1999 | Chong |
| 5,974,662 | A | 11/1999 | Eldridge et al. |
| 5,977,787 | A | 11/1999 | Das et al. |
| 5,979,892 | A | 11/1999 | Smith |
| 5,983,493 | A | 11/1999 | Eldridge et al. |
| 5,993,616 | A | 11/1999 | Suwabe et al. |
| 5,994,152 | A | 11/1999 | Khandros et al. |
| 5,994,222 | A | 11/1999 | Smith et al. |
| 5,994,781 | A | 11/1999 | Smith |
| 5,998,228 | A | 12/1999 | Eldridge et al. |
| 5,998,864 | A | 12/1999 | Khandros et al. |
| 6,001,671 | A | 12/1999 | Fjelstad |
| 6,002,168 | A | 12/1999 | Bellaar et al. |
| 6,007,349 | A | 12/1999 | Distefano et al. |
| 6,012,224 | A | 1/2000 | DiStefano et al. |
| 6,014,032 | A | 1/2000 | Maddix et al. |
| 6,020,220 | A | 2/2000 | Gilleo et al. |
| 6,023,103 | A | 2/2000 | Chang et al. |
| 6,028,437 | A | 2/2000 | Potter |
| 6,029,344 | A | 2/2000 | Khandros et al. |
| 6,030,856 | A | 2/2000 | DiStefano et al. |
| 6,032,356 | A | 3/2000 | Eldridge et al. |
| 6,033,935 | A | 3/2000 | Dozier, II et al. |
| 6,042,712 | A | 3/2000 | Mathieu |
| 6,043,563 | A | 3/2000 | Eldridge et al. |
| 6,044,548 | A | 4/2000 | Distefano et al. |
| 6,045,395 | A | 4/2000 | Saito et al. |
| 6,045,396 | A | 4/2000 | Tighe |
| 6,045,655 | A | 4/2000 | DiStefano et al. |
| 6,046,076 | A | 4/2000 | Mitchell et al. |
| 6,049,972 | A | 4/2000 | Link et al. |
| 6,049,976 | A | 4/2000 | Khandros |
| 6,050,829 | A | 4/2000 | Eldridge et al. |
| 6,054,337 | A | 4/2000 | Solberg |
| 6,054,756 | A | 4/2000 | DiStefano et al. |
| 6,060,891 | A | 5/2000 | Hembree et al. |
| 6,063,648 | A | 5/2000 | Beroz et al. |
| 6,064,213 | A | 5/2000 | Khandros et al. |
| 6,075,289 | A | 6/2000 | Distefano |
| 6,078,186 | A | 6/2000 | Hembree et al. |
| 6,078,189 | A | 6/2000 | Noel |
| 6,080,603 | A | 6/2000 | Distefano et al. |
| 6,080,605 | A | 6/2000 | Distefano et al. |
| 6,080,932 | A | 6/2000 | Smith et al. |
| 6,081,035 | A | 6/2000 | Warner et al. |
| 6,090,261 | A | 7/2000 | Mathieu |
| 6,091,256 | A | 7/2000 | Long et al. |
| 6,110,823 | A | 8/2000 | Eldridge et al. |
| 6,114,864 | A | 9/2000 | Soejima et al. |
| 6,117,694 | A | 9/2000 | Smith et al. |
| 6,118,894 | A | 9/2000 | Schwartz et al. |
| 6,137,297 | A | 10/2000 | McNair et al. |
| 6,147,876 | A | 11/2000 | Yamaguchi et al. |
| 6,150,186 | A | 11/2000 | Chen et al. |
| 6,169,411 | B1 | 1/2001 | Johnson |
| 6,183,267 | B1 | 2/2001 | Marcus et al. |
| 6,184,053 | B1 | 2/2001 | Eldridge et al. |
| 6,184,065 | B1 | 2/2001 | Smith et al. |
| 6,184,699 | B1 | 2/2001 | Smith et al. |
| 6,190,513 | B1 | 2/2001 | Forster et al. |
| 6,192,982 | B1 | 2/2001 | Divis et al. |
| 6,203,331 | B1 | 3/2001 | McHugh et al. |
| 6,204,674 | B1 | 3/2001 | Dabrowiecki et al. |
| 6,213,789 | B1 | 4/2001 | Chua et al. |
| 6,215,320 | B1 | 4/2001 | Parrish |
| 6,215,321 | B1 | 4/2001 | Nakata |
| 6,218,033 | B1 | 4/2001 | Cao et al. |
| 6,218,910 | B1 | 4/2001 | Miller |
| 6,232,143 | B1 | 5/2001 | Maddix et al. |
| 6,245,444 | B1 | 6/2001 | Marcus et al. |
| 6,246,247 | B1 | 6/2001 | Eldridge et al. |
| 6,255,126 | B1 | 7/2001 | Mathieu et al. |
| 6,264,477 | B1 | 7/2001 | Smith et al. |
| 6,265,888 | B1 | 7/2001 | Hsu |
| 6,274,823 | B1 | 8/2001 | Khandros et al. |
| 6,277,249 | B1 | 8/2001 | Gopalraja et al. |
| 6,281,592 | B1 | 8/2001 | Murayama |
| 6,285,563 | B1 | 9/2001 | Nelson et al. |
| 6,288,560 | B1 | 9/2001 | Wohlfarth |
| 6,290,510 | B1 | 9/2001 | Fork et al. |
| 6,292,003 | B1 | 9/2001 | Fredrickson et al. |
| 6,292,007 | B1 | 9/2001 | Potter |
| 6,300,783 | B1 | 10/2001 | Okubo et al. |
| 6,306,265 | B1 | 10/2001 | Fu et al. |
| 6,329,713 | B1 | 12/2001 | Farquhar et al. |
| 6,336,269 | B1 | 1/2002 | Eldridge et al. |
| 6,340,320 | B1 | 1/2002 | Ogawa |
| 6,347,947 | B1 | 2/2002 | Ong |
| 6,351,133 | B1 | 2/2002 | Jones et al. |
| 6,352,454 | B1 | 3/2002 | Kim et al. |
| 6,356,098 | B1 | 3/2002 | Akram et al. |
| 6,358,376 | B1 | 3/2002 | Wang et al. |
| 6,361,331 | B2 | 3/2002 | Fork et al. |
| 6,396,677 | B1 | 5/2002 | Chua et al. |
| 6,398,929 | B1 | 6/2002 | Chiang et al. |
| 6,419,500 | B1 | 7/2002 | Kister |
| 6,424,166 | B1 | 7/2002 | Henry et al. |
| 6,425,988 | B1 | 7/2002 | Montcalm et al. |
| 6,426,686 | B1 | 7/2002 | Douriet et al. |
| 6,428,673 | B1 | 8/2002 | Ritzdorf et al. |
| 6,429,671 | B1 | 8/2002 | Duckworth et al. |
| 6,439,898 | B2 | 8/2002 | Chua et al. |
| 6,476,626 | B2 * | 11/2002 | Aldaz et al. .................. 324/757 |
| 6,483,328 | B1 | 11/2002 | Eldridge et al. |
| 6,489,795 | B1 | 12/2002 | Klele et al. |
| 6,497,799 | B1 | 12/2002 | McLeod |
| 6,501,343 | B1 | 12/2002 | Miller |
| 6,509,751 | B1 | 1/2003 | Mathieu et al. |
| 6,520,778 | B1 | 2/2003 | Eldridge et al. |
| 6,525,555 | B1 | 2/2003 | Khandros et al. |
| 6,528,350 | B2 | 3/2003 | Fork |
| 6,528,984 | B2 | 3/2003 | Beaman et al. |
| 6,534,856 | B1 | 3/2003 | Dozier, II et al. |
| 6,544,814 | B1 | 4/2003 | Yasunaga et al. |
| 6,586,956 | B2 | 7/2003 | Aldaz et al. |
| 6,600,334 | B1 | 7/2003 | Wark et al. |
| 6,616,966 | B2 | 9/2003 | Mathieu et al. |
| 6,624,648 | B2 | 9/2003 | Eldridge et al. |
| 6,640,415 | B2 | 11/2003 | Eslamy et al. |
| 6,645,257 | B1 | 11/2003 | Schacht et al. |
| 6,651,325 | B1 | 11/2003 | Lee et al. |
| 6,684,499 | B2 | 2/2004 | Romano et al. |
| 6,734,688 | B1 | 5/2004 | Castellano et al. |
| 6,741,085 | B1 | 5/2004 | Khandros et al. |
| 6,751,850 | B2 | 6/2004 | Hu et al. |
| 6,791,171 | B2 | 9/2004 | Mok et al. |
| 6,799,976 | B1 | 10/2004 | Mok et al. |
| 6,812,718 | B1 | 11/2004 | Chong et al. |
| 6,815,961 | B2 | 11/2004 | Mok et al. |

| | | | |
|---|---|---|---|
| 6,827,584 B2 | 12/2004 | Mathieu et al. | |
| 6,844,214 B1 | 1/2005 | Mei et al. | |
| 6,847,218 B1 | 1/2005 | Nulty et al. | |
| 6,856,150 B2 | 2/2005 | Sporck et al. | |
| 6,856,225 B1 | 2/2005 | Chua et al. | |
| 6,888,362 B2 | 5/2005 | Eldridge et al. | |
| 6,888,364 B2 | 5/2005 | Cram | |
| 6,917,525 B2 | 7/2005 | Mok et al. | |
| 6,920,689 B2 | 7/2005 | Khandros et al. | |
| 7,009,412 B2 | 3/2006 | Chong et al. | |
| 7,048,548 B2 | 5/2006 | Mathieu et al. | |
| 7,116,119 B2 | 10/2006 | Sporck et al. | |
| 7,138,818 B2 | 11/2006 | Chong et al. | |
| 7,247,035 B2 | 7/2007 | Mok et al. | |
| 7,403,029 B2 | 7/2008 | Chong et al. | |
| 2001/0009305 A1 | 7/2001 | Fjelstad | |
| 2001/0009724 A1 | 7/2001 | Chen et al. | |
| 2001/0021483 A1 | 9/2001 | Mathieu et al. | |
| 2002/0000013 A1 | 1/2002 | Sugaya et al. | |
| 2002/0000016 A1 | 1/2002 | Hsieh | |
| 2002/0013070 A1 | 1/2002 | Fork et al. | |
| 2002/0016095 A1 | 2/2002 | Fork et al. | |
| 2002/0055282 A1 | 5/2002 | Eldridge et al. | |
| 2002/0075105 A1 | 6/2002 | Douriet et al. | |
| 2002/0132501 A1 | 9/2002 | Eldridge et al. | |
| 2002/0164893 A1 | 11/2002 | Mathieu et al. | |
| 2002/0171133 A1 | 11/2002 | Mok et al. | |
| 2003/0000010 A1 | 1/2003 | Shimizu | |
| 2003/0010615 A1 | 1/2003 | Fork et al. | |
| 2003/0071348 A1 | 4/2003 | Eguchi et al. | |
| 2003/0075795 A1 | 4/2003 | Hashimoto | |
| 2003/0197285 A1 | 10/2003 | Strandberg et al. | |
| 2004/0038560 A1 | 2/2004 | Mathieu et al. | |
| 2004/0058487 A1 | 3/2004 | Eslamy et al. | |
| 2004/0102064 A1 | 5/2004 | Mathieu | |
| 2004/0155337 A1 | 8/2004 | Strandberg et al. | |
| 2004/0223309 A1 | 11/2004 | Haemer et al. | |
| 2005/0012513 A1 | 1/2005 | Cheng et al. | |
| 2005/0026476 A1 | 2/2005 | Mok et al. | |
| 2005/0212540 A1 | 9/2005 | Nulty et al. | |
| 2005/0270055 A1 | 12/2005 | Akram et al. | |
| 2005/0280430 A1 | 12/2005 | Cram | |

FOREIGN PATENT DOCUMENTS

| | | | |
|---|---|---|---|
| AU | 6028796 A | 12/1996 | |
| AU | 6377796 A | 12/1996 | |
| AU | 6635296 A | 12/1996 | |
| CN | 1171167 A | 1/1998 | |
| CN | 1191500 A | 8/1998 | |
| CN | 1208368 A | 2/1999 | |
| DE | 3630548 | 3/1988 | |
| DE | 69431565 | 6/2003 | |
| DE | 69633334 | 2/2005 | |
| EP | 369112 | 7/1989 | |
| EP | 0623826 | 11/1994 | |
| EP | 0681186 A2 | 11/1995 | |
| EP | 0731369 A2 | 9/1996 | |
| EP | 0792462 A | 9/1997 | |
| EP | 0792463 A | 9/1997 | |
| EP | 0795200 A | 9/1997 | |
| EP | 0802419 A | 10/1997 | |
| EP | 0828582 A | 3/1998 | |
| EP | 0837750 | 4/1998 | |
| EP | 0859686 | 8/1998 | |
| EP | 0886894 | 12/1998 | |
| EP | 0792519 A | 3/2003 | |
| EP | 0792517 | 10/2003 | |
| FR | 2518358 A | 10/1981 | |
| JP | 02064091 | 3/1990 | |
| JP | 3058919 B | 3/1991 | |
| JP | 3267763 | 11/1991 | |
| JP | 5335746 | 12/1993 | |
| JP | 7301642 A | 11/1995 | |
| JP | 9512139 T | 2/1997 | |
| JP | 1995-292471 | 5/1997 | |
| JP | 9508241 T | 8/1997 | |
| JP | 9281144 A | 10/1997 | |
| JP | 10506197 T | 6/1998 | |
| JP | 10506238 T | 6/1998 | |
| JP | 10510107 T | 9/1998 | |
| JP | 11064386 | 3/1999 | |
| JP | 2892505 B | 5/1999 | |
| JP | 11126800 A | 5/1999 | |
| JP | 11506829 T | 6/1999 | |
| JP | 11508407 T | 7/1999 | |
| JP | 2968051 B | 10/1999 | |
| JP | 11514493 T | 12/1999 | |
| JP | 3022312 B | 3/2000 | |
| JP | 2000067953 A | 3/2000 | |
| JP | 2000513499 T | 10/2000 | |
| JP | 2001020067 | 8/2002 | |
| KR | 252457 B | 4/2000 | |
| SG | 55303 A | 12/1998 | |
| WO | WO9425987 | 11/1994 | |
| WO | WO9514314 | 5/1995 | |
| WO | WO9615458 | 5/1996 | |
| WO | WO9615459 A | 5/1996 | |
| WO | WO9615551 | 5/1996 | |
| WO | WO9616440 | 5/1996 | |
| WO | WO9617378 | 6/1996 | |
| WO | WO9637331 A | 11/1996 | |
| WO | WO9637332 | 11/1996 | |
| WO | WO9638858 | 12/1996 | |
| WO | WO9641506 A | 12/1996 | |
| WO | WO9743656 | 11/1997 | |
| WO | WO9744676 | 11/1997 | |
| WO | WO9801906 | 1/1998 | |
| WO | WO9852224 | 11/1998 | |
| WO | WO9914404 | 3/1999 | |
| WO | WO9918445 | 4/1999 | |
| WO | WO0052487 | 9/2000 | |
| WO | WO0052488 | 9/2000 | |
| WO | WO0052703 | 9/2000 | |
| WO | WO0073905 | 12/2000 | |
| WO | WO0074110 A2 | 12/2000 | |
| WO | WO0075677 | 12/2000 | |
| WO | WO0109623 | 2/2001 | |
| WO | WO0109952 | 2/2001 | |
| WO | WO0113130 | 2/2001 | |
| WO | WO0148818 | 7/2001 | |
| WO | WO0148870 | 7/2001 | |
| WO | WO0198793 | 12/2001 | |
| WO | WO03018865 | 3/2003 | |
| WO | WO03081725 | 10/2003 | |
| WO | WO2005091996 | 10/2005 | |

OTHER PUBLICATIONS

Anderson, J.; High-Performance Multi-DUT Interfacing for Wafer Sort; Sep. 1997.

Anderson, J.; Integrated Probe card/Interface Solutions for Specific Test Applications; International Test Conference; Oct. 18-23, 1998.

Anthony, T.R.; Diodes formed by laser drilling and diffusion; 1982 American Institute of Physics; J.Appl. Physics 53(12), Dec. 1982.

Anthony, T.R.; To fabricate electrical interconnections . . . ; 1981 American Institute of Physics; J.Appl. Physics 52(8), Aug. 1981.

Artisan plating.com; Characteristics of electroplated rhodium finishes; Jan. 15, 2002.

Artisanplating.com; Chart B; Basics of Electroplating Principles Jan. 15, 2002.

Asai, S. et al.; Probe Card with Probe Pins Grownby the Vapor-Liquid-Solid (VLS) Method; IEEE Trans. On Components, Packaging, & Manufacturing Technology; Jun. 1996.
ATP Proposers Conference; May 8, 2002; 1 sheet.
Bakir, M. et al.; Sol-Compliant Wafer-level Package Technologies; Semiconductor International Apr. 2002.
Bakir, M.S., Sea of Polymer Pillars Electrical and Optical Chip I/O Interconnections for Gigascale Intergration, IEEE Transactions on Electron Devices, vol. 51, No. 7, Jul. 2004, pp. 1069-1077.
Barsotti, C. et al.; Very High Density Probing; International Test Conference Proceedings of the New Frontiers in Testing; Sep. 12-14, 1988.
Barsotti, C., et al.; New Probe Cards Replace Needle Types; Semiconductor International; Aug. 1988.
Bastani, B. et al.; "Intellectual Property Rights in Nanotechnology"; Dec. 5, 2002.
Bates, R.D. et al.; Search for the Universal Probe Card Solution; International Test Conference; Nov. 1-6, 1997.
Beiley, M. et al.; A Micromachined Array Probe Card-Fabrication Process; IEEE Transactions on Components, Packaging, and Manufacturing Technology; Feb. 1995.
Beiley, M. et al.; Array Probe Card; Proceedings of the IEEE Multi-Chip Module Conference; Mar. 18-20, 1992.
Beiley, M. et al.; Micro-Machined Array Probe Card; Procedure of the IEEE International Electronics Devices Meeting; Dec. 13-16, 1992.
Bell Labs Innovations; Lucent Technologies'Electroplating Chemicals & Services Venture Develops High-Performance Material for Connector Contacts; Oct. 1998; retrieved on Jan. 15, 2002 from website: http://www.bell-labs.com/news/1998/October/23/1.html.
Bergman, D.; Forming Microvias; wwww.pcfab.com; vol. 24. No. 3, Mar. 2001.
Bilenberg, B.; PMMA to SU-8 bonding for polymer based lab-on-a-chip systems with integrated optics; submitted to: J. Micromech. Microeng. Dec. 2003, published Apr. 2004; vol. 14, issue: 6.
Bogatin, E.; Semiconductor Packaging; Technology News; Jan. 2003.
Bonham, M. et al.; Wafer-Probe Testing of High-Pin-Count ICs; Microelectronic Manufacturing and Testing; Nov. 1988.
Broz, J.J. et al.; Understanding Probe-Contact a-Spot Oxidation During Elevated-Temperature Wafer Test; Elevated Engineering; Sep. 1999.
Carbonero, J., Comparison Between Beryllium-Cooper and Tungsten High Frequency Air Coplanar Probes, IEEE Transactions on Microwave Theory and Techniques, vol. 43, No. 12, Dec. 1995, pp. 2786-2792.
Cascade Microtech, Cleaning Pyramid Probe Cards for Aluminum Pads, PPD-CLEAN-APP-0702 (p/n 121-710), Jul. 2002.
Cascade Microtech, Innovating Test Technologies, VLSR Pyramid Probe Series, Pyramid-DS-1201, Dec. 2001.
Cascade Microtech, LSI Pyramid Probe Series, LSIDS-1200, Dec. 2000.
Cascade Microtech, Pyramid Probe Cards, PRYPROBE-App-0604, pp. 1-5, Jun. 2004.
Cascade Microtech, Pyramid Probe Core Geometries, PPCORETB18-0401, Apr. 2001.
Cascade Microtech, Pyramid Probe Family, VLSR-DS-1001, Oct. 2001.
Cascade Microtech, Technical Brief, Mechanical Differences Between Pyramid and Cantilever Probes, PPDIFFTB20-0901, Sep. 2001.
Cascade Microtech/Advantages,www.cmicro.com/index.cfm/fuseaction/pg.view/pID/297, Nov. 15, 2004, 2 pages.
Center for Tribology, Inc.; "Characterization of Overcoat Durability for MEMS—Application Note"; Dec. 28, 2006; retrieved from website; http://www.cetr.com/Brochures/overcoatdurability.pdf.
Chen, K. et al., "Microstructure Examination of Copper Wafer Bonding"; Apr. 2001; Massachusetts Institute of Technology, Cambridge, MA 02139, 18 pages; retrieved from websit: http://www-mtl.mit.edu/~reif/papers/2001-knchen-JEM-manuscript.pdf.
Cheng, C. H. et al.; Electrical Through-Wafer Interconnects with Sub-PicoFarad Parasitic Capacitance; retrieved Sep. 2002; Publication from Ginzton Labs, Stanford, CA.
Cheng, C.H. et al.; "An Efficient Electrical Addressing Method using Through-Wafer Vias for Two-Dimensional Ultrasonic Arrays"; Oct. 22-25, 2000; Ginzton Lab, Stanford, CA.
Chiang, C.; Wafer Level Backside Emission Microscopy: Dynamics and Effects; Microelectronics Reliability; May 1999.
Chow, E. et al.; Electrical Through-Wafer Interconnects for Released Silicon Sensors . . . ; presented at Dec. 2001; Int'l Electron Devices Meeting; Ginzton Lab, Stanford, CA.
Chow, E. et al.; Through-Wafer Electrical Interconnects Compatible with Standard Semiconductor Processing; Sep. 25, 2000; Solid-State Sensor and Actuator Workshop; Hilton Head, South Carolina.
Chow, E.M.; Process Compatible Polysilicon-Based Electrical Through-Wafer Interconnection in Silicon Substrates; Journal of Microelectromechanical Systems, vol. 11, No. 6, Dec. 2002.
Cobra; Probe Cards; Array Probe Card Product; pp. 1-3; Nov. 9, 2001.
Comparisons to Materials; Coefficient of Thermal Expansion; Sep. 4, 2002; www.handyharmancanada.com/TheBrazingBrook/comparis.htm.
Composite Beams 5.11 Stresses in Beams, undated; pp. 301-305.
Comtois, J.H., et al.; "Fabricating Micro-Instruments in Surface-Micromachined Polycrystalline Silicon"; May 1997; $43^{rd}$ Intl Instrumentation Symposium, Orlando, FL.
Connector Specifier; Electrically Conductive Adhesives; Feb. 1999.
Douglas Plating Limited; www.douglas-plating.co.uk/top.html; Jan. 16, 2002.
Dudley, D.; "Emerging Digital Micromirror Device (DMD) Applications"; Jan. 2003; DLP Products New Application, Texas Instruments, Inc. P.O. Box 869305, MS 8477, Plano, Texas 75086.
DuraProbe; DuraProbe Specifications; one page; Jun. 2001; Kulick & Soffa Industries, Inc.
Efunds: Surface Treatments: Electroplating; Jan. 15, 2002.
Ehlermann, E.; "Matched Expansion Probe Cards"; Jul. 1999; Hiten 99 $3^{rd}$ European Conference on High Temperature Electronics.
Ehrlich, D.J. et al.; Fabrication of Through-Wafer Via Conductors in Si by Laser Photochemical Processing: Dec. 1982; IEEE Transactions on Components, Hybrids, and Manufacturing Technology, 0148-6411/821200-0520.
Electroplating of Hard Glassy Metals; National Aeronautics and Space Administration; www.nasolutions.com; Feb. 27,2001.

Electroplating Properties by Solution by Type; Types of Plating Services We Provide, www.epson-platingcom.sg/wegtop/proper1.html:Feb. 15, 2002.

Emery, R.; Novel Microelectronic Packaging Method for reduced Thermomechanica Stresses on Low Dielectric Constant Materials; Advanced Metabolism Conf; Montreal, Canada Oct. 9, 2001.

Fernandez, Dennis S.; "Patent Strategies and Portfolio Development"; 2002 Fernandez & Associates; 16 pages.

Final Patent Report, PARC; Nov. 21, 2003.

Fletcher, Joseph; "VC Task Forces"; May 31, 2002.

Formfactor Business; Overview; 2002.

Fundamentals of Contact Resistance, Part 1—Contact Theory; Advanced probing Systems, Inc. Technical Bulletin—May 1999.

Goldstein, H.; Packages; Stacking different chips . . .; IEEE Spectrum; Aug. 2001.

Grosjean, C. et al.; A Practical Thermopneumatic Valve; Jan. 1999; IEEE 12th Int'l Conference on Micro Electro Mechanical Systems.

Haemer, J.M., et al.; Flexible Mico-Spring Interconnects for High Performance Probing; May 2000; Proc. of the 50th Electronic Components and Technology Conference, Las Vegas, NV.

Hah, D., A Low-Voltage Actuated Micromachined Microwave Switch Using Torsion Springs and Leverage, IEEE Transaction on Microwave Theory and Techniques, vol. 48, No. 12, Dec. 2000, pp. 2540-2545.

Ho, M, Y. et al. Morphology and Crystallization Kinetics in HfO2 Thim Films Grown by Atomic Layer Deposition; pp. 1-18; Jun. 1, 2002.

Ho, M.Y. et al.; "Suppressed crystallization of Hf-gate dielectrics by controlled addition of Al2O3 using atomic layer deposition"; Nov. 25, 2002; Applied Physics Letters, vol. 81, No. 22, pp. 4218-4220; American Institute of Physics.

Hong, S. et al.; "Design & Fabrication of a MonolothicHigh-Density Probe Card for High-Frequency On-Wafer Testing"; Dec. 1989; International Electronic Devices Meeting Technical Digest.

Hughes, P.; Science Over Art, Our New IC Membrane Test Probe; advertising brochure, 1991.

IBM Research, Conclusion, Jun. 4, 2001, p. 24.

Intel Develops Breakthrough Packaging Technology; Intel Labs; 2002.

International Technology Roadmap for Semiconductors 2001 Edition; "Executive Summary"; Nov. 28, 2001.

International Technology Roadmap for Semiconductors 2001 Edition; "Assembly and Packaging"; Nov. 28, 2001.

Itoh, T. et al.; "Contact Properties of Micromachines Ni Probes"; Sep. 8-10, 2003; Proc. of the 49th IEEE Holm Conference on Electrical Contacts; 8:2, pp. 223-227.

Itoh, T. et al.; Characteristics of Fritting Contacts Utilized for Micromachined Wafer Probe Cards; Review of Scientific Instruments; May 2000.

Jacob, G., "Contacting a Multitude of Miniscule Nodes", Evaluation Engineering, Aug. 1991.

Jacob, G., Shrinking Geometry Issues, Probe Cards and Station Cope with Submicron IC Features, www.evaluationengineering.com/archive/articles/0398wafr.htm, Nov. 2004, 6 pages.

Kataoka, K. et al.; "Contact Properties of Ni Micro-Springs for MEMS Probe Card"; Sep. 20-23, 2004; Proc. of the 50th IEEE Holm Conference on Electrical Contacts and the 22nd Int'l Conf. on Electrical Contacts, pp. 231-235.

Kataoka, K. et al.; "low contact-force and compliant MEMS probe card utilizing fritting contact"; Jan. 20-24, 2002; Proc. 15th IEEE Micro Electro Mechanical Systems, Las Vegas, NV. 0-7803-7185-2/02.

Kim, B. et al.; "A Vertically Guided MEMS Probe Card with Deeply Recessed Trench-Type Cantilever"; Jan. 30-Feb. 3, 2005; IEEE 18th Int'l Conf. on Micro Electro Mechanical Systems, pp. 271-274.

Kim, B. et al.; "A Novel MEM Silicon Probe Card"; Jan. 20-24, 2002; Proc. 15th IEEE Int'l Conf. on Micro Electro Mechanical Systems; 0-7803-7185-2/02.

Kruger, C. et al.; Electroplated Micro-Springs for Demountable Chip Connections13th European Conf, Sep. 12-15, 1999.

Landis, D.L.; "Self-Test Methodology for Restructurable WSI"; Jan. 23-25, 1990; Proc. of the 2nd International Conference on Wafer Scale Integration.

Landis, D.L.; A Test Methodology for Wafer Scale Systems; IEEE Transactions on Computer-Aided Design of Integrated Circuits & Systems; Jan. 1992.

Landis, D.L.; "A Self-Test System Architecture for Reconfigurable WSI"; Aug. 29-31, 1989, Proc. International Test Conference Meeting the Tests of Time.

Lecklider, T.; Technical Editor, Multiple Area-Array Devices Challenge Wafter Probing, Wafer Test EE Mar. 1999, www.evaluationengineering, p. 25-28, 31&34, 37&38.

Lee, K.M., SEM/EDS evaluation of porcelain adherence to gold-coated cast titanium; Jan. 2003; Journal of Biomedical Materials Research Part B: Applied Biomaterials; vol. 68B, Issue2, pp. 165-173; retrieved online Sep. 22, 2005 from website: http://www3.intersciece.wiley.com/cgi-bin/abstract/106571153/ABSTRACT.

Lee, S. et al.; "Curled Micro-Cantilevers using Benzocyclobutene Polymer and Mo for Wafer Level probing", Sensors and Actuator A 121, Mar. 25, 2005, pp. 472-479; available online at www.sciencedirect.com.

Leslie, B. et al., "Membrane Probe Card Technology (The future for high performance test)", Sep. 12-14, 1988; Int'l Test Conference Proceedings, Washington DC, USA.

Leslie, B., et al.; Wafer-Level Testing with a Membrane Probe; IEEE Design & Test of Computers; Feb. 1989.

Leung, J. et al.; "Active Substrate Membrane Probe Card"; Dec. 10-13, 1995; International Electron Devices Meeting; Washington DC, USA.

Levy, L.; "WaferProbe System", Jun. 1997; Southwest Test Workshop, formfactor inc.

Li, X. et al.; "High Density Electrical Feedthrough Fabricated by Deep Reactive Ion Etching of Pyrex Glass"; Jan. 21-25, 2001; 14th IEEE Int'l Conf. on Micro Electro Mechanical Systems;0-7803-5998-4/01.

Li, X. et al.; Fabrication of High-Density Electrical Feed -Throughs by Deep-Reactive-Ion Etching of Pyrex Glass; Journal of Microelectromechanical Systems, vol. 11, No. 6, Dec. 2002.

Lin, C. et al.; Universal Substrate Development Project; Nexus Proprietary and Confidential; Aug. 12, 2002.

Linder. C. et al.; Nanosprings—New Dimensions in Sputtering; Jul. 2002; Palo Alto Research Center, Chips newsletter, retrieved online from website: www.oerlikon.com/ecomaXL/get_blob.php?name=chip7.pdf.

Liu, C.; "Through-Wafer Electrical Interconnects by Sidewall Photolithographic Patterning"; May 19-21, 1998; IEEE Instrumentation and Measurement Technology Conf.

Lloyd, J.R., 514, Reliability of Copper Metallization; undated; 20 pages.

Lumbantobing, A., Electrical Contact Resistance as a Diagnostic Tool for MEMS Contact Interfaces, Journal of Microelectromechanical Systems, vol. 13, No. 6, Dec. 2004, pp. 977-987.

Ma, L. et al.; "J-Springs-Innovative Compliant Interconnects for Next-Generation Packaging"; May 28-31, 2002; 52nd IEEE Proc. Electronic Components and Technology Conference, San Diego, CA.

Mann, W.R., Introduction to Wafer Test Technology, Southwest Test Workshop, Jun. 3, 2001, pp. 1-31.

Martinez, S.; TEA & John Pitts Motorola, Inc..; Wafer Level & Burn In: Accomplishments Challenges; Sep. 2002, 9th Annual International KGD Packaging and Test Workshop, Napa, CA.

Matta, F.; Advances in IC Testing: The Membrane Probe Card; Hwelett-Packard Journal; Jun. 1990.

Matteo, D.C.; Hewlett Packard Corporate Intellectual Property Licensing May 31, 2002.

McGraw-Hill encyclopedia of science and Technology. 8th ed. USA 1997. Part 3, p. 124.

Metric Conversion Factors; pp. 1-16; Jan. 8, 2003.

MTBSolutions; The AMITEC Substrate Advantage; Design Rules & Electrical Properties; May 5, 2002.

Myung, N.V. et al.; Electrodeposited Hard Magnetic Thin Films for MEMS Applications; Oct. 2000; $6^{th}$ Int'l Symp on Magnetic Materials, Processes and Devices; Proc. Electrochem. Soc PV 2000-29; Phoenix, AZ, USA.

Nadeau, N. et al.; "An Analysis of Tungsten Probes Effect on Yield in a Production Wafer Probe Environment"; Aug. 29-31, 1989; Proc. of the International Test Conference, Meeting the Tests of Time; Washington, DC, USA.

Nadeau, N. et al.; Effect of Tungsten Probes on Wafer-Probe Yield in a Production Environment; Microlectronic Manufacturing & Testing; Sep. 1989.

Natter, H. et al., Nanocrystalline nickel and nickel-copper alloys; J.Mater Res., vol. 13, No. 5, May 1998.

Nef, Alex; "Optimized Sputter Sources for LLS EVO"; Jul. 2002; Palo Alto Research Center, Chips newsletter, retrieved online from website: www.oerlikon.com/ecomaXL/get_blob.php?name=chip7.pdf.

New Build-up HDI technique using copper bumps; Victory Circuit Co., Ltd. Sep. 2002.

Newboe, B., "The Probe Card Dilemma", Semiconductor International, Sep. 1992.

Ok, S.J. et al.; High Aspect Ratio, Through-Wafer Electrical . . . IPACK'01 proceedings; Jul. 8-13, 2001; Hawaii, USA.

Pacific Rim Technology; Multichip Technology; undated; Tong Hsing Electronic Industries,Ltd. www.pacificrimtech.com.

Pandey, R., et al.; "P4 Probe Card-A Solution for AT-Speed, High Density, Wafer Probing"; Oct. 18-23 1998; Proc. International Test Conference; Washington, DC, USA.

Pena, D.J.; et al.; "Electromechanical Synthesis of Multi Material Nanowires as Building Blocks for Functional Nanostructures"; Nov. 27- Dec. 1, 1999; Materials Research Society Symposium, vol. 636.

Petefish, W.G., High Performance Laminated Chip Package Technology; Sep. 1998; W.L. Gore & Associates, Inc., Electronic Products Division.

Pham, N. P. et al.; "A Micromachining Post-Process Module for RF Silicon Technology"; Dec. 10 -13, 2000; Int'l Electron Devices Meeting, IEDM Technical Digest; San Francisco, CA.

Phillips, M.A.; "Stress and microstructure evolution during initial growth of Pt on amorphous substrates"; J. Mater, Res., vol. 15, No. 11, Nov. 2000.

Pruitt, B.L., "Measurement System for Low Force and Small Displacement Contacts", Journal of Microelectromechanical Systems, vol. 13, No. 2, Apr. 2004, pp. 220-229.

Reagan, J. et al.; "Thin Film Hybrid Technology for On-Wafer Probing of Integrated Circuits"; Hybrid Circuit Technology; Apr. 1990.

Renard, S., et al.; "Expanding MEMS with low-cost SOI wafers"; Sep. 23, 2002.

Renz, U., "Multipoint Test Probe for Printed Cards", IBM Technical Disclosure Bulletin vol. 17, No. 2, Jul. 1974, 2 pages.

Robertazzi, R.; "Area Array Probe Card Interposer", IBM Research, Jun. 4, 2001, pp. 1-23.

Saha, R. et al.; "Effects of the substrate on the determination of thin film mechanical properties by nanoindentation"; Sep. 5, 2001; Acta Materialia 50 (2002) 23-38.

Santner, E., et al.; "Adhesion and Deformation on a Microscopic Scale"; Sep. 2000; Federal Institute for Material Research and Testing (BAM); D-1200 Berlin, Germany.

Sasho, S. et al.; "Four Multi Probing Test for 16 Bit DAC with vertical contact Probe Card"; Oct. 20-25, 1996; International Test Conference; Washington, DC, USA.

Schleifer, S.; "Improving Wafer Sort Yields with Radius-Tip Probes"; Sep. 10-14, 1990; Proc. Of International Test Conference; Washington DC, USA.

Schwartz, R.; "Measurement Repeatability Key to Probe-Card Metrology"; EE-Evaluation Engineering; Sep. 1998.

Shi, B, "Intrinsic Stress Development in Ti-C:H Ceramic Nanocomposite Coatings", Applied Physics Letters, vol. 81, No. 2, Jul. 8, 2002, pp. 352-354.

Singer, P. "The Dual Challenges of Wafer Probing", Semiconductor International, Dec. 1989.

Slade, P.G.; Electrical Contacts, Principles and Applications; pp. 603-605, Marchel Dekker, New York, Basel, 1999.

Soejima, K. et al.; "New Probe Microstructure for Full-Wafer, Contact-Probe Cards"; Jun. 1-4, 1999; Proc. $49^{th}$ Electronic Components & Technology Conference; San Diego, CA.

Soh, H.T.; "Ultra-Low Ressitance, Through-Wafer Via (TWV) Technology and Its Applications in Three Dimensional Structures on Silicon"; Sept. 1998; Int'l Conf. On Solid Sate Devices and Materials, Hiroshima, pp. 284-285.

Stanley, J.K.; "Electrical and Magnetic Properties of Metals", American Society for Metals, Metals Park, Ohio, 1963. Electrical Conduction, Chapter 11, table 11.2, figure 11-10, 11-11 & 11-12, pp. 439 - 440.

Strohm, K. M. et al.; "Via hole technology for Microstrip Transmission Lines and Passive Elements on High Resistivity Silicon"; Jun. 13-19, 1999; IEEE Int'l Microwave Symposium Digest; Anaheim, CA, USA.

Subramanian, E., et al; "Enhanced Probe Card Facilities At-Speed Wafer Probing in Very High Density Applications"; Sept. 20-24, 1992; Proc. Of International Test Conference.

Table of Contents; Edgar Online, Inc.; p. 17; 2002.

Tada, T. et al.; "Fine Pitch Probe Technology for VLSI Wafer Testing"; Sep. 10-14, 1990; Proc. Of International Test Conference; Washington DC, USA.

Takahiro, I., et al.; "Fabrication of Micro IC Probe for LSI Testing"; Sensors & Actuators A; Mar. 10, 2000.

Tamura, T.; "Probing Techniques for Ultra-High Pin Counts"; NEC Research and Development; Apr. 2000.

Tan, Q. et al.; "Reliability Evaluation of Probe-Before-Bump Technology"; Oct. 18-19, 1999; 24th IEEE/CPMT International Electronics Manufacturing Technology Symposium; Austin, TX, USA.

Texas Instruments, DMD 0.7 XGA 12 DDR DMD Discovery, Product Preview Data Sheet, TI DN 2505686 REV C, Aug. 2004, 22 pages.

The Final Test Report, vol. 13, No. 7; Jul. 2002.

Tonnies, D., "A Review and Trends in Flip Chip Technology", Germany, Chip Scale Review, Apr. 2004, pp. 55, 57 & 59.

Towle, S. et al.; *Bumpless Build-Up Layer Packaging*, Intel Corporation, Components Research, Presented at ASME International Mechanical Engineering Congress and Exposition (IMECE), New York, Nov. 12, 2001.

U.S. Environment Protection Agency Region 9 "Pollution Prevention Program: Extending Electroless Nickel Bath Life Using Electrodialysis": Jul. 1998.

VC Task Force Breakfast Workshop; May 31, 2002.

"Venom; Probe Cards; a Cobra Card Product"; Powerful Interface Technology; pp. 1-3; Nov. 9, 2001.

"Wizard qualification for PC", monitor JGO1w, Process 255, Target 240-280.

Wu, J.H., et al.; "A High Aspect-Ratio Silicon Substrate-Via Technology and Applications: Through-Wafer Interconnects for Power and Ground and Faraday Cages for SOC Isolation"; Dec. 10-13, 2000; Int'l Electron Devices Meeting, IEEE.

Xerox Palo A lot Research Center, "Micro-Contact Springs for High Performance Probing and Packaging", Apr. 8, 1998.

Yassine, A.M., "Characterization of Probe Contact Noise for Probes Used in Wafer-Level Testing", IEEE Electron Device Letter, vol. 12, No. 5, May 1991, pp. 200-202.

Yin, W.M., "Creep in Boron-Doped Nanocrystalline Nickel", Scripta Matter. 44, vol. 44, No. 4, Mar. 20, 2001, pp. 569-574.

Zhang, Y. et al.;"A New Mems Wafer Probe Card"; Jan. 26-30, 1997; Proc. Of 10th Annual Int'l Workshop on Micro Electro Mechanical Systems, pp. 395-399.

Zhang, Y., "Design, Simulation, Fabrication and testing of Microprobes for a New Mems Wafer Probe Card", Dissertation, Dept. Of Electrical and Computer Engineering, New Jersey Institute of Technology, May 1997.

Zhang, Y., et al.; "Thermally Actuated Microprobes for a New Wafer Probe Card"; Journal of Microelectromechanical Systems; Mar. 1999.

Zheng, Y., "Study of Copper Applications and Effects of Copper Oxidation in Microelectronic Package", in Partial Fulfillment of MatE 234, May 10, 2003, 26 pages.

Zhu, S., "Joining of AlN ceramic to metals using sputtered Al or Ti Film", Journal of Materials Processing Technology, vol. 109, Issue 3, Feb. 15, 2001, pp. 277-282.

\* cited by examiner

HIGH DENSITY INTERCONNECT SYSTEM HAVING RAPID FABRICATION CYCLE

CROSS REFERENCE TO RELATED APPLICATIONS

This Application is a Divisional of U.S. patent application Ser. No. 11/858,064, entitled High Density Interconnect System Having Rapid Fabrication Cycle, filed 19 Sep. 2007, which is a Continuation of U.S. patent application Ser. No. 11/133,021, entitled High Density Interconnect System Having Rapid Fabrication Cycle, filed 18 May 2005 now U.S. Pat No. 7,382,142, which claims priority to U.S. Provisional Application No. 60/573,541, entitled Quick-Change Probe Chip, filed 20 May 2004; U.S. Provisional Application No. 60/592,908, entitled Probe Card Assembly with Rapid Fabrication Cycle, filed 29 Jul. 2004; and U.S. Provisional Application No. 60/651,294, entitled Nano-Contactor Embodiments for IC Packages and Interconnect Components, filed 08 Feb. 2005.

U.S. Patent Application Ser. No. 11/133,021, entitled High Density Interconnect System Having Rapid Fabrication Cycle, filed 18 May 2005, is also a Continuation-ln-Part of U.S. patent application Ser. No. 10/870,095, entitled Enhanced Compliant Probe Card Systems Having Improved Planarity, US Filing Date 16 Jun. 2004 now U.S. Pat. No. 7,349,223, which is a Continuation-In-Part of U.S. patent application Ser. No. 10/196,494, entitled Mosaic Decal Probe, filed 15 Jul. 2002, issued as U.S. Pat. No. 6,710,609 on 23 Mar. 2004.

U.S. patent application Ser. No. 10/870,095, entitled Enhanced Compliant Probe Card Systems Having Improved Planarity, US Filing Date 16 Jun. 2004, is also a Continuation-In-Part of U.S. patent application Ser. No. 10/178,103, entitled Construction Structures and Manufacturing Processes for Probe Card Assemblies and Packages Having Wafer Level Springs, US Filing Date 24 Jun. 2002, issued as U.S. Pat. No. 6,917,525 on 12 Jul. 2005, which is a Continuation-In-Part of U.S. patent application Ser. No. 09/980,040, entitled Construction Structures and Manufacturing Processes for Integrated Circuit Wafer Probe Card Assemblies, US Filing Date 27 Nov. 2001, issued as U.S. Pat. No. 6,799,976 on 05 Oct. 2004, which claims priority from PCT Patent application Ser. No. PCT/US00/21012, filed Jul. 27, 2000, which claims priority from U.S. Provisional Application No. 60/146,241, filed on 28 Jul. 1999.

U.S. patent application Ser. No. 09/980,040, entitled Construction Structures and Manufacturing Processes for Integrated Circuit Wafer Probe Card Assemblies, US Filing Date 27 Nov. 2001, issued as U.S. Pat. No. 6,799,976 on 05 Oct. 2004, also claims priority from PCT patent application Ser. No. PCT/US00/14164, entitled Construction Structures and Manufacturing Processes for Integrated Circuit Wafer Probe Card Assemblies, filed 23 May 2000, which claims priority from U.S. Provisional Application No. 60/136,636, entitled Wafer Interface for High Density Wafer Probe Card, filed on 27 May 1999.

Each of the above documents is incorporated herein in its entirety by this reference thereto.

FIELD OF THE INVENTION

The invention relates generally to the field of semiconductor wafer testing utilizing probe card assembly systems for testing one or more die on a wafer. More particularly, the invention relates to probe card assembly systems incorporating microfabricated probe tips and improvements thereto, which improve the performance, ease of use and lower the cost of ownership.

BACKGROUND OF THE INVENTION

Probe card assembly systems are used in integrated circuit (IC) manufacturing to translate electrical signal paths from the tightly spaced electrical interconnection pads on ICs to the coarsely spaced electrical interconnection pads on printed circuit boards that interface to IC test systems.

Advances in semiconductor integrated circuit wafer design, processing, and packaging technologies have resulted in increases in the number of input/output (I/O) pads on each die and as well as in an increase in the diameter of the silicon wafers used in device fabrication. With more die to test per wafer and each die having more I/O pads, the cost of testing each die is becoming a greater and greater fraction of the total device cost. This undesirable trend can only be reversed if either the test time required for each die is reduced or else multiple die are tested simultaneously. If multiple die are tested simultaneously, then the requirements for parallelism between the probe tips and the semiconductor wafer and the co-planarity of the probe tips become increasingly stringent since all of the probe tips are required to make good electronic contact at the same time over a large area on the wafer.

In the prior art, probe card assembly systems have been equipped with various types of mechanical mechanisms designed to affect in-situ parallelism adjustment of the probe tips relative to the semiconductor wafer to insure that adequate electrical contact is made to all of the probed devices on the wafer.

Evans et al (U.S. Pat. No. 4,975,638) teach a method of correcting parallelism errors between the probe tips on a membrane probe card and a semiconductor wafer under test. Evans et al teach a test probe card which includes a flexible, thin film contactor which is subjected to pressure by a rigid pressure block having two degrees of freedom that permit the block to orient itself parallel to the plane of the IC device being tested and impose an evenly controlled force on the probe contacts carried by the contactor. Evans et al claims that the significant advantage of their invention is that the probe contacts carried by the flexible film contactor of the test probe card all lie in a common plane and are maintained in this plane in the course of a testing procedure.

In probe card assembly systems according to Eldridge et al (e.g. U.S. Pat. No. 6,624,648 and U.S. Pat. No. 5,974,662, parallelism errors between their probe tips and the semiconductor wafer are corrected by adjusting the orientation of a space transformer using multiple ball tipped linear actuators. The space transformer also serves as the support substrate for composite probe elements fabricated as described in the patent specification, each of which are individually mounted on the space transformer. Eldridge et al state that an object of their invention is that the space transformer, and hence, the tips of their elongate resilient probe elements can be "oriented without changing the position of the probe card".

The examples of Evans and Eldridge given above are presented as exemplary methods for correcting parallelism errors between the plane of the probe tips and the reference surface of the probe card on which they are mounted. It is well known to those knowledgeable in the field that semiconductor wafer probers provide a head plate with a probe card mounting surface that is precisely aligned (mechanically) to be parallel to the plane in which the surface of the wafer chuck travels, that is the wafer reference surface (WRS). Thus if the parallelism error between the tips of a probe card relative to the probe card mounting surface are within acceptable tolerances, then the probe card can be mounted on a wafer prober head plate with high confidence that the probe tips will be parallel to the plane of travel of the wafer chuck, i.e. the WRS, and therefore to the surface of semiconductor wafer under test.

During the process of electrical testing of the integrated circuits (die) on a semiconductor wafer in a semiconductor wafer prober, the wafer chuck translates the surface of the wafer under test through a plane that is parallel to the WRS. As mentioned previously, the WRS is pre-adjusted to be parallel to the plane of the probe card interface assembly mounting surface in the wafer prober head plate. The semiconductor wafer under test is reversibly yet precisely mounted on the WRS of the wafer chuck, such as by electrostatic means or by an applied vacuum, thereby requiring the wafer to mechanically conform to the WRS. The surface of the semiconductor wafer is thus affixed and positioned so as to be precisely in a plane that is parallel to the WRS of the wafer chuck.

To test more than one die on a semiconductor wafer, simultaneous low-resistance electrical contacts must be established with positionally matching sets of spring probes, such as but not limited to stress metal spring (SMS) probe tips, for each die to be tested. The more die to be tested simultaneously, the greater the degree of parallelism that is required between the spring probes and the surface of the semiconductor wafer, i.e. the WRS, in order to insure that the probe tip scrub, and hence electrical contact, is uniform across the wafer. However, as higher numbers of die are tested in parallel, the number of simultaneous interconnects from the IC to the probe card assembly to the IC tester increases (not assuming pin multiplexing). Since probe tips for contacting the bonding pads on IC wafers require sufficient mechanical force on a per connection basis to assure a reliable low resistance connection, the total force between the probe card assembly and the wafer increases in proportion to the number of connections. The force between the IC tester and the probe card assembly also increases on a pin by pin basis when pogo pins are used as the electrical interface, however, there is a growing trend toward the use of zero insertion force connectors (ZIF) to reduce the force between the probe card and the IC tester.

A Precision Point VX probe card measurement tool, available through Applied Precision, LLC, of Issaquah, WA, is capable of measuring parallelism error between the probe tips and the mounting surface of a probe card by measuring the relative "Z height" of each individual probe tip on the probe card through a measurement of the electrical conductivity between the probe tips and a highly polished electrically conductive tungsten surface of a so called checkplate. In order to obtain planarity measurements with the Precision Point VX that are accurate to within the manufacturers specification of 0.1 mils (2.5 microns) across the full X and Y dimensions of the checkplate, the parallelism between the checkplate and the "Support Plate" which holds the probe card "Mother Board" must be mechanically adjusted following a procedure specified by the manufacturer and referred to as the "Fine Leveling calibration procedure." Because the reference surface on the "Mother Board" may be different for the Precision Point VX and a wafer prober, it is necessary to perform the fine leveling procedure or else significant errors may be introduced into the planarity measurement.

If all of the probe tips are co-planar, then any parallelism error of the probe tips relative to the mounting surface of the probe card can be measured, such as by using the Precision Point VX. The amount of parallelism correction required can be estimated from the data detailing the height of the first to the last probe tip to touch the checkplate. The parallelism error can them be corrected and the results verified on the Precision Point VX.

There are, however, several limitations to this method of parallelism correction and verification using Precision Point VX. First, it is time consuming. Verification can take four hours or more. Second, if the measurement is made under simulated tester interface force loading conditions, it may not include all aspects of the mechanical deflection associated with the forces applied during actual operation in a wafer prober. Third, the measurement may be done at room temperature and may not be indicative of the actual operating temperature which will induce mechanical changes due to the thermal coefficients of the various materials in the probe card assembly.

It is also possible to adjust the parallelism of the probe tips on the wafer prober. However, this is problematic because wafer probers are generally used in production environments and such activities may not be desirable. Additionally, special equipment or tooling may be required that can cause additional complication and chance for error. In any case, it is an additional burden on the user if it is required to adjust the planarity of the probe tips each time the probe card is moved from one wafer prober to another or from a quality control (QC) test instrument, such as from the Precision Point VX to a wafer prober.

There is a need for a probe card assembly system in which the parallelism of the probe tips relative to the semiconductor wafer is pre-set at the factory and no in-situ adjustment is necessary, even after changing the probe tip assembly. With such a system, it would be possible to change the probe tip assembly for cleaning, repair, or replacement or to accommodate work flow changes without the need to re-adjust the parallelism of the probe tips. With a probe card assembly having a pre-set parallelism adjustment, the customer could then keep on hand an adequate inventory of spare probe tip assemblies and would need to purchase only as many probe card assemblies as was necessary to sustain their peak throughput requirement.

It would be advantageous to provide a probe card assembly system that resists deflection under the forces generated when the probe tips are compressed during testing, i.e. due to upward displacement of the wafer prober chuck beyond the point at which the probe tips touch the wafer surface. Such a probe card assembly system would constitute a major technical advance.

Furthermore, it would be advantageous to provide a probe card assembly system that maintains low resistance electrical connections to a device under test at either elevated or depressed operating temperatures. Such a probe card assembly system would constitute a further technical advance.

As well, it would be advantageous to provide a probe card assembly system that comprises components with mechanical surfaces that are sufficiently flat and parallel to one another, to enable them to act as reference surfaces for other components either within the probe card assembly system, or that interface to the probe card assembly system. Such a probe card assembly system would constitute a further major technical advance.

It would be further advantageous to provide such a probe card assembly system having relatively flat and parallel component surfaces, that more evenly distribute and vertically transmit the high forces associated with high I/O count ICs and testers, to reduce peak-to peak mechanical deflections within the probe card assembly system, wherein the forces are generated either by the various spring pre-loading mechanisms or by the compression of the spring probes during wafer testing. Such a probe card assembly system would constitute a further major technical advance.

There is also a need for probe card assembly systems having components with improved flatness and parallelism that can rest against each other since such surfaces can enable pre-aligned, easy to replace components and sub-assemblies. Relatively flat and parallel surfaces and probe tip arrays having smaller deviations from co-planarity reduce the need for planarity adjustment. Additionally, relatively flat and parallel reference surfaces can also enable the use of very low force interposers, e.g. 0.05 g to 5 g per contact, to make low resistance high-density electrical connections over large areas, e.g. 1,000 sq cm for 300 mm wafers. Furthermore, low force interposers combined with flat and parallel reference and support surfaces enable simpler methods of clamping and achieving and maintaining planarity. Alternatively, large area components such as mother boards, Z-blocks, etc. with flat surfaces enable the use of vacuum actuated systems to achieve high levels of surface parallelism. Additionally, large area solid electrical interface connections fabricated with materials such as solder, gold wire bond bumps, plated bumps, or adhesives all have higher manufacturing yields and perform better and more reliably with flatter and more parallel interconnection support surfaces.

As well, time is often critical factor for users of probe card assemblies, such as semiconductor manufacturers and testers. However, conventional probe card assemblies typically comprise one or more key components that have long lead times, such as for multilayered ceramic components. As conventional assembly structures and manufacturing methods include such long lead time components, that the resulting fabrication cycle for one or more assemblies is long.

It would therefore be further advantageous to provide probe card assembly structures and methods having improved, i.e. rapid, fabrication cycles, for which portions of the probe card assembly can be fabricated, assembled, and/or pre-planarized, while long-lead lead time components, such as complex, custom, or semi-custom components, are readily mountable and/or remountable from the other components and assemblies. Such a probe card assembly system would constitute a further major technical advance.

SUMMARY OF THE INVENTION

An improved interconnection system and method is described, such as for connectors, socket assemblies and/or probe card systems. An exemplary system comprises a probe card interface assembly for establishing electrical connections to a semiconductor wafer mounted in a semiconductor wafer prober. The probe card interface assembly comprises a mother board having an upper surface and a lower planar mounting surface opposite the upper surface and parallel to the semiconductor wafer, a reference plane defined by a least three points located between the lower surface of the motherboard and the semiconductor wafer, at least one component having an upper mounting surface located below the motherboard mounting surface and a lower mounting surface opposite the upper mounting surface, and a mechanism for adjusting the planarity of the reference plane with respect to the semiconductor wafer. A probe chip having a plurality of spring probes extending there from is mountable and demountable from the probe card interface assembly, without the need for further planarity adjustment. The interconnection structures and methods preferably provide improved fabrication cycles.

DETAILED DESCRIPTION OF PREFERRED EMBODIMENTS

Figure 1:
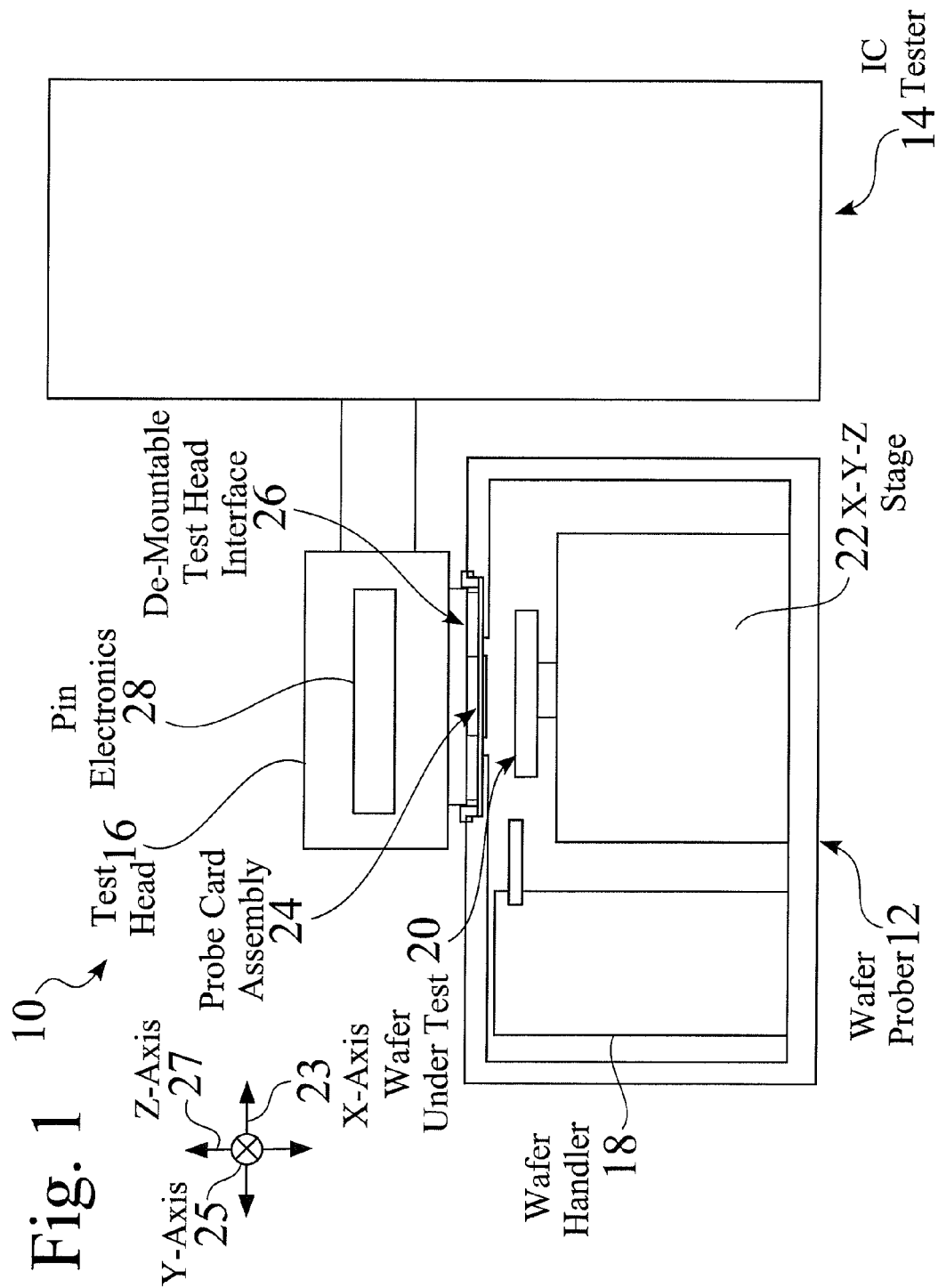
FIG. 1 is a system diagram of a complete system for testing semiconductor wafers including an IC tester and a probe card assembly installed in a wafer prober.

Introductory disclosure regarding structures, processes and systems disclosed herein is seen in: U.S. Provisional Application No. 60/136,636, entitled Wafer Interface for High Density Probe Card, filed 27 May 1999; U.S. Provisional Application No. 60/146,241, entitled Method of Massively Parallel Testing of Circuits, filed 28 Jul. 1999; U.S. Provisional Application No. 60/573,541, entitled Quick-Change Probe Chip, filed 20 May 2004; U.S. Provisional Application No. 60/592,908, entitled Probe Card Assembly with Rapid Fabrication Cycle, filed 29 Jul. 2004; U.S. Provisional Application No. 60/651,294, entitled Nano-Contactor Embodiments for IC Packages and Interconnect Components, filed 08 Feb. 2005; U.S. patent application Ser. No. 10/870,095, entitled Enhanced Compliant Probe Card Systems Having Improved Planarity, US Filing Date 16 Jun. 2004; U.S. patent application Ser. No. 10/178,103, entitled Construction Structures and Manufacturing Processes for Probe Card Assemblies and Packages Having Wafer Level Springs, US Filing Date 24 Jun. 2002; U.S. patent application Ser. No. 09/980,040, entitled Construction Structures and Manufacturing Processes for Integrated Circuit Wafer Probe Card Assemblies, US Filing Date 27 November 2001; PCT patent application Ser. No. PCT/US00/21012, filed 27 Jul. 2000; PCT patent application Ser. No. PCT/US00/14164, entitled Construction Structures and Manufacturing Processes for Integrated Circuit Wafer Probe Card Assemblies, US Filing Date 23 May 2000; and U.S. patent application Ser. No. 10/069,902, entitled Systems for Testing and Packaging Integrated Circuits, filed 28 Jun. 2002, which are each incorporated herein in its entirety by this reference thereto.

FIG. 1 is a system diagram of a system 10 for testing semiconductor wafers 20, including an IC tester 14 and a probe card assembly 24 installed in a wafer prober 12. The wafer prober includes an X-Y-Z stage 22, and a wafer handler 18 for locating or removing semiconductor wafers 20 on the X-Y-Z stage 22. Relative position and movement in the system 10 is associated with an X-Axis 23, a Y-axis 25, and a Z-axis 27. The probe card assembly 24 is attachable to a test head 16 of the IC tester 14, through a de-mountable test head interface 26. The test head 16 typically includes pin electronics 28.

Figure 2:
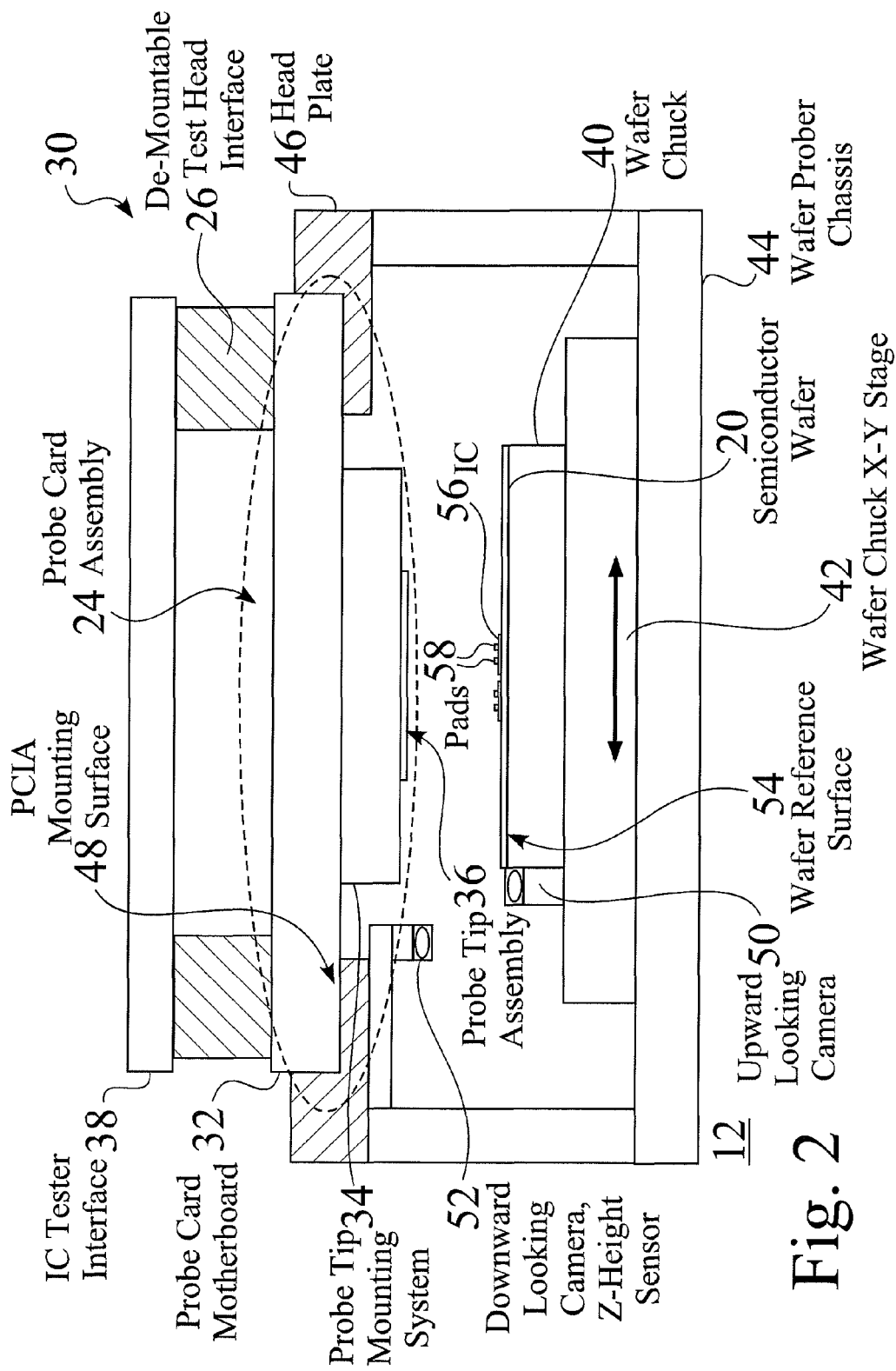
FIG. 2 is a system diagram of a probe card assembly installed in a semiconductor wafer prober system.

FIG. 2 is a system diagram of a probe card assembly 24 installed in a wafer prober 12. A probe card assembly 24, which is mounted on a mounting surface 48 of a head plate 46 within the wafer prober 12, comprises a mother board 32, a probe tip mounting system 34, and a probe tip assembly 36.

The mounting surface 48 of the head plate 46 is pre-calibrated to be parallel to the plane of travel of the wafer chuck 40. Upward and downward looking cameras 50,52, as well as other types of sensors, provide data on the position of the wafer 20 and probe tip assembly 36, to enable software routines that ensure that the spring probes 180 (FIG. 3) are accurately positioned with respect to test pads 58 on one or more integrated circuit (IC) die 56 on the semiconductor wafer 20 over the travel of the X-Y and Z stages 22,42.

Figure 3:
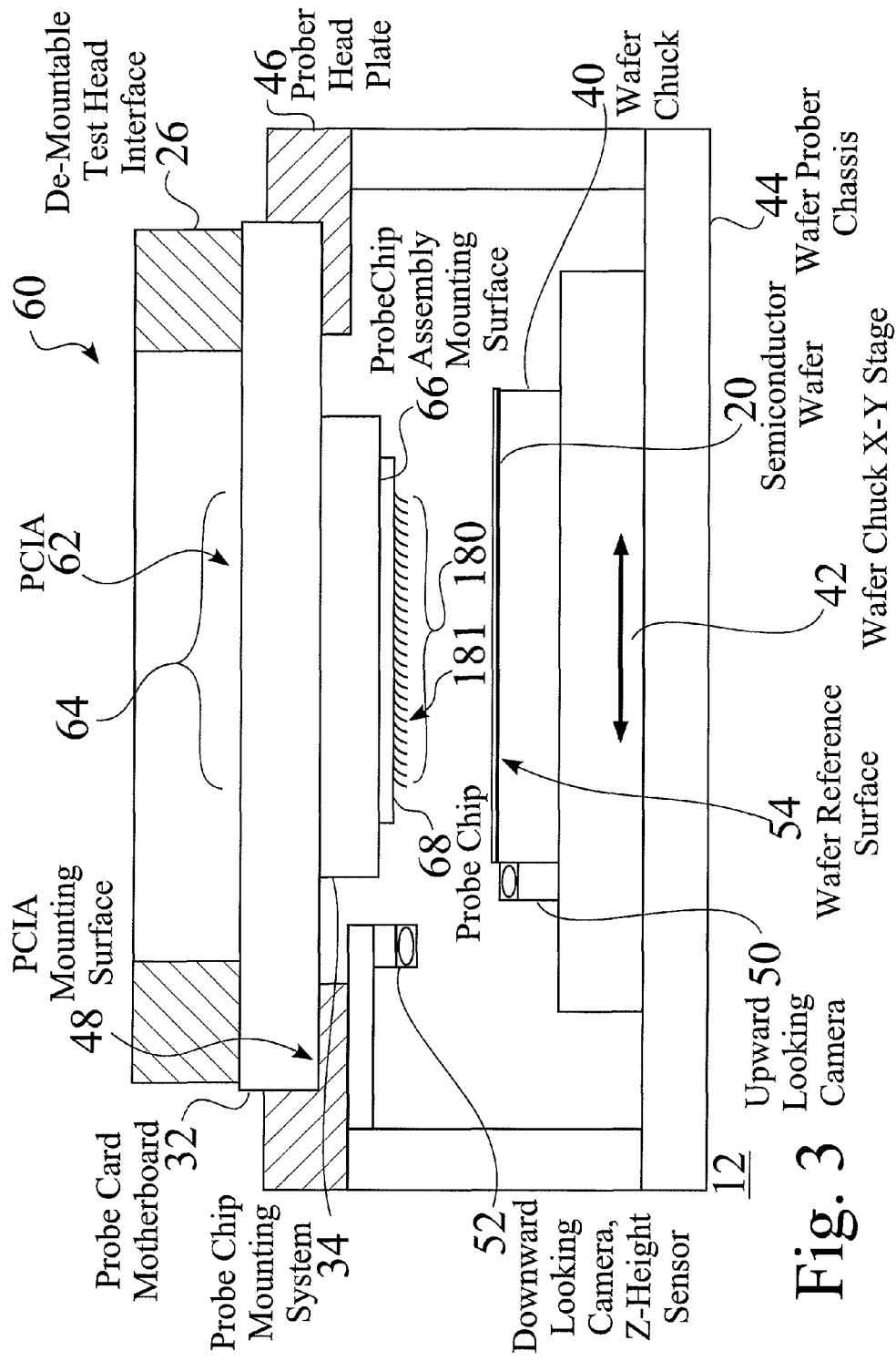
FIG. 3 is a system diagram showing with a quick-change probe chip probe card assembly installed in a semiconductor wafer prober.

FIG. 3 is a system diagram 60 showing with a quick-change probe chip probe card assembly 64 installed in a semiconductor wafer prober 12. The quick-change probe card assembly 64 comprises a probe card interface assembly (PCIA) 62, and a probe chip 68, wherein the probe card interface assembly (PCIA) 62 comprises a motherboard 32 and an integrated probe chip mounting system 34.

The probe tips 181 of the spring probes 180 on the probe chip 68 are preferably pre-aligned to be parallel to the plane of the PCIA 62, ensuring that the probe tips 181 are also parallel to the surface 54 of the wafer chuck 40, and thus also parallel to the surface of a semiconductor wafer 20 attached to the wafer chuck 40. The spring probes 180 may comprise any of stress metal springs, flexible springs, compliant springs, and elongate resilient probe elements.

Figure 4:
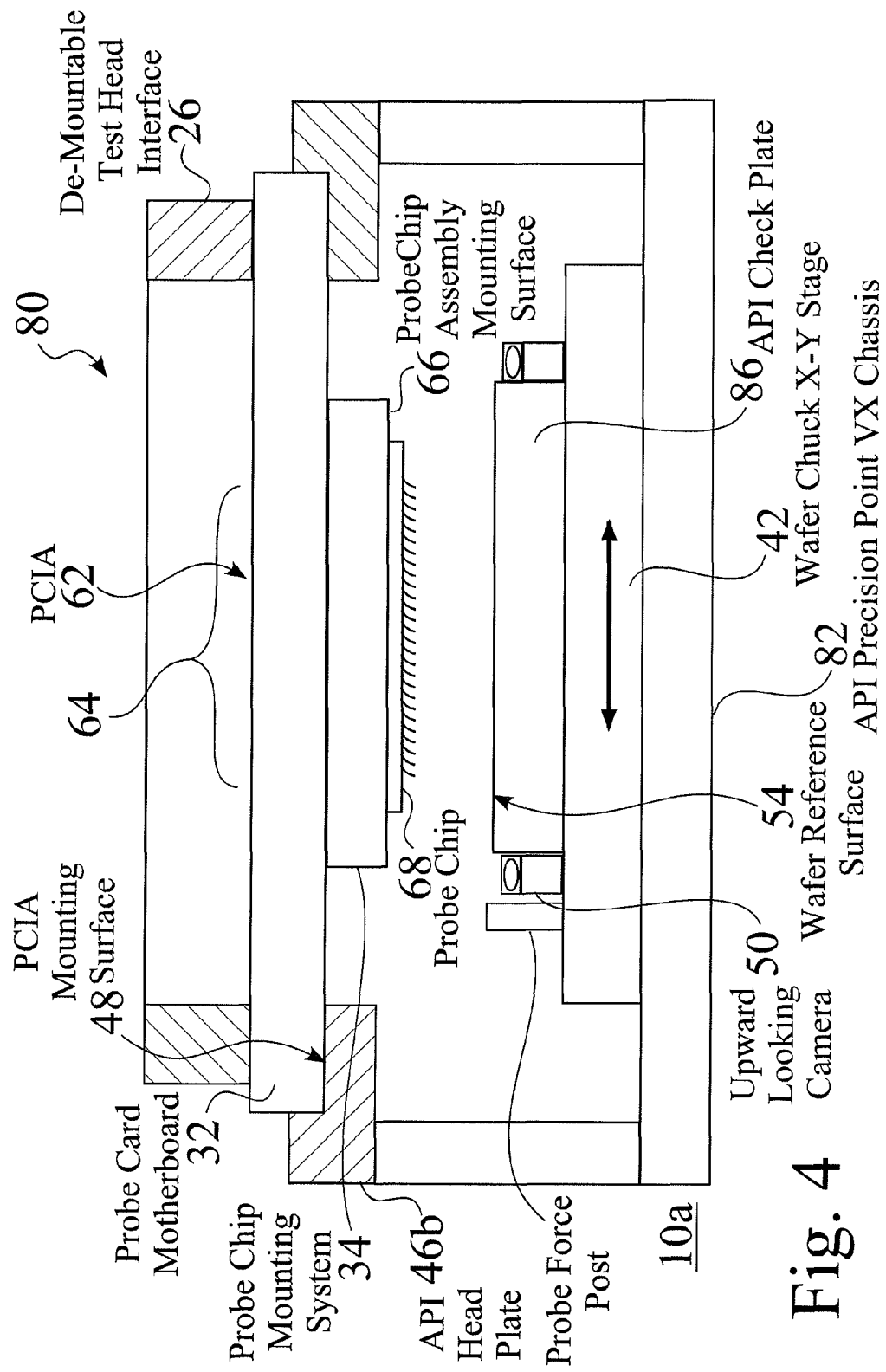
FIG. 4 is a diagram showing a quick-change probe chip probe card assembly having a probe card Interface assembly (PCIA) installed in an API Precision Point VX probe card test system.

FIG. 4 is a diagram showing a quick-change probe card assembly 64, having a probe card interface assembly (PCIA) 62, installed in an API Precision Point VX probe card test system 10a. The API system 10a is an exemplary system for performing measurements used for planarity calibration and functional verification testing.

Figure 5:
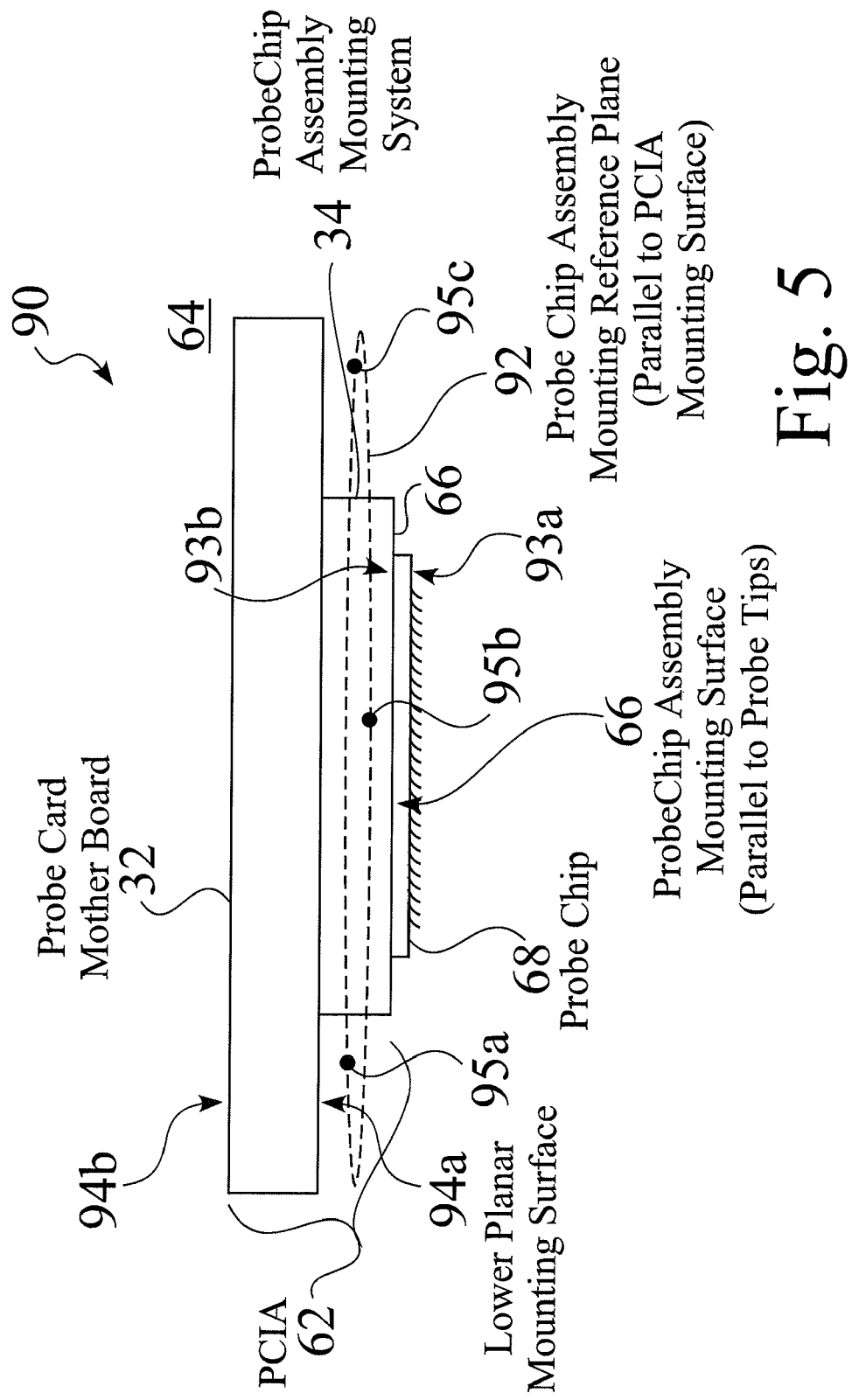
FIG. 5 is a schematic diagram of a quick-change probe chip probe card assembly.

FIG. 5 is a detailed schematic diagram 90 of a probe card assembly 64. The probe card assembly 64 comprises a probe card interface assembly (PCIA) 62 and a probe chip 68 having a probing surface 93a and a mounting surface 93b opposite the probing surface 93a. The probe card interface assembly (PCIA) 62 comprises a motherboard 32 and an integrated probe chip mounting system 34. A probe chip assembly mounting reference plane 92, defined by at least three points 95, e.g. 95a,95b,95c between the lower surface of the motherboard 32 and the semiconductor wafer 20 mounted in a wafer prober 12, is established within the PCIA 62 to be parallel to the PCIA mounting surface 94a, such as by using measurement data taken on each individual PCIA 62. Depending on the specific design implementation of a given PCIA 62, the method of data collection and calibration data may take different forms. However, the result is that data, e.g. planarity data, is used to establish the probe chip assembly mounting reference plane 92 within the PCIA 62.

The probe chip 68 is mounted to the probe chip assembly mounting surface 66. The mounting surfaces of the intermediate components of the probe chip assembly mounting system 34 are fabricated to be sufficiently parallel to each other, to ensure that the plane of the probe tips 181 on the probe chip 68 are adequately parallel to the PCIA mounting surface 94a, given the mechanical tolerances of the system, to minimize the need for planarity adjustment. The probe tips 181 of the probe chip 68 in the probe card assembly 64 are pre-aligned to be minimally non co-planar to each other and parallel to the plane of the probe chip assembly mounting surface 66, thus ensuring that the probe tips 181 are also parallel to the surface of the wafer chuck 40 and to the surface of a semiconductor wafer 20 affixed to the wafer chuck 40 in a wafer prober 12. The spring probes 180 may comprise any of stress metal springs, flexible springs, compliant springs, and elongate resilient probe elements.

Figure 6:
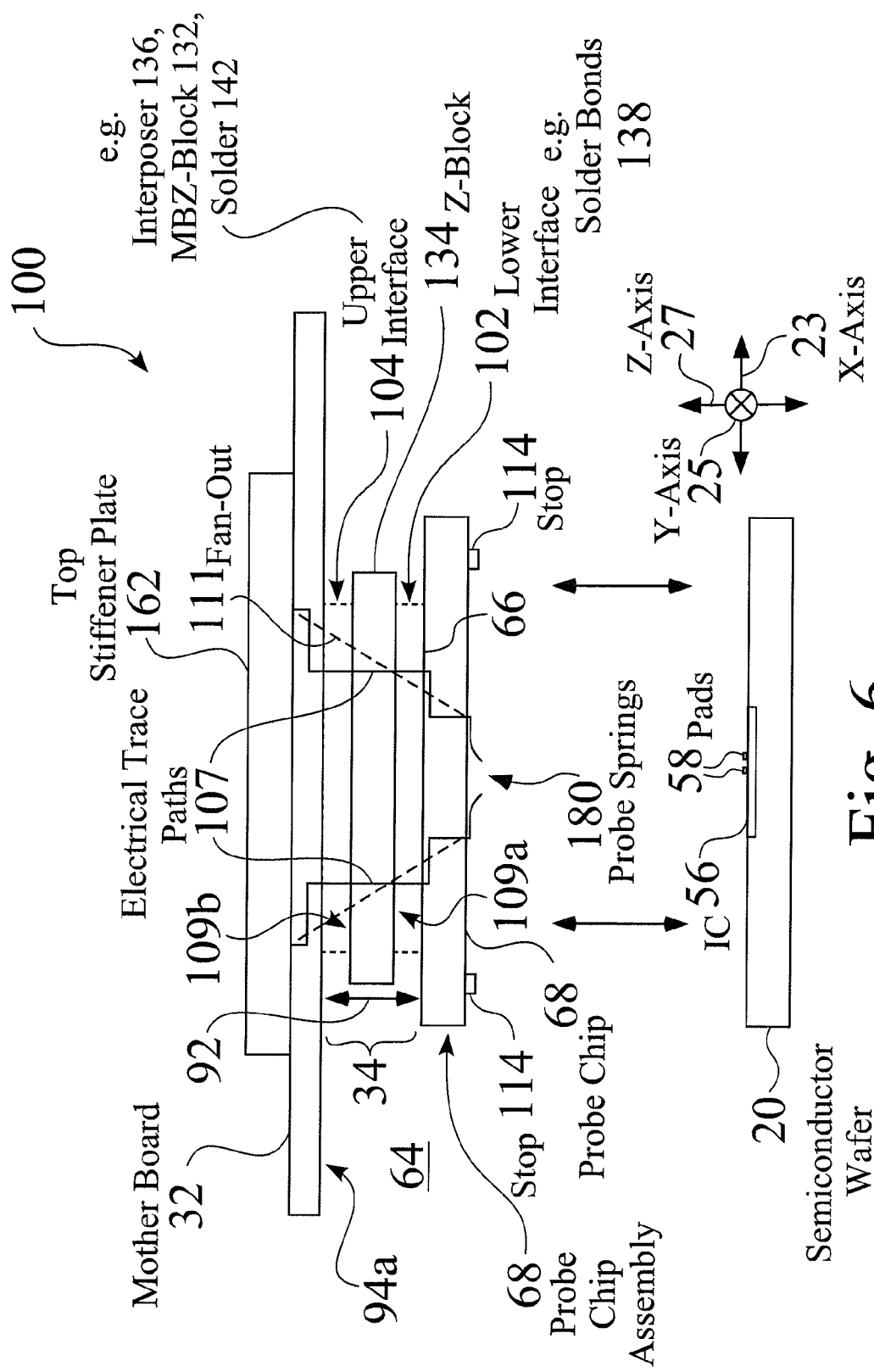
FIG. 6 is a detailed schematic diagram of a quick-change probe chip probe card assembly.

FIG. 6 is a detailed schematic diagram 100 of a probe card assembly 64. As seen in FIG. 5, the quick-change probe card assembly 64 comprises a probe card interface assembly (PCIA) 62 and a probe chip 68, wherein the probe card interface assembly (PCIA) 62 comprises a motherboard 32 having electrical connections 169 (FIG. 9) extending there through, and an integrated probe chip mounting system 34. Electrical trace paths 107 extend through the motherboard 32, the probe chip mounting system 34, and the probe chip 68, to spring probes 180, such as to establish contacts with pads 58 on one or more ICs 56 on a semiconductor wafer 20. Fan-out 111 may preferably be provided at any point for the electrical trace paths 107 in a probe card assembly 64, such as to provide transitions between small pitch components or elements, e.g. probe chips 68, and large pitch components or elements, e.g. tester contact pads 164 on the mother board 32. For example, fan-out may typically be provided by the mother board 32, the probe chip 68, by a Z-block 134, by a motherboard Z-Block, or anywhere within the lower interface 102 and/or the upper interface 104.

As seen in FIG. 6, the probe chip mounting system 34 typically comprises a Z-block 134, a lower interface 102 between the Z-block 134 and the probe chip 68, and an upper interface between the Z-block 134 and the motherboard 32. In some quick change probe card assemblies 64, the lower interface 102 comprises a plurality of solder bonds 138. As well, in some quick change probe card assemblies 64, the upper interface 102 comprises a combination of componentry and connections, such as an interposer 136 (FIG. 8), solder bonds 152 (FIG. 8), solder bonds 142 (FIG. 8), and/or a motherboard MB Z-block 132.

The probe chip assembly mounting reference plane 92 is defined at any location below the PCIA mounting surface 94a of the motherboard 32, such as vertically between the PCIA mounting surface 94a of the motherboard 32 and the upper connection surface 93b of the probe chip 68, or vertically between the PCIA mounting surface 94a of the motherboard 32 and a semiconductor wafer 20.

In some embodiments, the probe chip assembly mounting reference plane 92 is defined at some point vertically between the PCIA mounting surface 94a of the motherboard 32 and the upper connection surface 93b of the probe chip 68. The probe chip assembly mounting reference plane 92 may coincide with a real surface within the probe chip mounting system 34, or may comprise a virtual defined plane 92 that is parallel to the PCIA mounting surface 94a. For example, for a probe chip mounting system 34 that is not initially parallel to the PCIA mounting surface 94a of the motherboard 32, measured data can be used to provide planarity compensation, e.g. three or more points in space, that can be provided by a planarity adjustment mechanism 166 (FIG. 9), such as comprising any of adjustable screws, shims, spacers, washers, solder bonds, and springs 166.

Figure 7:
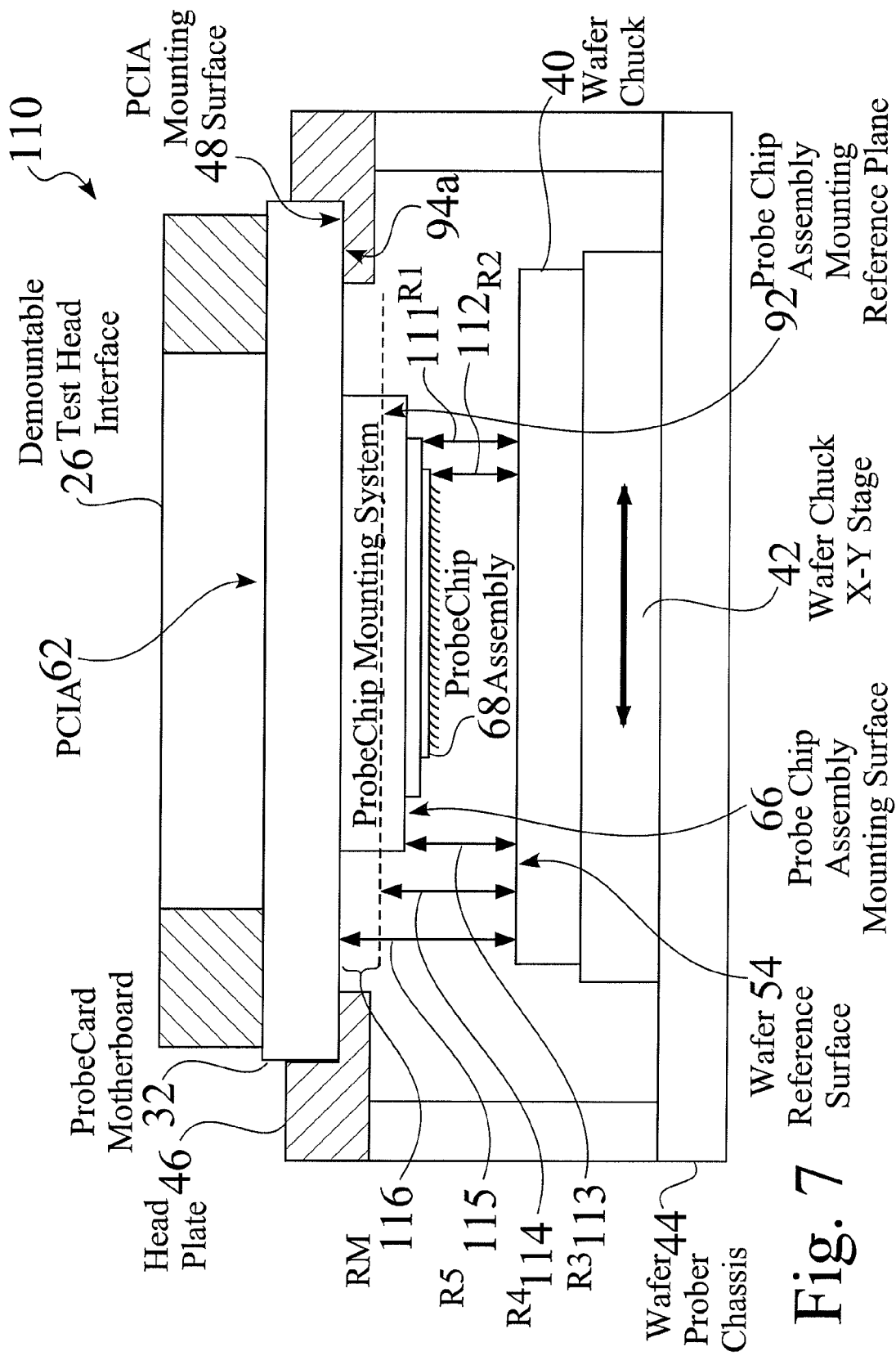
FIG. 7 is a schematic diagram of reference measurements within a quick-change probe card system.

FIG. 7 is a detailed schematic diagram of a quick-change probe card system 110, having the following key dimensions:
    wafer reference surface (WRS) 54 to probe tip dimension 112;
    wafer reference surface (WRS) 54 to probe chip front surface dimension 111;
    wafer reference surface (WRS) 54 to probe chip assembly mounting surface 66 dimension 113;
    wafer reference surface (WRS) 54 to probe chip assembly mounting reference plane 92 dimension 114;
    wafer reference surface (WRS) 54 to PCIA mounting surface 94a dimension 115; and
    probe chip assembly mounting reference plane 92 to PCIA mounting surface 94a dimension 116.

Parallelism between the head plate 46 and the wafer reference surface (WRS) 54 is ensured when the WRS to PCIA dimension 115 is within a specified tolerance range over the travel of the X-Y stage 42. PCIA Parallelism of the PCIA 62 to the WRS 54 is ensured when reference dimension 116 is within a specified tolerance range over the surface of the mother board 32. Parallelism of the probe tips 181 to the WRS 54 is then inherently ensured, by mounting the probe chip 68 either directly or indirectly to the probe chip assembly mounting reference plane 92.

The probe card interface assembly PCIA 62 shown in FIG. 5, FIG. 6, and FIG. 7 comprises the mother board 32 and other components required for mounting the probe chip 68. The mounting reference surface (MRS) 92 is established within the quick change probe card assembly 64, whereby a probe chip 68 can be readily mounted and de-mounted as required to the probe chip assembly mounting surface 66.

The quick-change probe card system 110 provides structures and methods for aligning the probe chip mounting reference plane 92 within the probe card interface assembly 62, so that the probe chip mounting reference plane 92 is precisely parallel with the probe card interface assembly mounting surface 48, and therefore also parallel to the (WRS) 54 of the wafer chuck 40 in a semiconductor wafer prober 12.

The quick-change probe card system 110 and associated method insures that the SMS probe tips 181 on the probe chip 68 are parallel with the surface of the probe chip assembly mounting surface 66. Means are provided for readily mounting the probe chip 68 to and demounting the probe chip 68 from the probe card interface assembly mounting surface 66 in the probe card interface assembly 62, thus insuring that probe tips 181 of the spring probes 180 on the probe chip 68 are parallel to the same plane of the probe card interface assembly mounting surface 48, and therefore parallel to the plane of the wafer reference surface WRS 54 and consequently to the surface of the semiconductor wafer under test 20.

Figure 8:
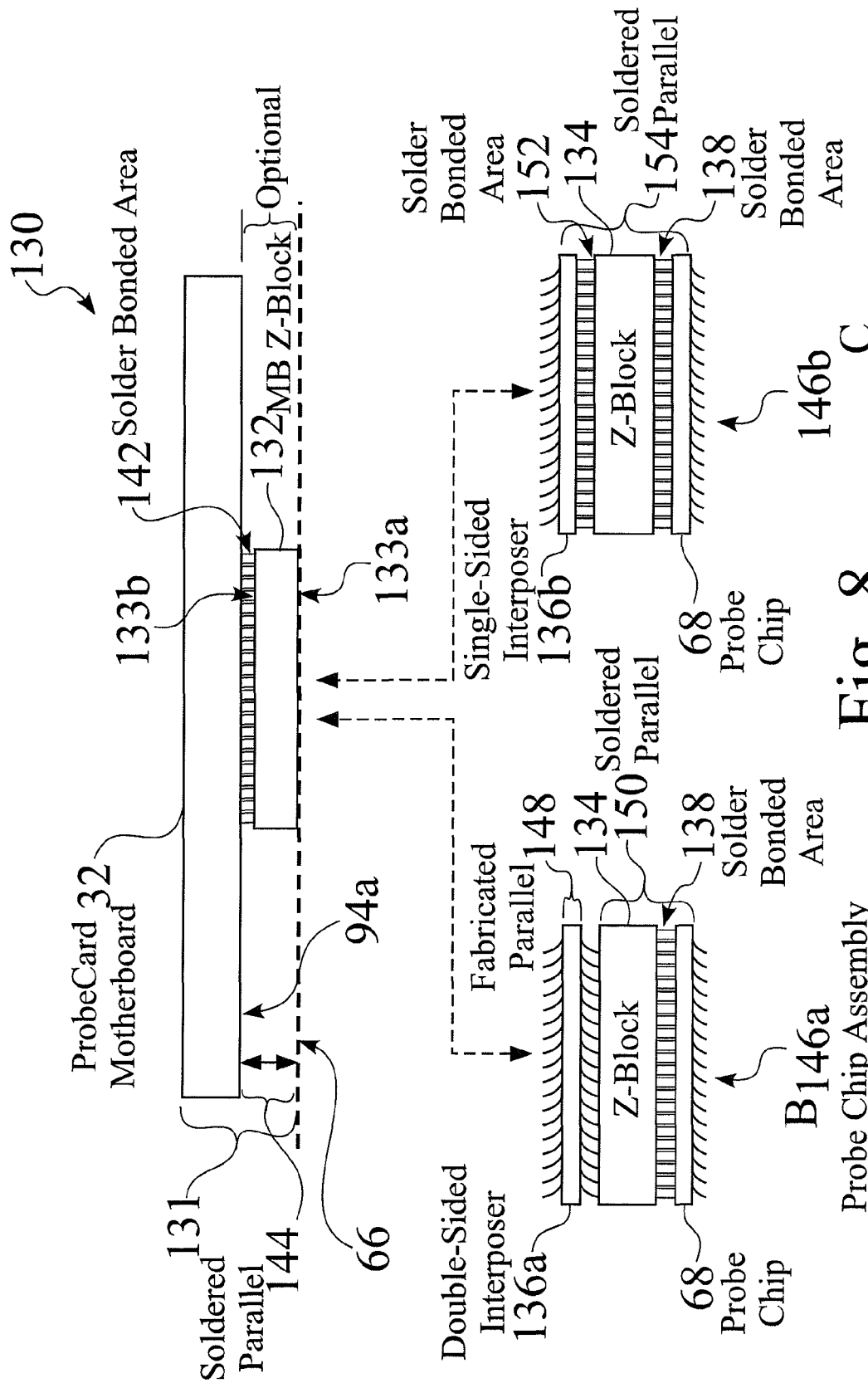
FIG. 8 is an assembly diagram between a pre-planarized motherboard and an upper Z-block assembly and a probe chip probe card assembly incorporating either of a single sided interposer or a double-sided interposer soldered to the back side of a lower Z-block.

FIG. 8 is an assembly diagram 130 between an upper assembly 131 and a lower probe chip assembly 146, e.g. 146a, 146b. The upper assembly 131 comprises a motherboard 32 that is solder bonded 142 to a motherboard Z-block assembly 132. The lower probe chip assembly 146, e.g. 146a, 146b, incorporating either a single sided interposer 136b or a double-sided interposer 136a, is soldered 138 to the back side of a lower Z-block 134.

The motherboard (MB) Z-block 132 is solder bonded 142 to the probe card motherboard 32 using a fixture 560 (FIG. 30), whereby the front surface 133a of the motherboard Z-block 132 is fabricated to be parallel to the probe card mounting surface 94a. The probe chip 68 is solder bonded 138 to the lower Z-block 134 using fixture 300 (FIG. 19, FIG. 20) that insures that the probe tips 181, the front surface 93a, and/or the back surface 93b of the probe chip 68 is parallel either to the back surface 109b (FIG. 6) of the Z-block 134 in probe chip assembly 146a, or to the upper surface 204a (FIG. 11) of a single sided interposer 136b soldered to the back side of the Z-block 134 in probe chip assembly 146b. Means are provided for readily mounting probe chip assemblies 146a or 146b to and demounting the probe chip assemblies 146a or 146b from the probe card interface assembly mounting surface 66 in the probe card interface assembly 62, thus insuring that SMS probe tips 181 on the probe chip 68 are in parallel to the plane of the probe card interface assembly mounting surface 48, and therefore parallel to the plane of the wafer reference surface WRS 54 and consequently to the surface of the semiconductor wafer under test 20.

Figure 9:
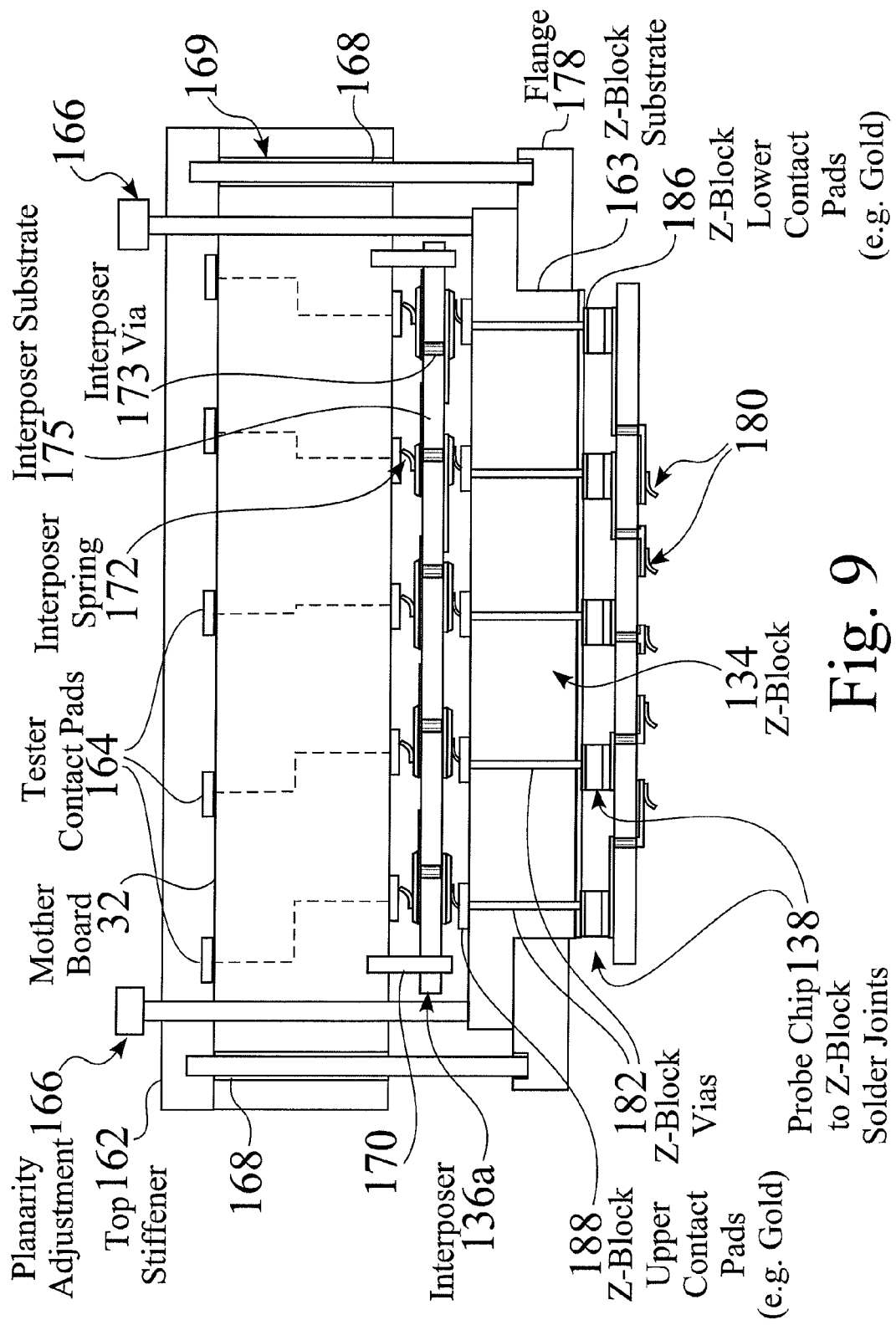
FIG. 9 shows a soldered probe chip probe card embodiment having a double-sided upper interposer.
Figure 10:
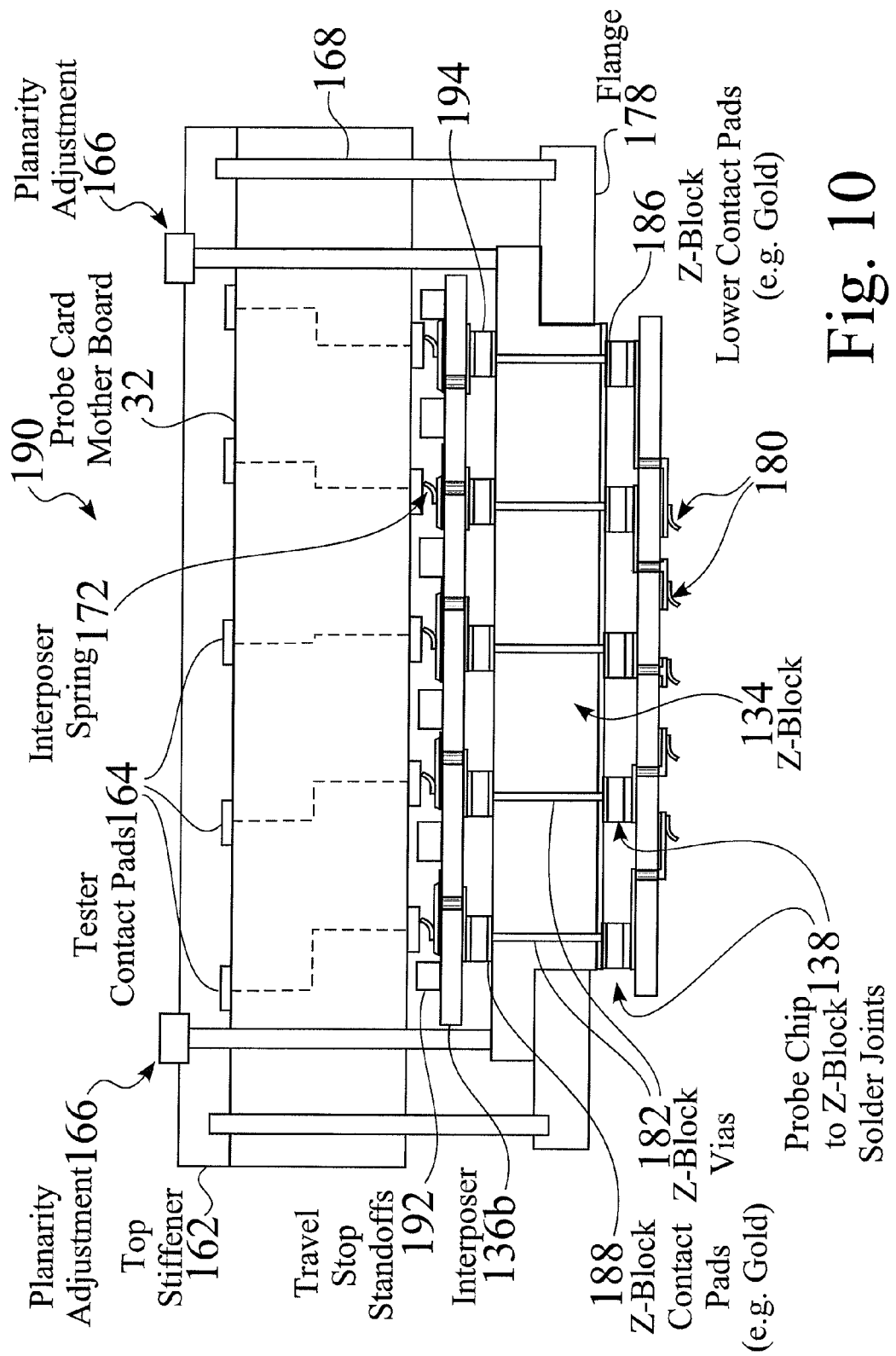
FIG. 10 shows a soldered probe chip probe card embodiment having a single sided upper interposer.
Figure 26:
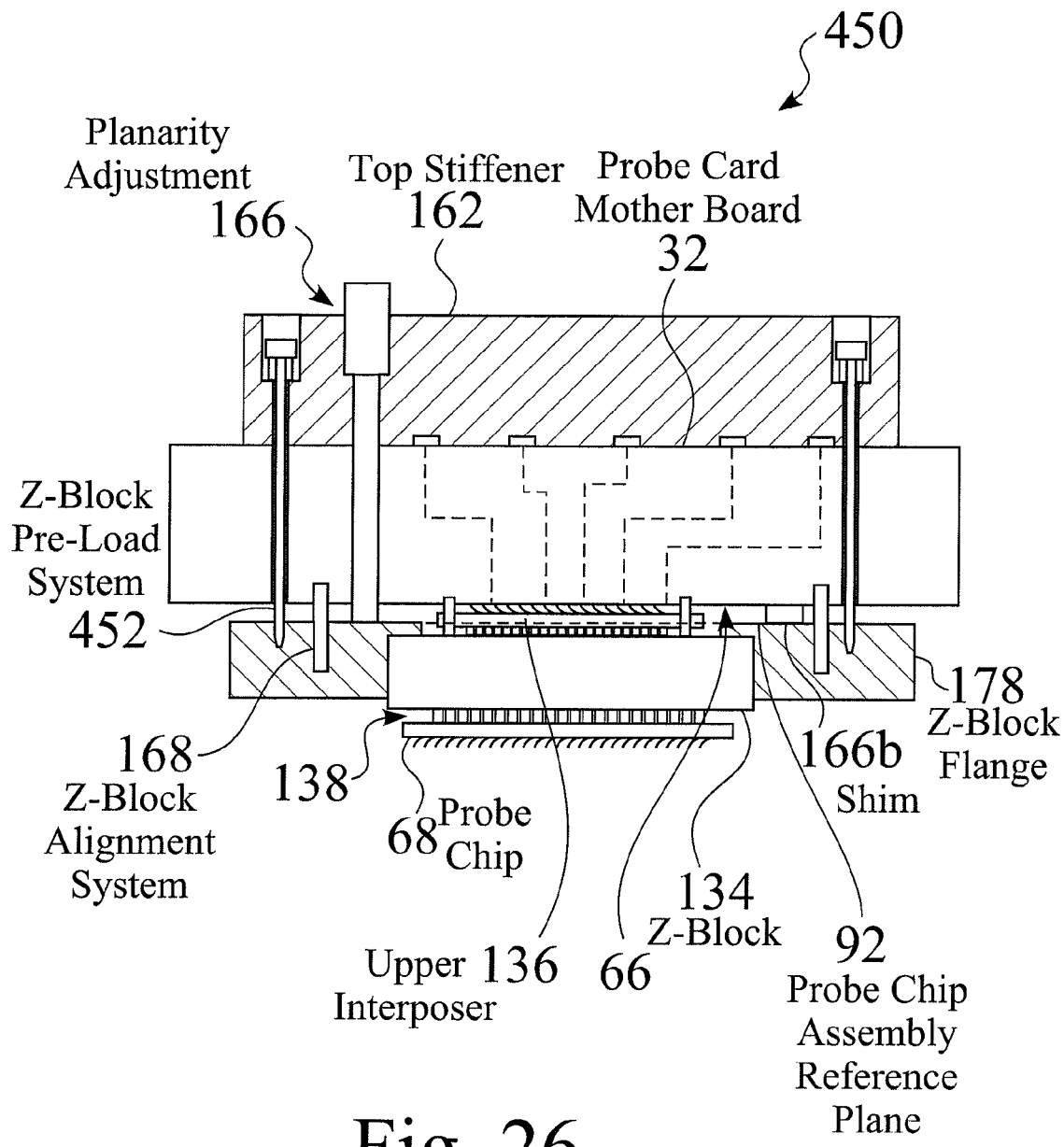
FIG. 26 is a schematic diagram of an alternative embodiment of a quick-change dual interposer Probe Card design, wherein a single probe chip is area bonded to the Z-block.

FIG. 9 is a detailed partial schematic view 160 of a quick-change probe card system 64 comprising a soldered probe chip probe card 68 having a double-sided upper interposer 136a. FIG. 10 is a detailed partial schematic view 190 of a quick-change probe card system 64 comprising a soldered probe chip probe card embodiment having a single sided upper interposer 136b. One or more travel stops 192 are preferably included to prevent the probes 172 from damage if the upper interposer 136b is bottomed out against the probe card motherboard 32. The upper interposer 136b may be plated to increase the probe force of interposer spring probes 172. Means for preload 452 is provided in the probe card assembly 64, such as seen in FIG. 26.

Outer alignment pins 168 typically extend from the top stiffener 162 through the probe card assembly 64, such as through the probe card interface assembly 62. The outer alignment pins 168 engage mechanical registration features 169, such as notches, slots, and/or holes, or any combination thereof, defined in components in the probe card assembly 64, such as the motherboard 32 and the Z-block flange 178. The use of registration features 169 preferably allows for differences in thermal expansion between components in the probe card assembly 64, to allow testing over a wide temperature range.

Figure 11:
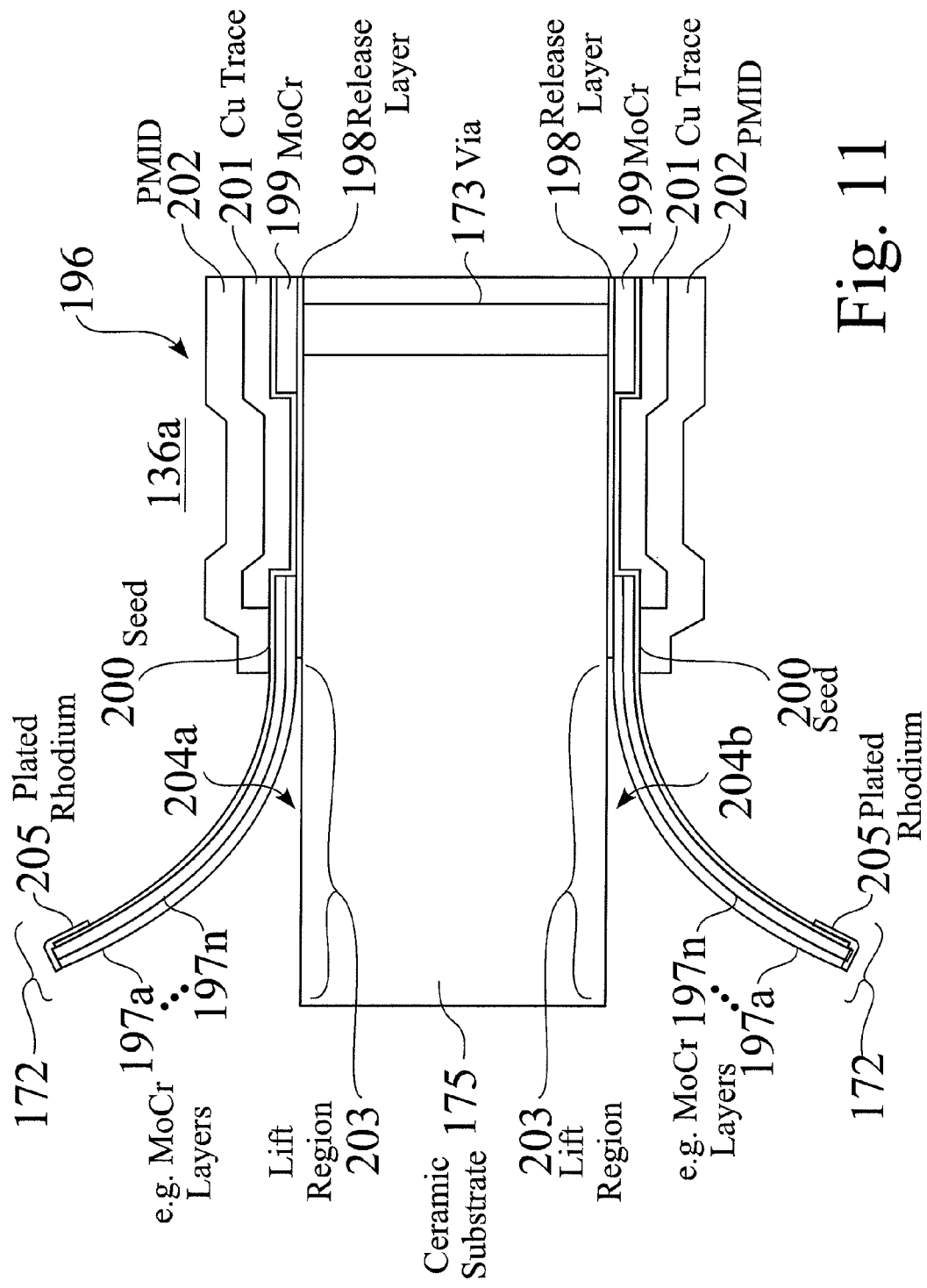
FIG. 11 is a detailed partial cross sectional view of an interposer structure.
Figure 27:
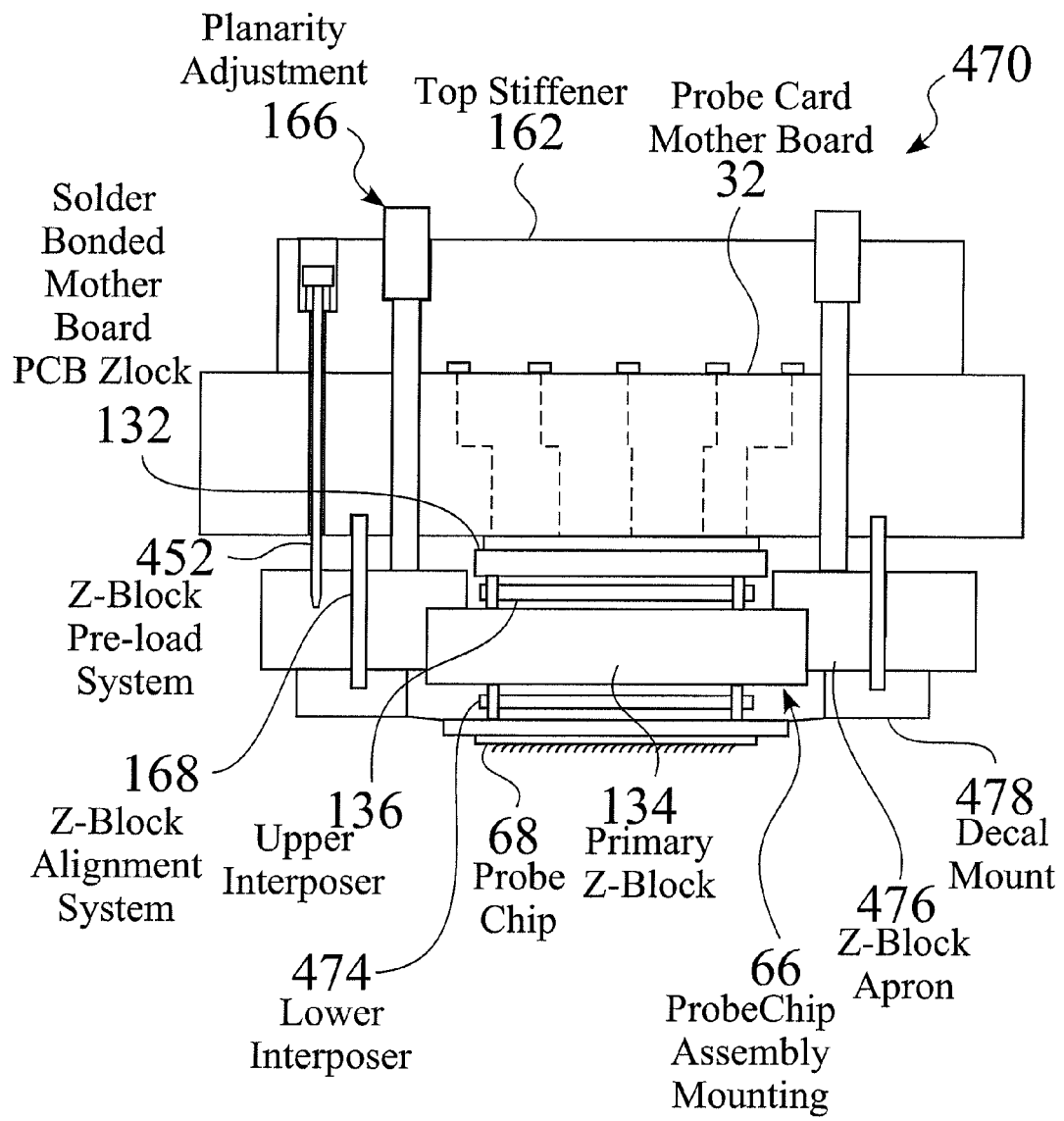
FIG. 27 is a schematic view of a probe card assembly having with a solder bonded PCB Z-block.

FIG. 11 is a partial cross sectional view 196 of an interposer structure 136, such as for a dual-sided interposer 136a, or for a dual sided lower interposer 474 (FIG. 27). Similar construction details are preferably provided in a single-sided interposer 136b.

Interposer springs 172, such as photolithographically formed probe springs 172, are generally arranged within an interposer grid array, to provide a plurality of standardized connections. For example, in the dual-sided interposer 136a shown in FIG. 9, the interposer springs 172 provide connections between a motherboard 32 and a Z-block 134. Similarly, in the lower interposer 474 shown in FIG. 27, the interposer springs 172 provide connections between the Z-block 134 and the probe chip 68.

Interposer vias 173 extend through the interposer substrate 175, from the first surface 204a to the second surface 204b. The interposer vias 173 are preferably arranged in redundant via pairs, such as to increase the manufacturing yield of the interposer 136,474, and/or to promote electrical conduction, particularly for power traces.

The opposing surfaces 204a,204b are typically comprised of a release layer 198, such as comprising titanium, and a composite layer 197, 198, typically comprising a plurality of conductive layers 197a-197n, having different inherent levels of stress. Interposer vias 173, e.g. such as CuW or gold filled, extend through the central substrate 175, typically ceramic, and provide an electrically conductive connection between the release layers 198. The composite layers 197, 198 typically comprise MoCr, in which the interposer probe springs 172 are patterned and subsequently to be later released within a release region 203.

A seed layer 200, such as a 0.5 to 1 um thick gold layer, is preferably formed over the composite layers 197,199. In some embodiments, a tip coating 205, such as rhodium or palladium alloy, is controllably formed at least over the tips of spring fingers 172, such as to provide wear durability and/or contact reliability. Traces 201, typically comprising copper, are selectably formed by plating over the structure 196, as shown, such as to provide reduced resistance. As well polyimide PMID layers 202 are typically formed over the structure 196, as shown, to define the spring finger lift regions. A thick gold layer 200 remains on the lifted fingers 172, so as to reduce sheet resistance of the fingers 172.

Figure 12:
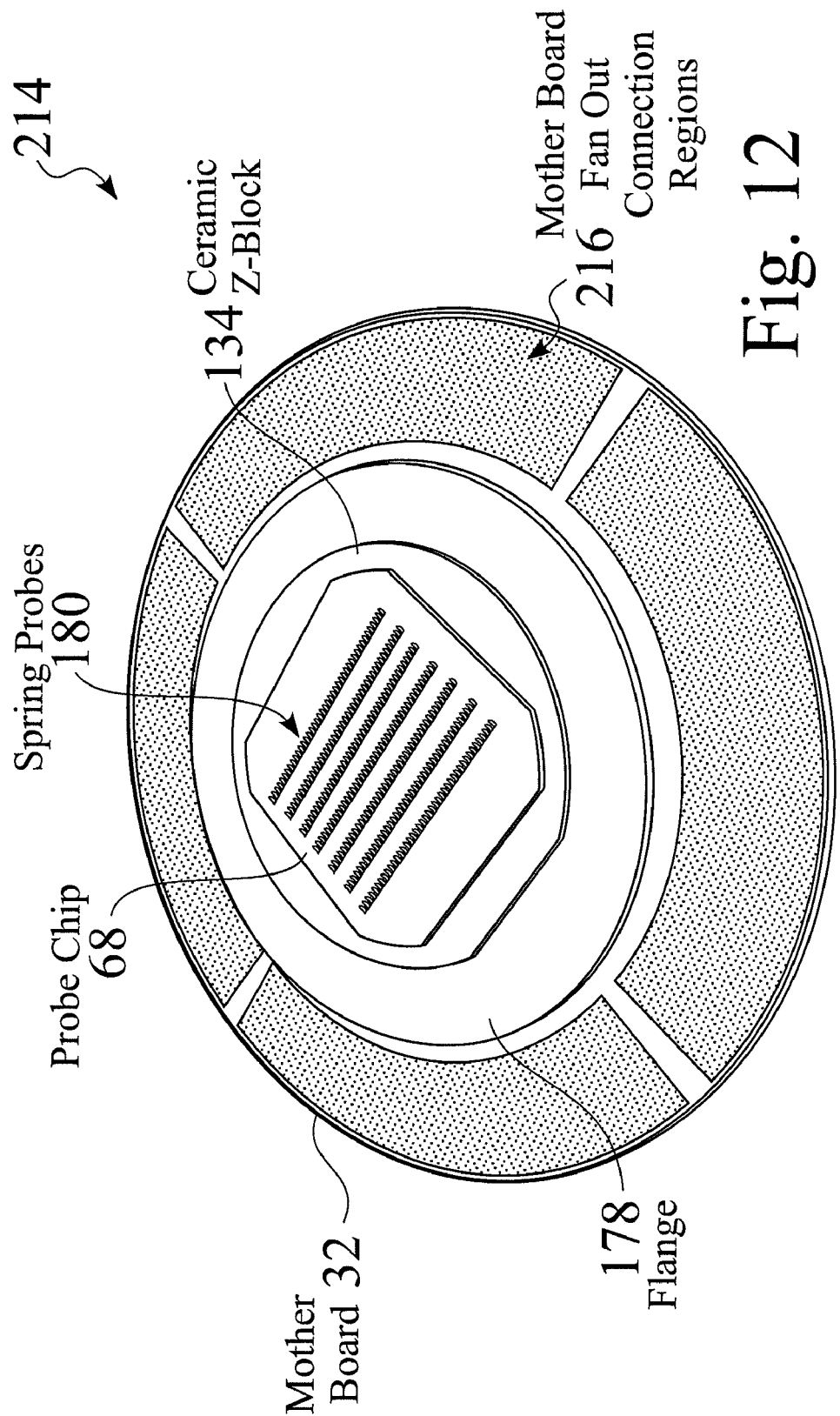
FIG. 12 is a perspective view of an embodiment of a probe card with a probe chip having backside pads soldered to a Z-bock.

FIG. 12 is a perspective view of quick-change probe card system 110 having a Probe Chip 68 having back side pads 278 (FIG. 14) soldered to a Z-bock 134. The Z-block 134 is maintained in electrical contact with the probe card motherboard 32 through an intermediate connector 136, such as an interposer 136, e.g. 136a, 136b. The Z-block 134 substrate 163 (FIG. 9) preferably comprises a material with a high elastic modulus and good electrical insulating qualities, such as a ceramic, a multilayered ceramic, and/or a co-fired ceramic. The flange 178 typically comprises a metal, such as any metal with a good thermal coefficient of expansion (TCE) match to the Z-Block substrate 163. In an exemplary Z-block 134 substrate 163, candidate flange materials include titanium, titanium alloys, Invar™, or Covar™.

Figure 13:
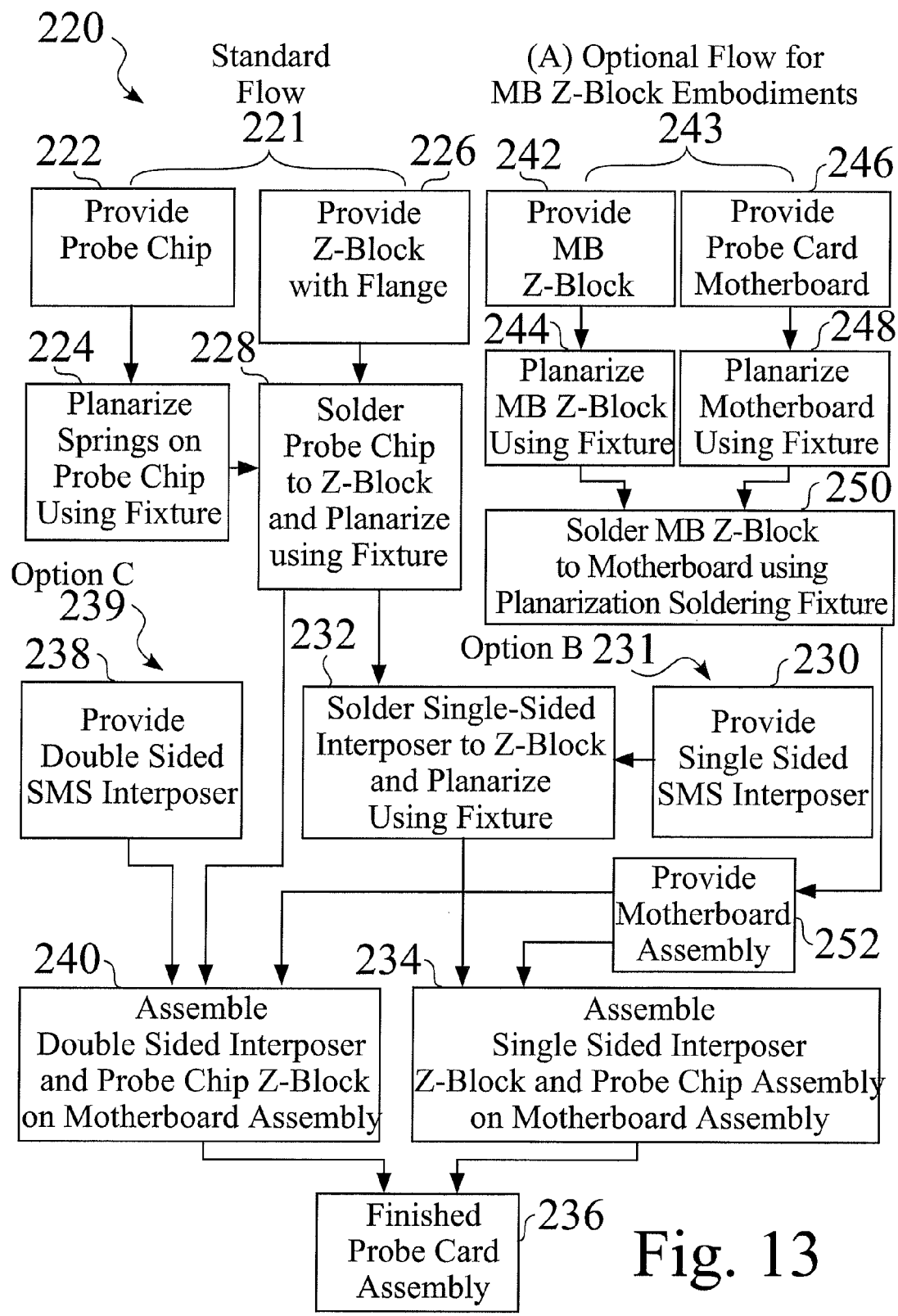
FIG. 13 is a flow chart for a probe card assembly process, including optional processes for soldering Motherboard PCB to Motherboard, soldering a single sided interposer to the top of the Z-Block or using a double-sided interposer.

FIG. 13 is a flow chart for a quick change probe card assembly process 220, including standard structure and process 221, optional structure and sub-process 243 for soldering a Motherboard PCB Z-Block 134 to a Motherboard 32, optional structure and sub-process 231 for soldering a single sided interposer 136b to the top of the Z-Block 134, or optional structure and sub-process 239 using a double sided interposer 136a.

In a standard structure and process 221, a probe chip 68 is fabricated 222, comprising a plurality of flexible spring probes 180, which typically comprise stress metal springs 180. Stress metal springs 180 are initially formed by creating a stress gradient within a MoCr spring structure 197, e.g. such as a plurality of layers 197a-197n (FIG. 11). A first metal layer 286 (FIG. 16), such as nickel, is coated 284 (FIG. 16), such as to a thickness of 2-10 microns. At this point, the tips of the stress metal springs 180 of the probe chip 68 are preferably made 292 (FIG. 17) to be co-planar, such as in a heating or annealing process 292 (FIG. 17. Subsequently, an additional metal layer 298 (FIG. 18) is coated on the stress metal springs 180, preferably to a thickness of 5-50 microns.

Figure 14:
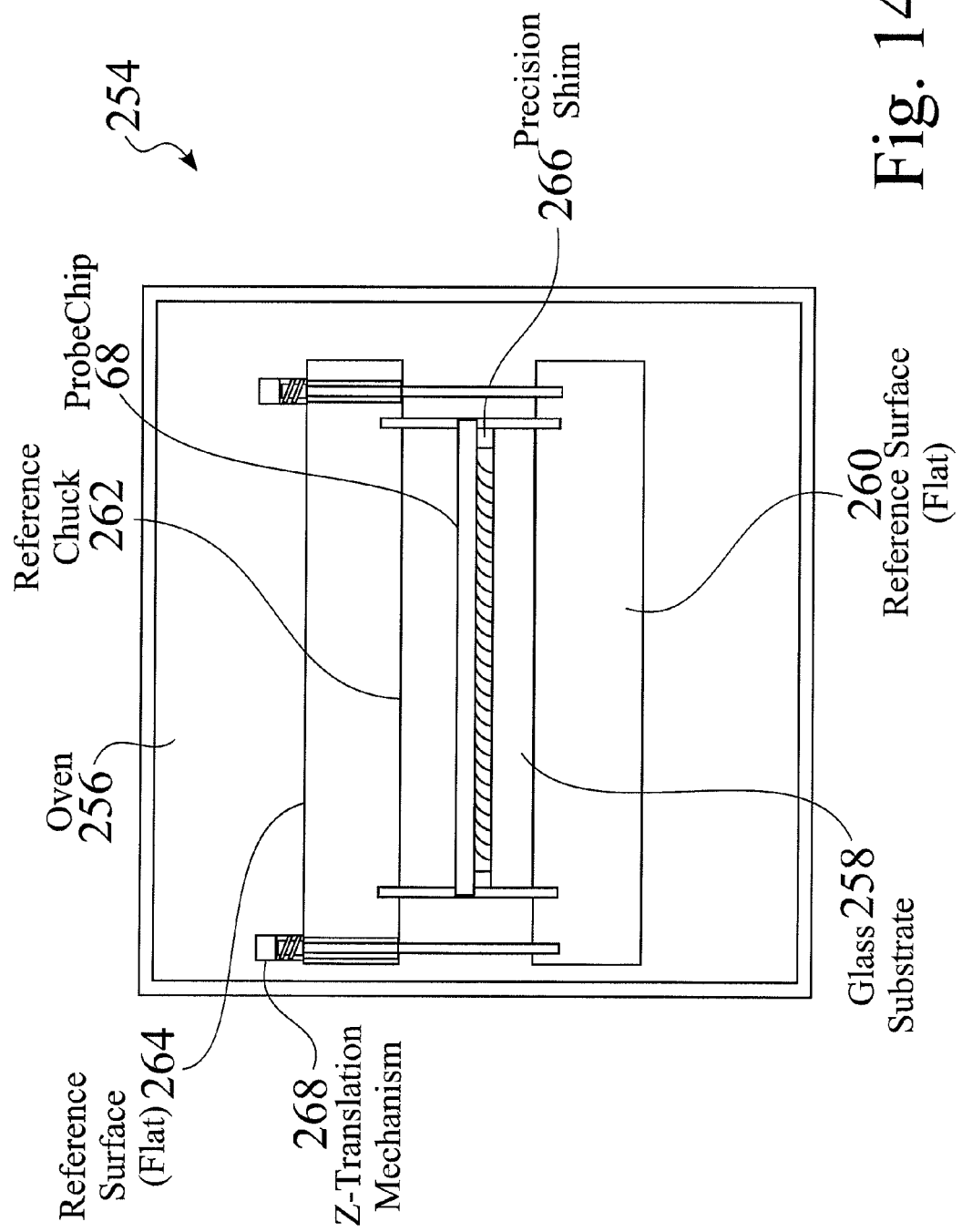
FIG. 14 shows a fixture for ensuring co-planarity of the SMS probe tips of a probe chip.

FIG. 14 is a schematic view of a fixture 254 for ensuring co-planarity of the SMS probe tips 108 of a probe chip 68. The probe chip substrate 272 (FIG. 15) is held flat against the flat surface of a reference chuck 262, e.g. such as a vacuum or electrostatic chuck 262. A precision shim 266 is placed on the surface at the periphery of the probe chip substrate 272, and rests upon a flat substrate 258, e.g. glass 258, which is located on a lower flat reference surface 260. A flat reference surface 264 is placed on top of the upper reference chuck 262 and the shim 266, thus compressing the SMS spring probes 180 such that the probe tips 181 are located at exactly the same height relative to the back side of the probe chip substrate 272. The probe chip 68 is then heated in the oven 256 to between 175-225 degrees Centigrade for a time period of between 1-3 hours, to allow the spring probes 180 to anneal and conform to the flat and planar reference surface 258,260. The system 254 is then slowly cooled, to optimally relieve stresses generated by the difference in the coefficients of thermal expansion between the ceramic substrate 272 and the probe chip metallization layers 197a-197n (FIG. 11).

Figure 19:
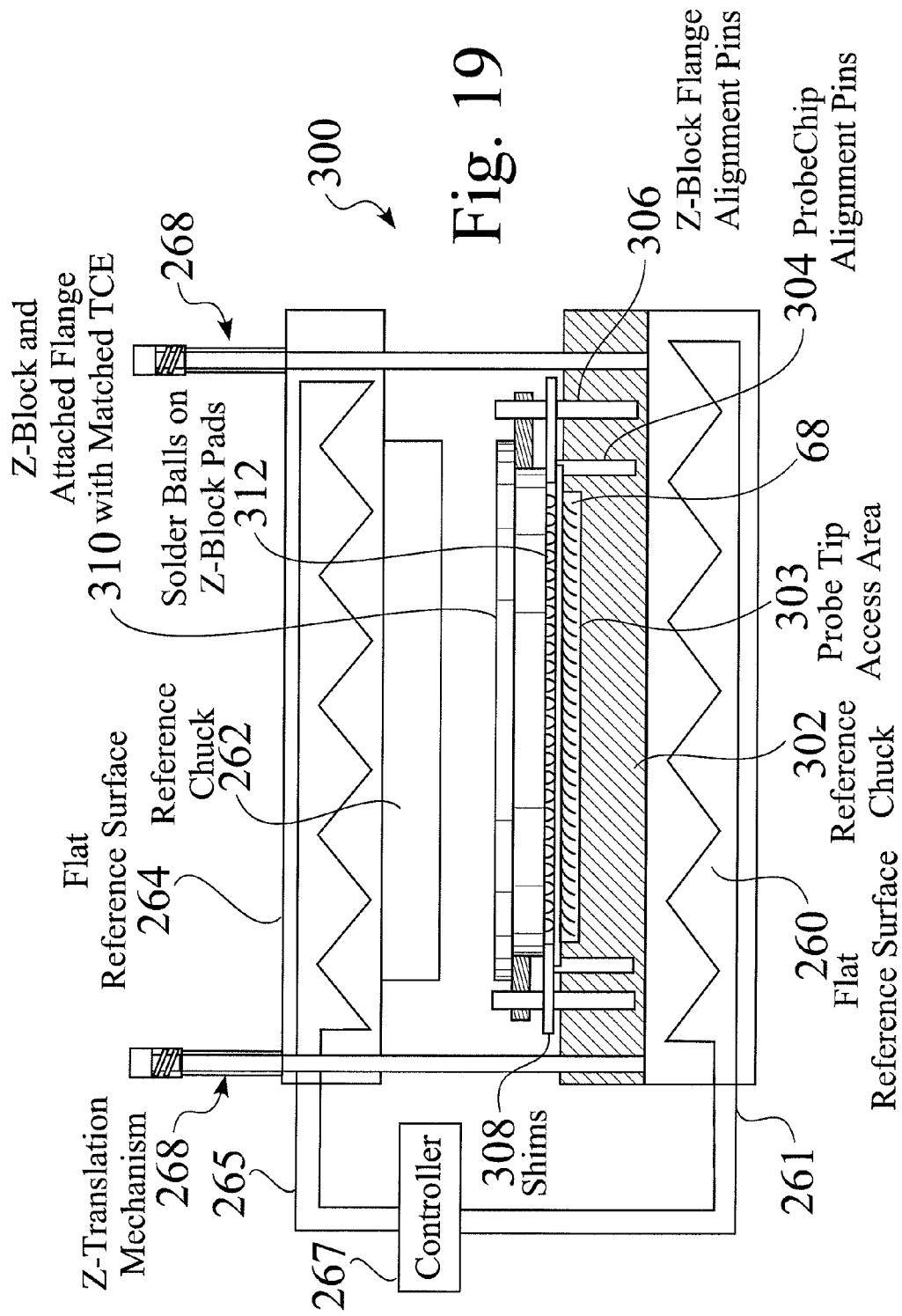
FIG. 19 is a schematic diagram of a probe chip to Z-block soldering fixture.

In an alternative embodiment, the probe tips 281 are made parallel to the front surface 93a of the probe chip substrate 272, by replacing glass substrate 258 with a chuck 258 having a flat surface and one or more recesses, similar to the recess 303 shown in FIG. 19, for the spring probes 180, wherein recesses are fabricated with a precise depth. The front surface 93a of the probe chip 68 is then held flat against the chuck flat surface 258, and the spring probes 180 are compressed against the lower surface of the recesses. This method of planarization minimizes the effect of variation in the thickness of the substrate 272 and compression of the spring probes 180. The method also helps to maintain coplanarity of the probe tips 181, after subsequent processing steps. For example, variations in substrate thickness 272 can decrease probe tip planarity after solder bonding, if the probe chip 68 is held flat against its front surface 93a during bonding if it was held flat against its back surface 93a during probe tip planarization.

Probe Chip Planarization

Figure 15:
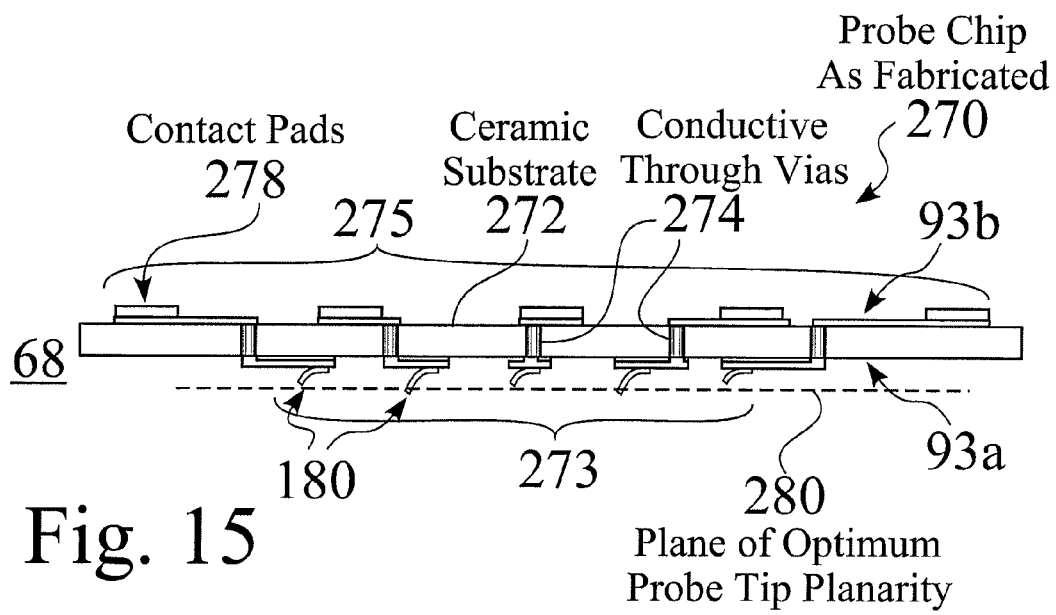
FIG. 15 shows a first step in a probe chip planarization process, in which a plane of optimum probe tip planarity is determined for probe chip as fabricated.

FIG. 15 shows a first step 270 in a probe chip planarization process 275, in which a plane 280 of optimum probe tip planarity is determined for a probe chip 68 as fabricated. As seen in FIG. 15, a probe chip 68 comprises a probe chip substrate 272 having a probing surface 93a and a bonding surface 93b opposite the probing surface 93a, a plurality of spring probes 180 on the probing surface 93a arranged 273 to correspond to the bonding pads of an integrated circuit 20 and extending from the probing surface 93a to define a plurality of probe tips 181, a corresponding second plurality of bonding pads 278 located on the bonding surface 93b and arranged in the second standard configuration 275, and electrical connections 274 extending from each of the spring probes 180 to each of the corresponding second plurality of bonding pads 278.

Figure 16:
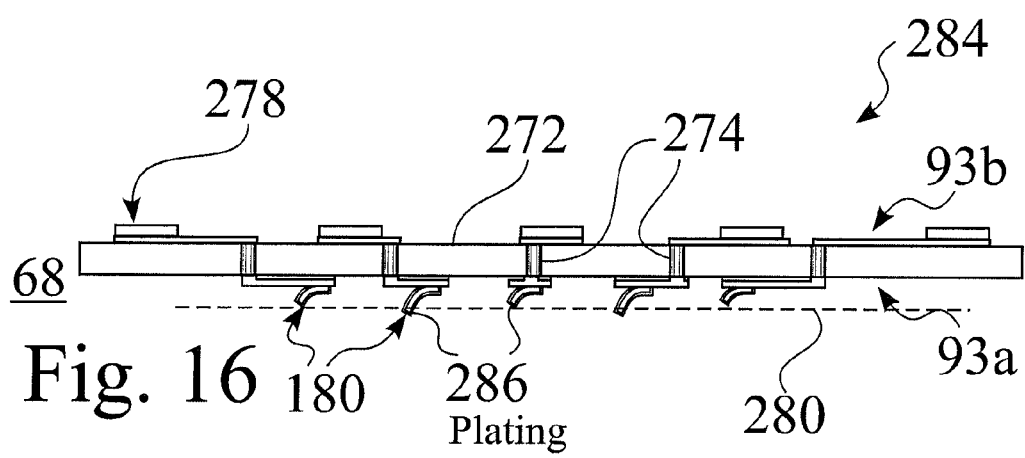
FIG. 16 shows a second step in a probe chip planarization process, in which non-planar portions of probe tips located on a probe chip are plated.
Figure 17:
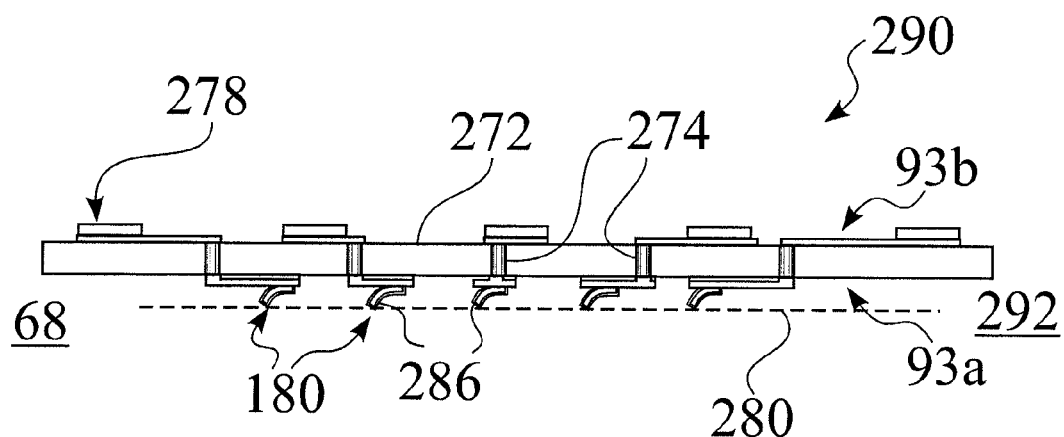
FIG. 17 shows a third step in a probe chip planarization process, in which non-planar portions of plated probe tips located on a probe chip are planarized.
Figure 18:
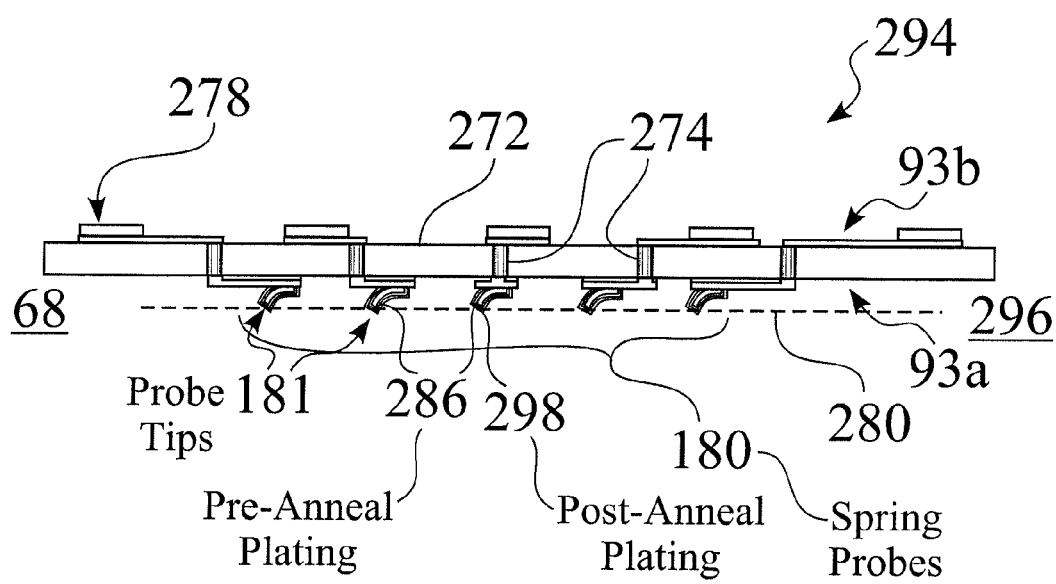
FIG. 18 shows a fourth step in a probe chip planarization process, in which the non-planar portions of the spring probes are plated after planarization.

FIG. 16 shows a second step 284 in a probe chip planarization process, in which non-planar portions of spring probes 180 located on a probe chip are plated 286. FIG. 17 shows a third step 290 in a probe chip planarization process, in which non-planar portions of plated spring probes 180 located on a probe chip are planarized 292. FIG. 18 shows a fourth step 294 in a probe chip planarization process, in which the non-planar portions of the spring probes 180 are plated 296 after planarization 292, to form an outer plating layer 298.

FIG. 19 is a schematic diagram of a Probe Chip to Z-block soldering fixture 300. The front surface 93a of the probe chip 68 is held flat against the lower reference chuck 302, e.g. vacuum or electrostatic chuck 302. One or more recesses 303 in the surface of the reference chuck 302 provide clearance for the spring probes 180 on the probe chip 68. X-Y alignment is accomplished using alignment pins 304, e.g. two pins 304, which engage mechanical registration features, such as notches or holes, in the probe chip 68. An upper reference chuck 262, such as a vacuum or electrostatic chuck 262, is attached to the top surface of the ceramic Z-block 310 to insure thermal contact. X-Y alignment for the Z-block 310 is preferably provided by pins 306 that extend from the lower reference chuck 302 into the Z-block flange 178. The lower reference chuck 302 is typically located on a lower flat reference surface element 260, which preferably includes heating means 261. The upper reference chuck 262 is typically located on an upper flat reference surface element 264, which also preferably includes heating means 263, wherein the heating means 261,263 are typically controlled 267.

The upper reference chuck 262 and the upper flat reference surface element 264 are vertically controllable in relation to the fixture 300, such as through a Z-Translation mechanism 268. Solder balls 312 between probe chip 68 and the Z-Block 310 can be reflowed, by controllably affixing the Z-block 310 and the probe chip 68 within the fixture 300, and applying heat through heaters 261,263.

Figures 20, 21:
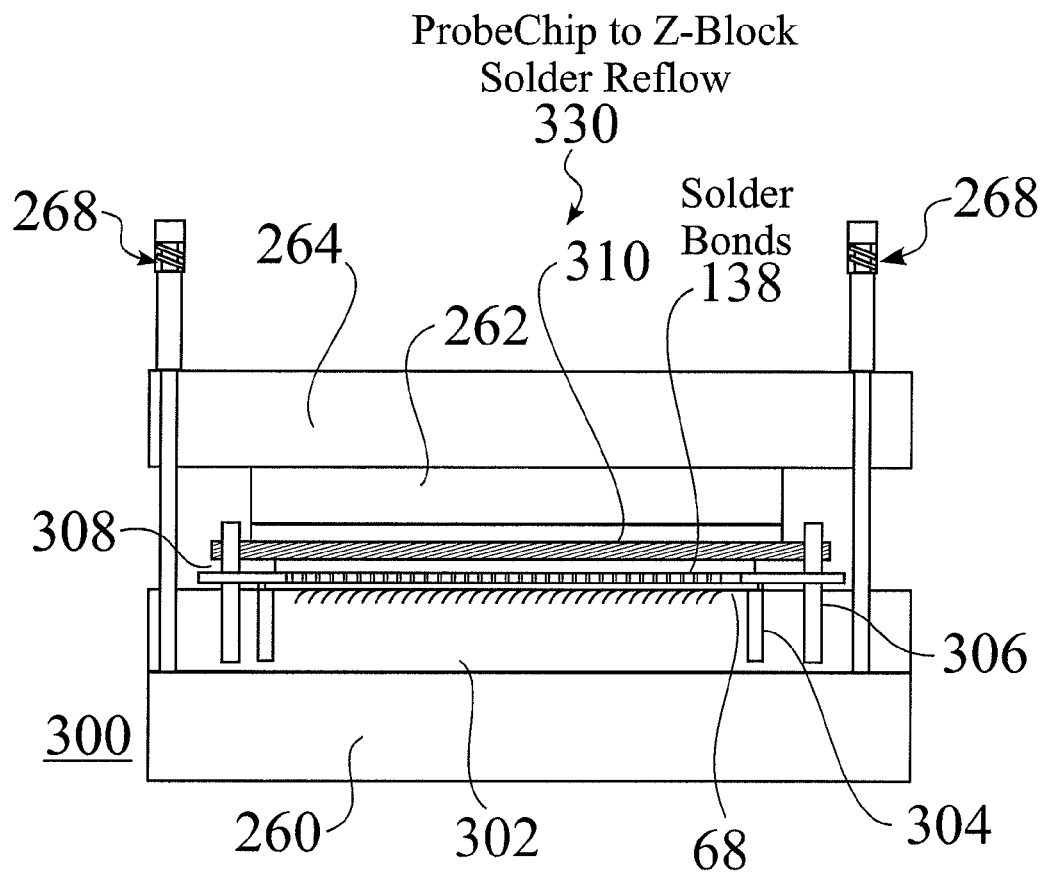
FIG. 20 shows probe chip and a Z-block placed within a probe chip to Z-block soldering fixture awaiting solder reflow.
FIG. 21 shows a completed probe chip and Z-block Assembly having solder reflow.
Figure 22:
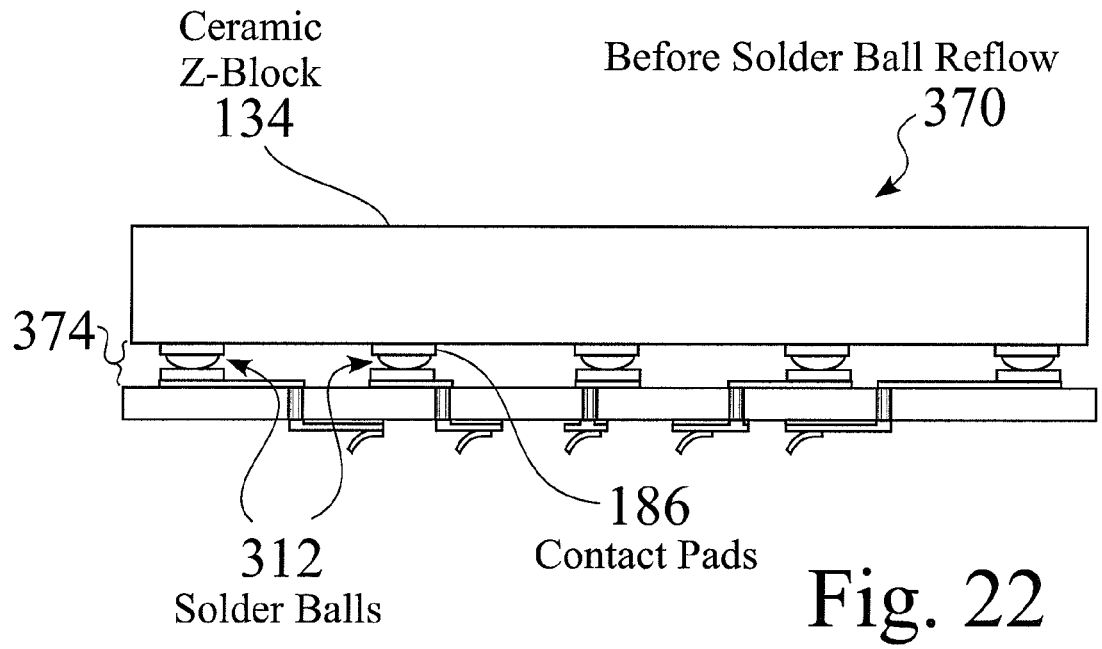
FIG. 22 is a detailed schematic view of a probe chip and Z-block assembly before solder ball reflow.
Figure 23:
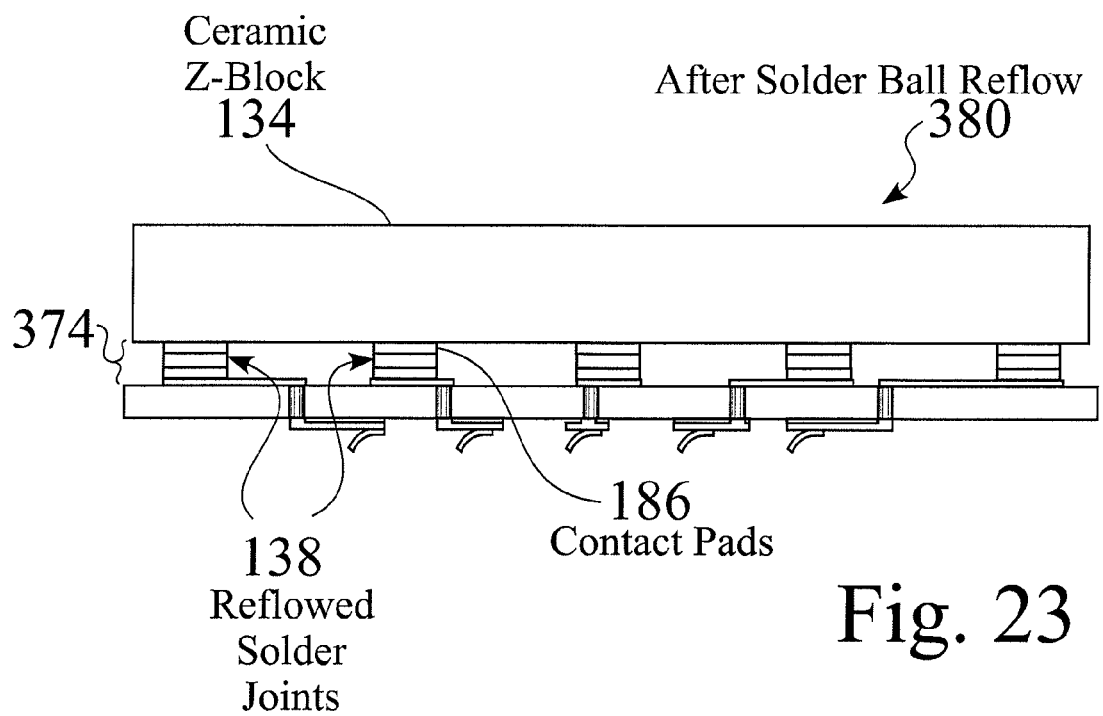
FIG. 23 is a detailed schematic view of a probe chip and Z-block assembly after solder ball reflow.

FIG. 20 shows Probe Chip to Z-block solder re-flow 330, as heat 261,263 (FIG. 19) is applied to the solder balls 312 while the probe assembly 68 and Z-block assembly 310 are retained in a parallel arrangement in the fixture 300. FIG. 21 shows a completed probe chip and Z-block Assembly 350. FIG. 22 is a detailed view 370 of a probe chip 68 and a Z-block 310 before solder ball re-flow 330. FIG. 23 is a detailed view 380 of a probe chip 68 and Z-block 310 after solder ball re-flow 330. The reflow 330 of solder balls 312 forms solder bonds 138, such that the formed assembly 350 which comprises the Z-Block 310 and the probe chip 68 provides a high degree of planarity 352 between the probe surface 93a of the probe chip 68 and the upper surface 109b (FIG. 6) of the Z-block assembly 310.

Figure 24:
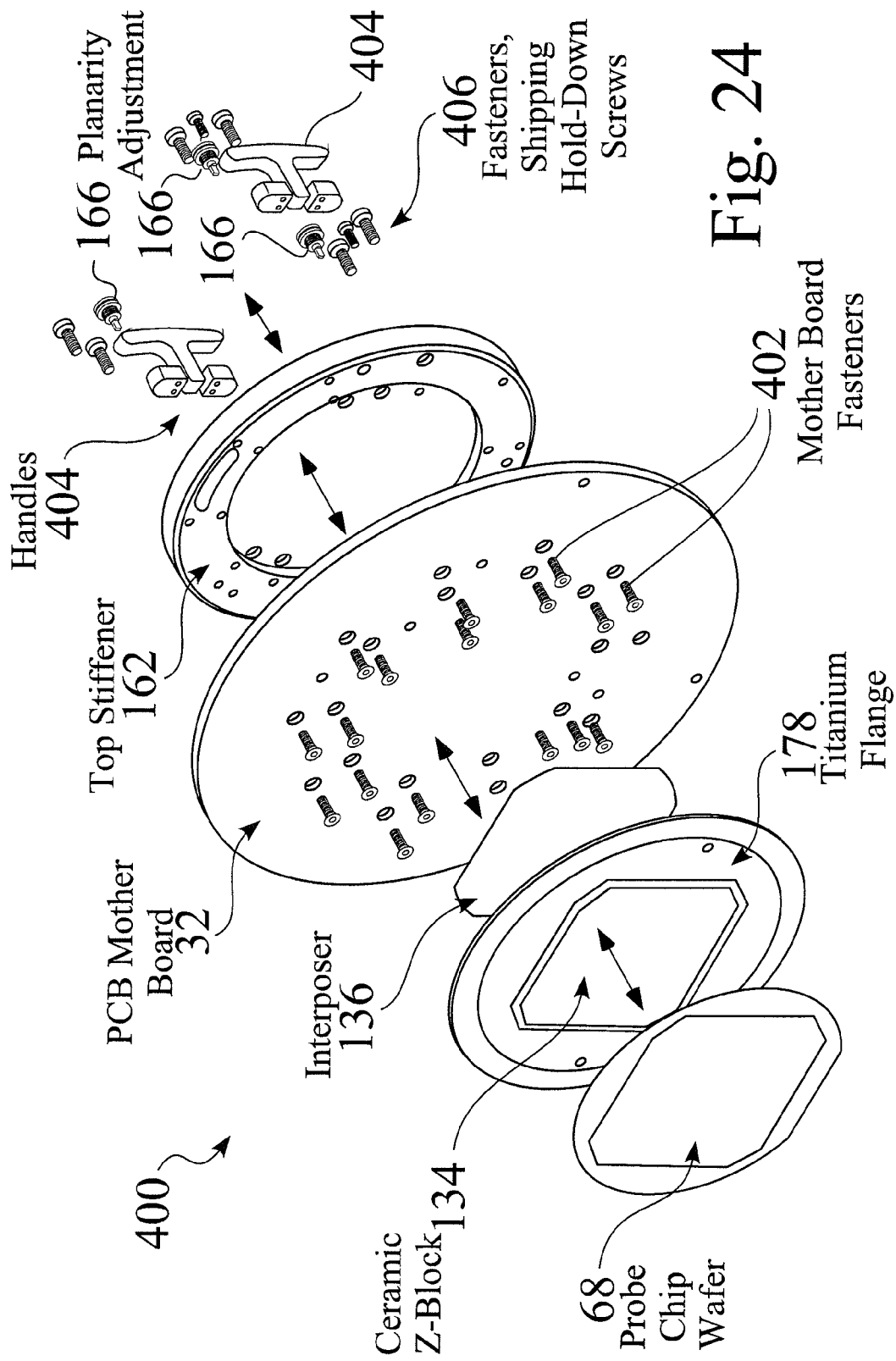
FIG. 24 is an expanded assembly view of a probe card assembly before probe chip solder attachment to a Z-block.
Figure 25:
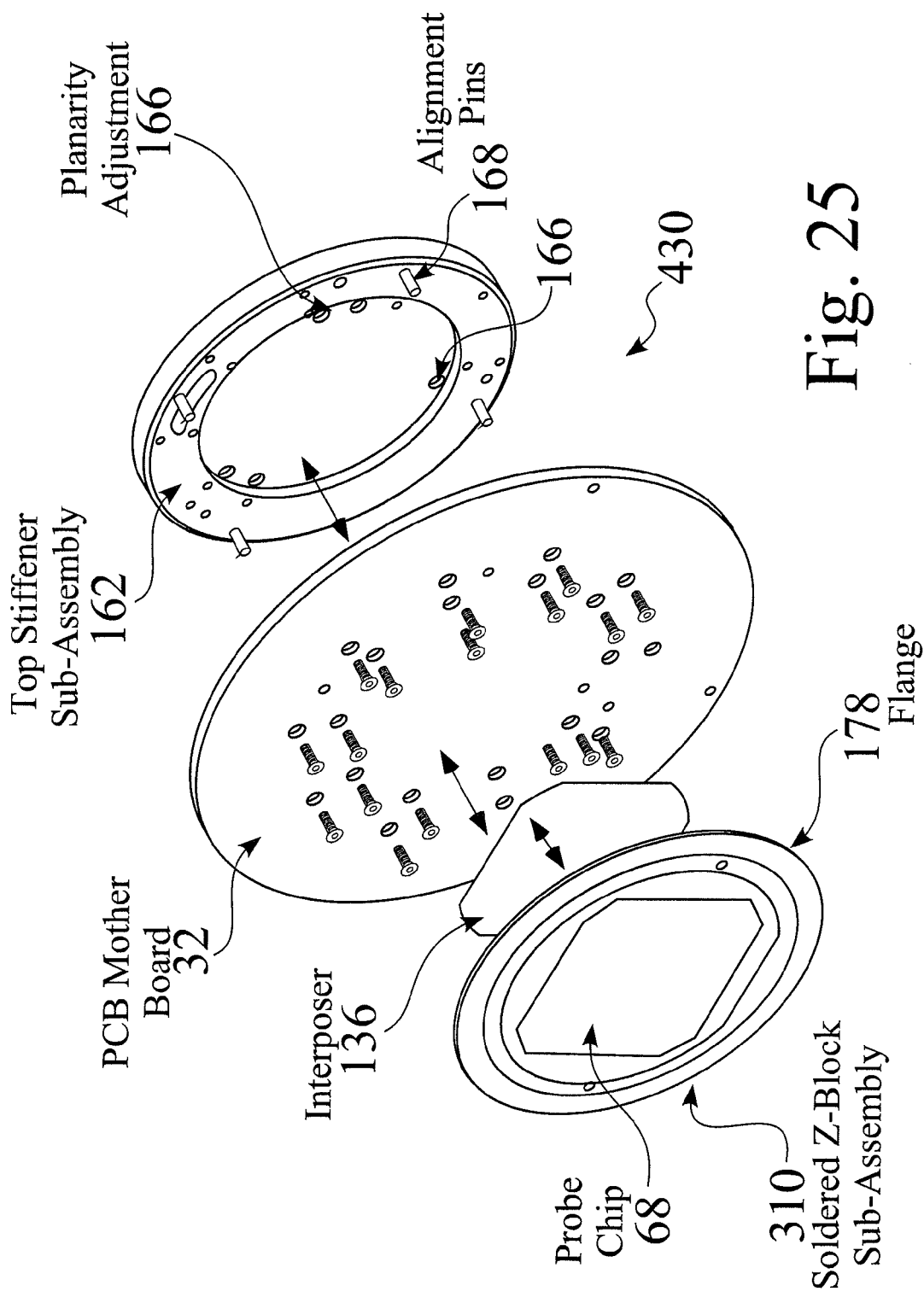
FIG. 25 is an expanded assembly view of a Probe Card assembly after probe chip solder attachment to Z-block.

FIG. 24 an expanded assembly view 400 of a quick change probe card assembly 64, before probe chip solder attachment to a Z-block assembly 310. FIG. 25 is an expanded assembly view 430 of a probe card assembly after probe chip solder attachment 138 to a Z-block assembly 310. As seen in FIG. 25, the combined probe chip assembly 146, comprising the probe chip 68, Z-block 134, and interposer 136, provides an inherently parallel structure, which is readily mountable and demountable from the motherboard 32 and top stiffener 162.

The quick-change probe card assembly 64 is comprised of the probe card interface assembly (PCIA) 62 and the probe chip 68. The quick-change probe card apparatus 64 and methodology 220 enables pre-calibrated probe chip assemblies 68 to be conveniently exchanged to/from compatible probe card interface assemblies (PCIA) 62 at the factory or in the field, such as by removing the quick-change probe card assembly 64 from a prober 12, demounting the probe chip 68 and associated components from the probe chip assembly mounting reference surface 66, remounting the same (or alternate) probe chip 68 and associated components to the probe chip assembly mounting reference surface 66, and re-installing the quick-change probe card assembly 64 in the prober 12.

The PCIA Mounting Surface 94a is defined as the peripheral region of the mother board 32 that physically mates to the probe card mounting surface 48 on the wafer prober head plate 46. The wafer prober head plate mounting surface 48 is pre-calibrated to be parallel to the plane of motion of the wafer chuck 40 in the wafer prober 12, wherein surface of the wafer chuck 40 in a commercial wafer prober 12 is defined to be the wafer reference surface (WRS) 54. The probe chip assembly mounting reference plane 92 is preferably pre-calibrated to be parallel to the PCIA mounting surface 48, and therefore inherently parallel to the WRS 54. As well, the probe chip 68 is preferably fabricated to ensure that the probe tips 181, e.g. stress metal spring (SMS) probe tips 181, lie in a common plane 280 (FIG. 17) with respect to one another within an acceptable tolerance.

There are two types of probe chip assemblies 68, parallel and non-parallel. Parallel probe chip assemblies have the plane 280 of the probe tips 181 parallel to the probe chip assembly mounting surface 48. With non-parallel probe chip assemblies 68, the mounting surface 48 is not parallel to the plane 280 of the probe tips 181. Non-parallel probe chip assemblies 68 can be changed without re-planarization of the quick-change probe card 64 by combining the factory calibration data for the PCIA 62 and factory calibration data of the probe chip 68, to re-calibrate the PCIA parallelism adjustment.

Probe Card Calibration Data

Mechanical parallelism calibration data, such as but not limited to shim thicknesses and/or differential screw settings, are preferably taken at the factory for the PCIA 62 and for non-parallel probe chip assemblies 68. The calibration data can be stored in a data base or in non-volatile memory chips mounted on the PCIA 62 or the probe chip assemblies 68. The PCIA calibration data provides the information required to establish the probe chip mounting reference plane 92 relative to the PCIA mounting surface 48. The probe chip assembly calibration data in combination with the PCIA calibration data provides the information required to set the PCIA planarity adjustments to make the stress metal spring (SMS) probe tips 181 on the probe chip 68 parallel to the plane of PCIA mounting surface 48.

Z-Block Calibration Tool

A Z-block calibration tool is used to establish the probe chip assembly mounting reference plane 92 within a PCIA 62. This tool is fabricated to function as a mechanical reference standard with a sufficiently high degree of flatness and parallelism between its surfaces, to accurately determine the parallelism adjustment parameters of the probe chip assembly mounting reference plane 92.

In-Situ Calibration Probe Chip Assembly

Some embodiments of the probe chip assemblies 68 preferably designed to be installed and used for accelerated testing and verification of PCIA using a specific wafer prober 12, or a API PrecisionPoint VX, or other tool having a similar function, in which the tool may be used to adjust the planarity of the probe chip assembly mounting reference plane 92 in the PCIA 62. The calibration probe chip assembly is designed to include test structures that aid in reliability, accuracy, and diagnostic testing of the PCIA and/or the Probe Chip technology.

FIG. 26 shows a quick-change probe card 64, wherein a single probe chip 68 is area bonded 138 to the lower surface of Z-block 134 and a single sided upper interposer 136 is area bonded 152 (FIG. 8) to the upper surface of Z-block 134. The area bonds 138,152 are typically formed from any of solder, conductive adhesive, wire bonded studs, or any combination thereof. The probe chip 68 and the upper interposer 136 are held against a flat surface, e.g. 302 (FIG. 19), such as by but not limited to vacuum channels and/or holes, during the bonding process 330. Preferable planarity adjustment mechanisms provide optimal load spreading and minimize deflection of the Z-block 134. Planarity adjustment mechanisms may preferably comprise any of three or more adjustable screws, e.g. three or more differential screws 166, shims, spacers, washers, solder bonds, e.g. solder bonds 138, and/or springs and any combination thereof.

As seen in FIG. 7 and FIG. 9, the position of the probe chip assembly mounting reference plane 92 relative to the lower surface 94a of the mother board surface 32 is preferably determined by a calculation using measurements of the distance from either surface 163a, 163b of the Z-block 134 to the wafer reference surface WRS 54 (FIG. 7), such as at three or more fiducial reference locations. However, in this case, a Z-block calibration tool is used to determine the probe chip assembly mounting reference plane 92. The Z-block Calibration tool is used for mechanical calibration only, and provides a mechanical reference standard with a sufficiently high level of parallelism between its surfaces, to ensure that the tips of the probes 180 on the probe chip 68 are adequately parallel to the PCIA mounting surface 66, to ensure parallelism to the wafer prober chuck 40 and ultimately to the semiconductor wafer under test 20.

Parallelism Error Measurement and Correction

The parallelism error for a probe chip assembly mounting reference plane (92) for a probe chip interface assembly (PCIA) 62 can be measured and corrected, such as by:

installing optionally, a production Z-block or a Z-block calibration tool and optionally a calibration probe chip assembly;

performing in-situ measurement of parallelism error (such as on a API PrecisionPoint VX or equivalent, or wafer prober (upward looking camera, probe mark inspection, contact resistance profile, etc.);

determining parallelism correction for the probe chip assembly mounting reference plane (92) associated with PCIA (62) under test;

retaining calibration data for future use; and removing the probe card; and as need disassembling, and correcting any parallelism error with appropriate mechanical offsets.

For a non-parallel probe chip 68, an exemplary parallelism error measurement and correction method comprises the steps of:

installing the non-parallel probe chip (68) in a PCIA (62) with a previously calibrated probe chip assembly mounting reference plane (92);

performing in-situ measurement of parallelism error (On API, in-house tool, or wafer prober (upward looking camera, probe mark inspection, contact resistance profile, etc.));

determining parallelism correction for the non-parallel probe chip under test;

retaining the data for future use;

removing the probe card; and disassembling and correcting any parallelism errors with appropriate mechanical offsets.

FIG. 27 is a schematic diagram of a quick-change probe card assembly 64 comprising a solder bonded mother board PCB Z-block 134 and an interposer 136 located between the mother board PCB Z-block 132 and the primary Z-block 134. The area bonds 142 on mother board PCB Z-block 132 may be formed from solder, conductive adhesive, wire bonded studs, or any combination thereof. Preferable planarity adjustment mechanisms provide optimal load spreading and minimize deflection of the Z-block 134. Planarity adjustment mechanisms may preferably comprise any of three or more adjustable screws, e.g. three or more differential screws 166, shims, spacers, washers, solder bonds, e.g. solder bonds 138, and/or springs 166, and any combination thereof.

Figure 28:
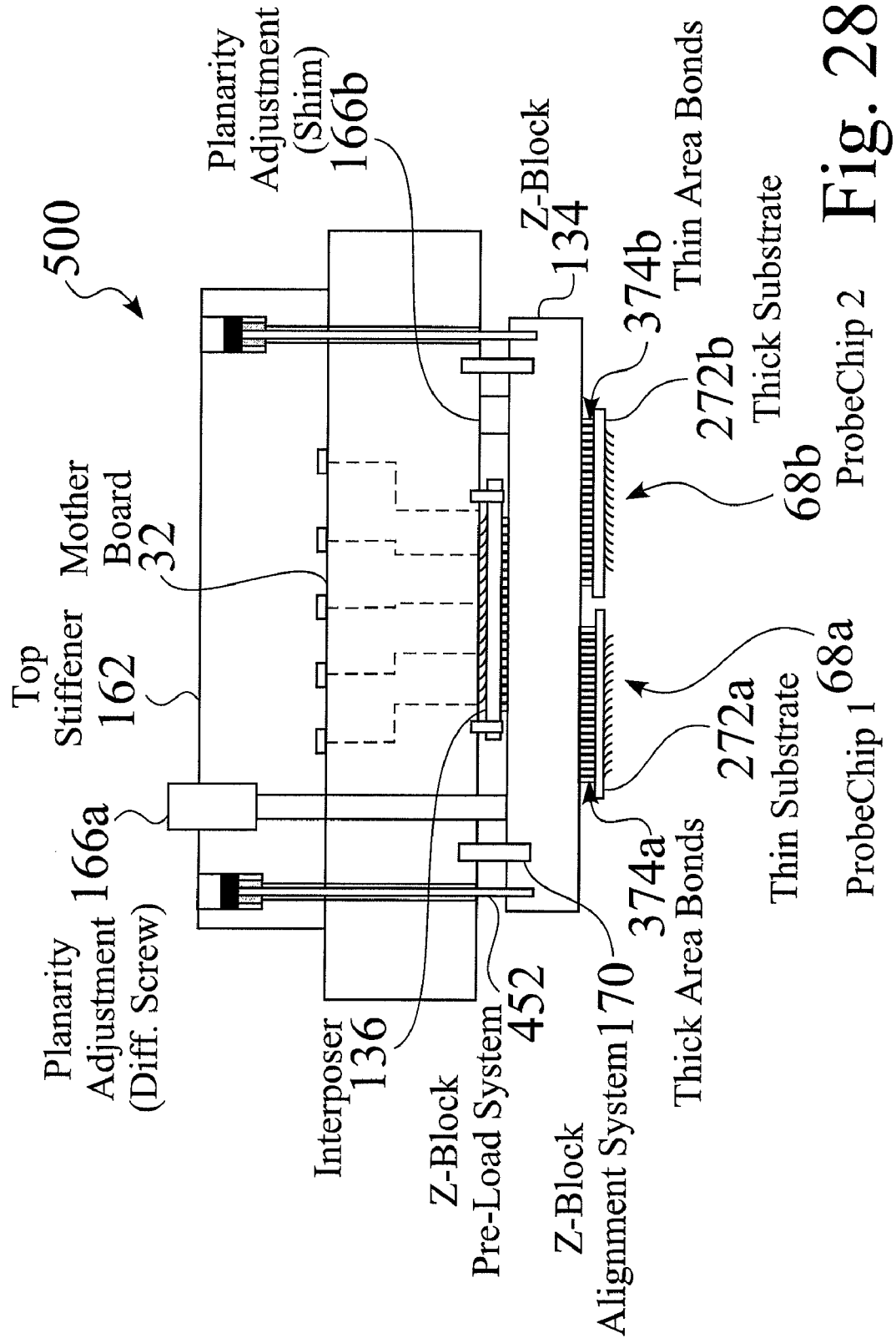
FIG. 28 is a schematic diagram of an alternative embodiment of a quick-change probe card assembly, comprising mosaic probe chip assembly area bonds between each of a plurality of Probe Chips and a Z-block.

FIG. 28 is a schematic diagram of a quick change probe card assembly 64 having tiled probe chips 68a,68b, with substrates 272a,272b of different thickness, and a Z-block 134. The solder bonds 374a,374b compensate for difference in thickness between the probe chip substrates 272a,272b, when the probe chips 68a,68b are simultaneously held against a flat reference chuck 302, e.g. vacuum or electrostatic chuck 302, during the soldering process 300 (FIG. 19). The interposer 136 and Z-block 134 are each aligned the mother board 32, and are therefore aligned with respect to each other.

The location of features, such as contact pads on top of the Z-block 134, are optically determined, and the position of alignment pins 170, such as directly connected to the z-block 134, or to flange 178 (FIG. 24) is determined, whereby that the Z-block 134 is properly aligned in X and Y plane, to corresponding contacts on the interposer 136.

Preferable planarity adjustment mechanisms provide optimal load spreading and minimize deflection of the Z-block 134. Planarity adjustment mechanisms may preferably comprise any of three or more adjustable screws, e.g. three or more differential screws 166, shims, spacers, washers, solder bonds, e.g. solder bonds 138, and/or springs and any combination thereof.

Figure 29:
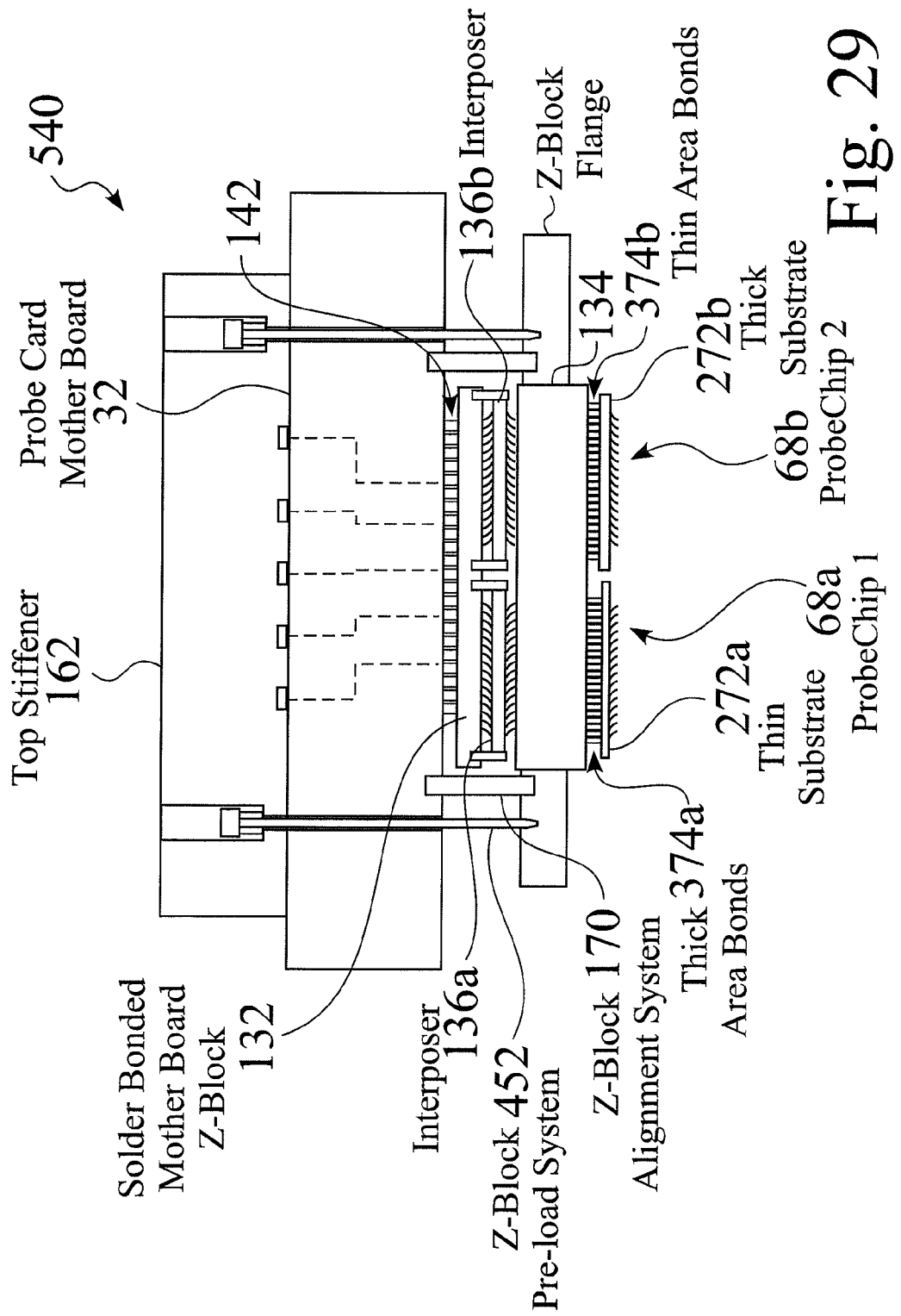
FIG. 29 is a schematic view of a probe card assembly having tiled probe chips and tiled interposers.

FIG. 29 is a schematic diagram of a quick change probe card assembly 64 having tiled probe chips 68a,68b with substrates 272a,272b of different thickness, as well as tiled interposers 136a,136b. Interposers 136a,136b are X-Y aligned to mother board Z-block 132 which is area bonded 142 to mother board 32. As well, the interposers 136a,136b and the primary Z-block 134 are each X-Y aligned to the mother board 32, and are therefore inherently X-Y aligned with respect to each other. Preferable planarity adjustment mechanisms provide optimal load spreading and minimize deflection of the Z-block 134. Planarity adjustment mechanisms may preferably comprise any of three or more adjustable screws, e.g. three or more differential screws 166, shims, spacers, washers, solder bonds, e.g. solder bonds 138, and/or springs, and any combination thereof.

Figure 30:
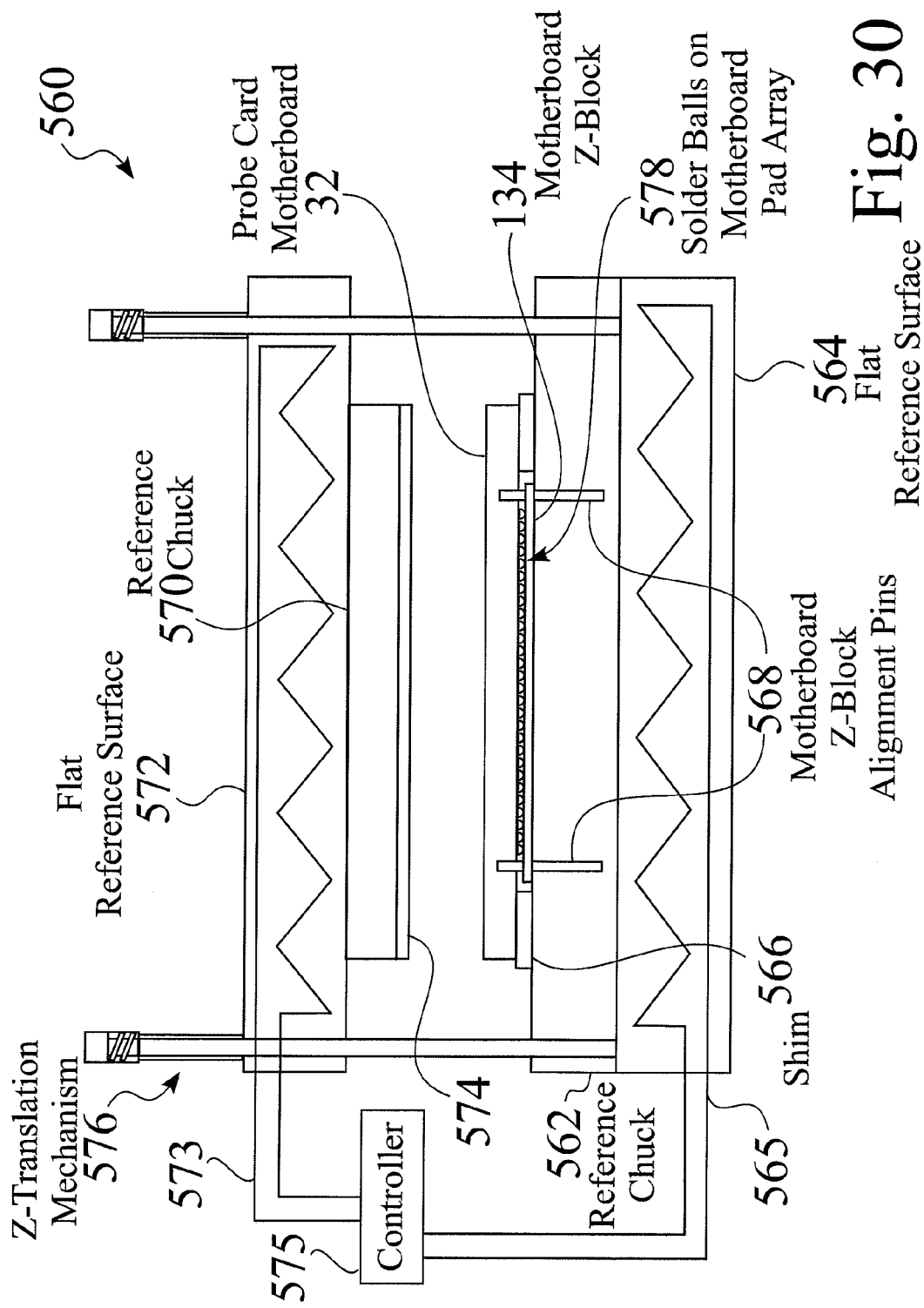
FIG. 30 is a schematic view of a probe card motherboard to motherboard Z-block soldering fixture.

FIG. 30 is a schematic diagram of a probe card motherboard to motherboard Z-block soldering fixture 560. The front surface of the motherboard Z-block 132 is held flat against the lower reference chuck 562, e.g. such as a vacuum or electrostatic chuck 562, with one or more shims 566 at the circumference of the probe card motherboard 32. X-Y alignment is accomplished using two alignment pins 568, which engage in mechanical registration features 569, such as holes 569, in the motherboard Z-block 132. An upper reference chuck 570, such as a vacuum or electrostatic chuck 570, attaches to the upper surface 94b of the probe card motherboard 32, to insure thermal contact. X-Y alignment of the Probe Card motherboard 32 is accomplished by pins that extend from the lower reference chuck 562 into the probe card motherboard 32.

Figure 31:
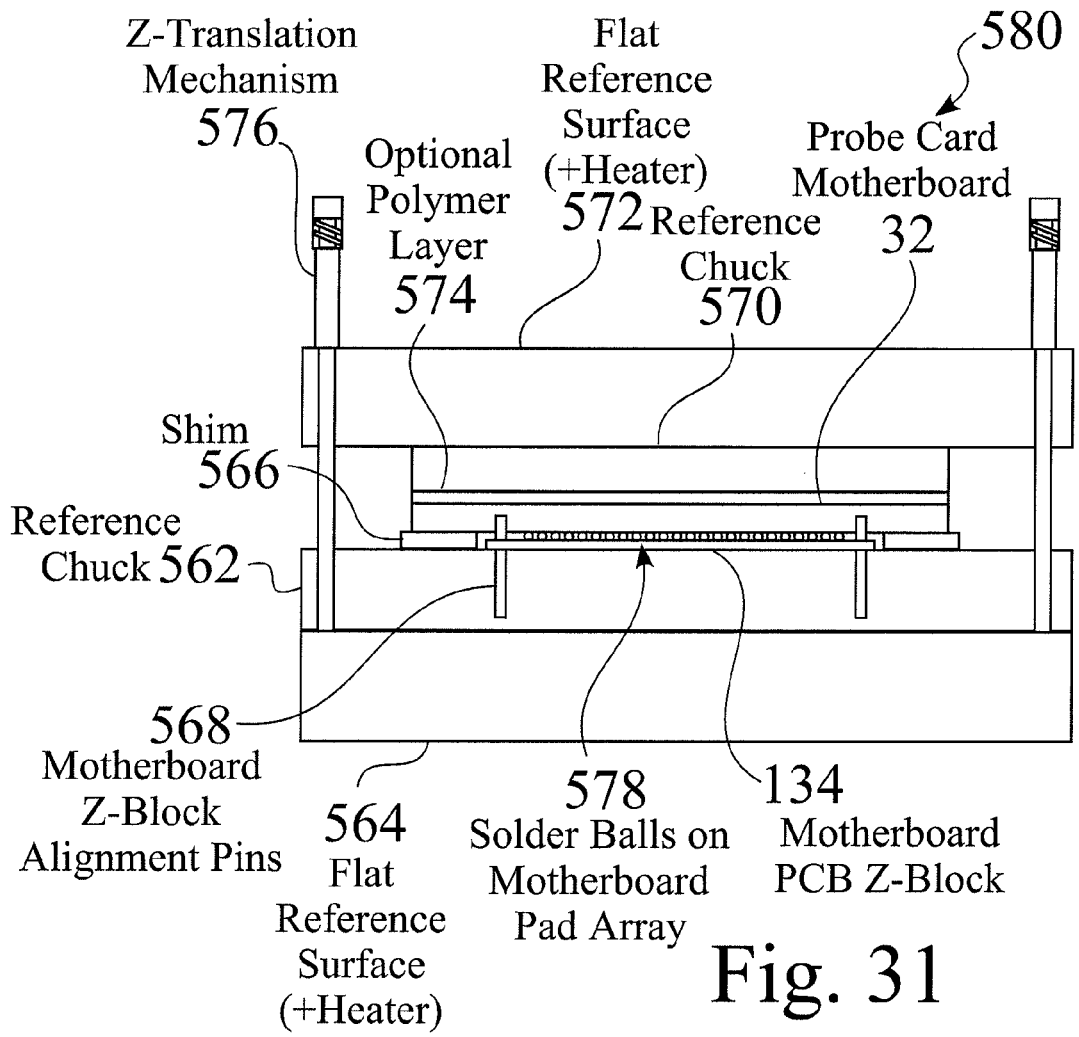
FIG. 31 is a schematic diagram showing a solder reflow process between a probe card motherboard and a motherboard (MB) Z-block in a solder reflow assembly.
Figure 32:
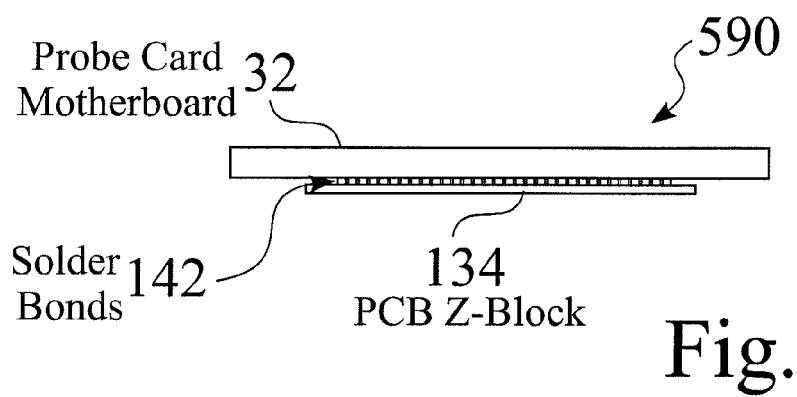
FIG. 32 is a schematic diagram showing a completed assembly comprising a probe card motherboard and an MB Z-block having solder reflow.

FIG. 31 is a schematic diagram showing solder reflow process 580 in an assembly comprising a Probe Card Motherboard and a motherboard Z-block 132. FIG. 32 is a schematic diagram 590 which shows a completed assembly 131 comprising a probe card motherboard 32 and a motherboard Z-block 132 having solder reflow 580.

The use of low force interposers in the quick-change probe card assemblies 64 and associated methods 220 provide a plurality of reliable electrical connections between two flat and parallel surfaces each having an electrically conducive region, e.g. pads, in electrical contact with at least one of the low force SMS probe tips on an interposer 136. Low force interposers 136 reduce the total force required to compress the SMS spring probes 180 and hence the mechanical deflections of the load bearing components of the system. Alternatively, low force interposers 136 enable the use of thinner structures and/or lower elastic modulus materials to support or to compress the interposers under operating conditions.

Quick-change probe card assemblies 64 and associated methods 220 provide high quality electrical contacts, using low force interposers 136, such as having force per contact of between 0.05 grams to 5 grams, and is enhanced by the use of redundant SMS spring probes 180, i.e. more than one SMS spring probe 180 per electrical contact, e.g. 4 SMS spring probes 180 per contact has been demonstrated), non-oxidizing probe tips 181, e.g. clean Rhodium coated probe tips 181, and non-oxidizing contact pads, e.g. clean gold contact pads on both sides of the interposer 136.

In an alternative embodiment, the spring probes 180 and contact pads 278 are cleaned using methods that remove surface contaminants and expose a contaminant-free metal surface. For example, surface treatments such as mechanical polishing, plasma cleaning, and ion milling can be used to expose a contaminant-free surface on the spring probes 180 and electrical contact pads 278.

Quick-change probe card assemblies 64 and associated methods 220 allow the production of customizable probe card assemblies 64 having a rapid fabrication cycle time for testing semiconductor wafers 20. Rapid fabrication cycle time is accomplished by using semi-custom components with rapid fabrication cycle times, in combination with standard components that may have lengthy lead times. Since the standardized components are ordered in advance and held in inventory, until the time that they are needed for assembly into the finished product, the fabrication cycle time is then dependent only upon the fabrication cycle time for the semi-customizable component.

For example, the Z-block 134 is a standardized component, which can be ordered in advance and kept in inventory. The probe chip 68 is a semi-custom component, having a fixed manufacturing cycle time which is initiated at the time the customer's order is placed for the probe card system 64. The overall probe card fabrication cycle time is then determined primarily by the fabrication cycle time of the probe chip 68.

System Advantages

The quick change probe chip system 64 and method 220 lowers cost of ownership by allowing users to easily change probe chip assemblies 68, without the need to send an entire probe card assembly 68 back to the manufacturer. The quick change probe chip system 64 and method 220 allows a trained user or field service engineer to quickly change the probe chip 68 at the user site.

As well, customers can keep an inventory of spare probe chip assemblies 68 on hand, and swap probe chip assemblies 68, instead of the entire probe card assembly, e.g. 64. This capability minimizes downtime related to probe chip issues, such as for regular scheduled cleaning, tip wear, tip failure, and/or unexpected tip contamination.

The present invention provides methods of fabrication that reduce or eliminate the need for planarity adjustments at final assembly. However, after the installation of a new probe chip assembly, probe card function can readily be validated on an API Precision Point VX or equivalent. Planarity measurement can be performed if needed, such as by field personnel or by the customer, to verify proper alignment and function of the probe card prior to use in production.

The quick change probe chip system 64 and method 220 maintains low resistance electrical connections to a device under test at either elevated or depressed operating temperatures.

As well, the quick change probe chip system 64 and method 220 comprises components with mechanical surfaces that are sufficiently flat and parallel to one another, that enable them to act as reference surfaces for other components either within the probe card assembly system, or that interface to the probe card assembly system.

Furthermore, the quick change probe chip system 64 and method 220, having relatively flat and parallel component surfaces, more evenly distributes and vertically transmits the high forces associated with high I/O count ICs and testers, to reduce peak-to peak mechanical deflections within the probe card assembly system, wherein the forces are generated either by the various spring pre-loading mechanisms or by the compression of the spring probes during wafer testing.

In addition, the quick change probe chip system 64 and method 220 has components with improved flatness and parallelism that can rest against each other, that enable pre-aligned, easy to replace components and sub-assemblies. Relatively flat and parallel surfaces and probe tip arrays having smaller deviations from co-planarity reduce the need for planarity adjustment. Additionally, the use of relatively flat and parallel reference surfaces enables the use of very low force interposers, e.g. 0.05 g to 5 g per contact, to make low resistance high-density electrical connections over large areas, e.g. 1,000 sq cm for 300 mm wafers. Furthermore, low force interposers combined with flat and parallel reference and support surfaces enable simpler methods of clamping and achieving and maintaining planarity. Alternatively, large area components such as mother boards, Z-blocks, etc. with flat surfaces enable the use of vacuum actuated systems to achieve high levels of surface parallelism. Additionally, large area solid electrical interface connections fabricated with materials such as solder, gold wire bond bumps, plated bumps, or adhesives all have higher manufacturing yields and perform better and more reliably with flatter and more parallel interconnection support surfaces.

As well, time is often critical factor for users of probe card assemblies, such as semiconductor manufacturers and testers. Conventional probe card assemblies typically comprise one or more key components that have long lead times, such as for multilayered ceramic components. As conventional assembly structures and manufacturing methods include such long lead time components, the resulting fabrication cycle for one or more assemblies is long.

In contrast, the quick change probe chip system 64 and method 220 has improved, i.e. rapid, fabrication cycles, for which portions of the probe card assembly can be fabricated, assembled, and/or pre-planarized, while long-lead lead time components, such as complex, custom, or semi-custom components, are readily mountable and/or remountable from the other components and assemblies.

The methods according to the present invention adjust for the planarity differences during the probe card fabrication, by reducing or eliminating requirements for applying pressure to flexible connectors and/or adjusting linear actuators. The methods according the present teachings include creating co-planar arrays of probe springs using two or more plating steps and planarizing a probe chip assembly by causing variations in solder joint height to compensate for planar differences between the sub-components. Both manufacturing methods create flat reference tooling surfaces and use vacuum or other means to hold components under assembly flat against the reference tooling surfaces. In the case of probe springs, the first layer of plating is applied and the tips are made co-planar by heating while holding the tips against a reference tooling surface prior to completing the additional plating which is required to provide adequate probing force to insure a reliable electrical contact over an acceptable cycle life. In the case of the mother board to probe spring assembly, these components can be pulled flat to a reference tooling surface parallel to the WRS and solder can be reflowed to retain the parallelism.

The invention also uses standard components for both reducing manufacturing cost and manufacturing time.

Although probe card assembly systems having spring probes with improved co-planarity and parallelism, and methods for manufacturing are described herein in connection with integrated circuit test probes, probe cards, and/or packages, the system and techniques can be implemented with a wide variety of devices, such as interconnections between integrated circuits and substrates within electronic components or devices, burn-in devices and MEMS devices, or any combination thereof, as desired.

As well, those knowledgeable and skilled in the art will readily appreciate that various alternative types of probe tips could be substituted for the stress metal spring (SMS) probe tips described herein and that therefore the teachings relating to the methods and apparatus of the present invention should not be interpreted as being limited to the use of the SMS probe tips described herein.

Accordingly, although the invention has been described in detail with reference to a particular preferred embodiment, persons possessing ordinary skill in the art to which this invention pertains will appreciate that various modifications and enhancements may be made without departing from the spirit and scope of the claims that follow.

The invention claimed is:

1. An apparatus, comprising:
   a probe card interface assembly, comprising
      a motherboard substrate having a lower surface, an upper surface opposite the lower surface, and a plurality of electrical conductors extending from the upper surface to the lower surface, wherein the electrical conductors form a pattern of electrical connections on the lower surface of the motherboard substrate, and
      a probe chip mounting system affixed to the motherboard comprising
         at least one substrate and having a motherboard interface surface and a probe chip assembly mounting surface opposite the motherboard interface surface, and
         a plurality of electrical conductors corresponding to the pattern of electrical connections on the bottom surface of said motherboard substrate, the electrical conductors extending from the motherboard interface surface to the probe chip assembly mounting surface; and
   a probe chip assembly mounted to the probe card interface assembly, the probe chip assembly comprising a probe chip substrate having a probing surface and a mounting surface opposite the probing surface, and a plurality of probe springs extending from said probing surface for providing electrical connections to at least one integrated circuit device on a semiconductor wafer, said probe springs having electrical connections to a plurality of standard connections on the mounting surface, said standard connections corresponding to said pattern of electrical connections on said bottom surface of said motherboard substrate;
   wherein a probe chip assembly mounting reference plane is defined by at least three points between the lower surface of the motherboard substrate and the semiconductor wafer, wherein the probe chip assembly mounting reference plane is adjustable to be coplanar to the probe chip assembly mounting surface of the probe card interface assembly based on measured data of the probe card interface assembly.

2. The apparatus of claim 1, wherein the motherboard substrate comprises a multi-layered printed wiring board.

3. The apparatus of claim 1, wherein the at least one substrate comprises any of a ceramic, a multilayered ceramic, and a co-fired ceramic.

4. The apparatus of claim 1, wherein the probe springs are plated.

5. A method of production of a rapid cycle time customizable probe card for testing semiconductor wafers, comprising the steps of:
   providing a plurality of customizable components, each having a rapid design and fabrication process cycle time;
   providing a plurality of standard components, wherein design and fabrication process cycle time of at least one of said standard components is longer than the rapid design and fabrication process cycle time for the customizable components; and
   assembling and testing a probe card from both the customizable components and the standard components, wherein the probe card assembly and test cycle time is no greater than that of the longest of the cycle times for the customizable components.

6. The method of claim 5,
wherein the customizable components having rapid cycle times comprise any of a mother board and a probe chip assembly; and
wherein the standard components having cycle times that may be longer than those of the mother board and probe chip comprise any of a probe tip support substrate and at least one interposer.

7. The apparatus of claim 1, further comprising:
a planarity adjustment mechanism for adjusting planarity between the probe chip mounting system and the lower surface of the motherboard substrate.

8. The apparatus of claim 1, wherein the probe chip assembly mounting reference plane comprises any of points that coincide with a real surface within the probe chip mounting system, or points that comprises a virtual defined plane that is parallel to the lower surface of the motherboard substrate.

* * * * *